(12) United States Patent
Kurosaka et al.

(10) Patent No.: US 11,031,751 B2
(45) Date of Patent: *Jun. 8, 2021

(54) LIGHT-EMITTING DEVICE

(71) Applicant: HAMAMATSU PHOTONICS K.K., Hamamatsu (JP)

(72) Inventors: Yoshitaka Kurosaka, Hamamatsu (JP); Kazuyoshi Hirose, Hamamatsu (JP); Takahiro Sugiyama, Hamamatsu (JP); Yuu Takiguchi, Hamamatsu (JP); Yoshiro Nomoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/434,789

(22) Filed: Jun. 7, 2019

(65) Prior Publication Data

US 2019/0312412 A1 Oct. 10, 2019

Related U.S. Application Data

(63) Continuation-in-part of application No. 16/323,625, filed as application No. PCT/JP2017/029152 on Aug. 10, 2017.

(30) Foreign Application Priority Data

Aug. 10, 2016 (JP) .............................. JP2016-157792
Jun. 8, 2018 (JP) .............................. JP2018-110112

(51) Int. Cl.
*H01S 5/183* (2006.01)
*H01S 5/026* (2006.01)
(Continued)

(52) U.S. Cl.
CPC .......... *H01S 5/18302* (2013.01); *H01S 5/026* (2013.01); *H01S 5/028* (2013.01);
(Continued)

(58) Field of Classification Search
CPC ...... H01S 5/183; H01S 5/423; H01S 5/34333; H01S 5/34313; H01S 5/34306;
(Continued)

(56) References Cited

U.S. PATENT DOCUMENTS

2003/0010763 A1 1/2003 Fukuchi et al.
2004/0252741 A1 12/2004 Meyer et al.
(Continued)

FOREIGN PATENT DOCUMENTS

CN 1908764 A 2/2007
CN 101685941 A 3/2010
(Continued)

OTHER PUBLICATIONS

International Preliminary Report on Patentability (IPRP) dated Oct. 10, 2019 that issued in WO Patent Application No. PCT/JP2018/012188.

(Continued)

*Primary Examiner* — Xinning(Tom) Niu
(74) *Attorney, Agent, or Firm* — Faegre Drinker Biddle & Reath LLP

(57) ABSTRACT

The present embodiment relates to a light emitting device having a structure capable of removing zero order light from output light of an S-iPM laser. The light emitting device includes a semiconductor light emitting element and a light shielding member. The semiconductor light emitting element includes an active layer, a pair of cladding layers, and a phase modulation layer. The phase modulation layer has a basic layer and a plurality of modified refractive index regions, each of which is individually disposed at a specific (Continued)

position. The light shielding member has a function of passing through a specific optical image output along an inclined direction and shielding zero order light output along a normal direction of a light emitting surface.

8 Claims, 38 Drawing Sheets

(51) Int. Cl.
  *H01S 5/028* (2006.01)
  *H01S 5/042* (2006.01)
  *H01S 5/343* (2006.01)
  *H01S 5/42* (2006.01)
  *H01S 5/06* (2006.01)

(52) U.S. Cl.
  CPC .......... *H01S 5/0425* (2013.01); *H01S 5/0601* (2013.01); *H01S 5/18305* (2013.01); *H01S 5/34313* (2013.01); *H01S 5/34333* (2013.01); *H01S 5/423* (2013.01); *H01S 2304/04* (2013.01)

(58) Field of Classification Search
  CPC .. H01S 5/18305; H01S 5/0601; H01S 5/0425; H01S 5/028; H01S 2304/04; H01S 5/18302; H01S 5/026; H01S 5/42; H01S 2301/18; H01S 2301/02; H01S 5/0287; H01S 5/04256; H01S 5/2027; H01S 5/34326; H01S 5/04254; H01S 5/18; H01S 5/105
  See application file for complete search history.

(56) References Cited

U.S. PATENT DOCUMENTS

| | | | |
|---|---|---|---|
| 2007/0008998 A1 | 1/2007 | Ohta et al. | |
| 2007/0019099 A1* | 1/2007 | Lieberman | G02B 13/16 348/335 |
| 2007/0030873 A1 | 2/2007 | Deng | |
| 2008/0175286 A1* | 7/2008 | Kamijima | H01S 5/4062 372/30 |
| 2008/0240179 A1* | 10/2008 | Otsuka | H01S 5/18 372/26 |
| 2008/0259981 A1 | 10/2008 | Wang et al. | |
| 2009/0289266 A1* | 11/2009 | Lee | H01L 27/15 257/84 |
| 2010/0220763 A1 | 9/2010 | Ikuta | |
| 2013/0163626 A1 | 6/2013 | Seurin et al. | |
| 2013/0343415 A1 | 12/2013 | Hori et al. | |
| 2014/0211822 A1 | 7/2014 | Fattal et al. | |
| 2014/0299742 A1 | 10/2014 | Fujii | |
| 2014/0348195 A1 | 11/2014 | Sakaguchi et al. | |
| 2015/0185523 A1 | 7/2015 | Matsumoto et al. | |
| 2016/0020580 A1 | 1/2016 | Takiguchi et al. | |
| 2016/0036201 A1 | 2/2016 | Takiguchi et al. | |
| 2016/0072258 A1 | 3/2016 | Seurin et al. | |
| 2016/0075258 A1 | 3/2016 | Kim | |
| 2016/0248224 A1 | 8/2016 | Noda et al. | |
| 2016/0257036 A1 | 9/2016 | Fang et al. | |
| 2016/0327906 A1 | 11/2016 | Futterer | |
| 2018/0006426 A1 | 1/2018 | Takiguchi et al. | |
| 2018/0109075 A1 | 4/2018 | Kurosaka et al. | |
| 2019/0165546 A1 | 5/2019 | Hogg et al. | |
| 2019/0181613 A1 | 6/2019 | Kurosaka et al. | |

FOREIGN PATENT DOCUMENTS

| | | |
|---|---|---|
| CN | 102447028 A | 5/2012 |
| CN | 102638003 A | 8/2012 |
| CN | 103038959 A | 4/2013 |
| CN | 104471465 A | 3/2015 |
| CN | 104852278 A | 8/2015 |
| CN | 105191029 A | 12/2015 |
| JP | S49-024190 U | 3/1974 |
| JP | S59-177282 A | 10/1984 |
| JP | H7-297110 A | 11/1995 |
| JP | H9-139540 A | 5/1997 |
| JP | H9-282437 A | 10/1997 |
| JP | H9-311614 A | 12/1997 |
| JP | 2006-026726 A | 2/2006 |
| JP | 2007-019277 A | 1/2007 |
| JP | 2008-256823 A | 10/2008 |
| JP | 2009-111360 A | 5/2009 |
| JP | 2009-212359 A | 9/2009 |
| JP | 2009-540593 A | 11/2009 |
| JP | 2010-283335 A | 12/2010 |
| JP | 2012-195341 A | 10/2012 |
| JP | 2013-161965 A | 8/2013 |
| JP | 2014-026083 A | 2/2014 |
| JP | 2014-027264 A | 2/2014 |
| JP | 2014-197665 A | 10/2014 |
| JP | 2014-202867 A | 10/2014 |
| JP | 2014-236127 A | 12/2014 |
| JP | 2016/122711 A | 7/2016 |
| JP | 2016-129208 A | 7/2016 |
| JP | 2018-026463 A | 2/2018 |
| WO | WO-01/53876 A1 | 7/2001 |
| WO | WO 2008/041138 A2 | 4/2008 |
| WO | WO 2012/035620 A1 | 3/2012 |
| WO | WO-2014/017289 A1 | 1/2014 |
| WO | WO-2014/136607 A1 | 9/2014 |
| WO | WO-2014/136955 A1 | 9/2014 |
| WO | WO-2014/136962 A1 | 9/2014 |
| WO | WO 2014/175447 A1 | 10/2014 |
| WO | WO 2015/008627 A1 | 1/2015 |
| WO | WO 2016/111332 A1 | 7/2016 |
| WO | WO-2016/148075 A1 | 9/2016 |
| WO | WO 2017-191320 A1 | 11/2017 |

OTHER PUBLICATIONS

International Preliminary Report on Patentability (IPRP) dated Oct. 10, 2019 that issued in WO Patent Application No. PCT/JP2018/012191.
Kurosaka, Yoshitaka et al., "Effects of non-lasing band in two-dimensional photonic-crystal lasers clarified using omnidirectional band structure," Optics Express vol. 20, No. 19, 2012, pp. 21773-21783.
International Preliminary Report on Patentability dated Mar. 21, 2019 for PCT/JP2017/031466.
International Preliminary Report on Patentability dated Feb. 21, 2019 for PCT/JP2017/029152.
Kurosaka et al., "Phase-modulating lasers toward on-chip integration", Scientific Reports, vol. 6. Jul. 26, 2016, p. 30138.
Sakai et al., "Coupled-Wave Theory for Square-Lattice Photonic Crystal Lasers With TE Polarization", IEEE Journal of Quantum Electronics, vol. 46, No. 5, May 2010, p. 788-p. 795.
Peng et al., "Coupled-wave analysis for photonic-crystal surface-emitting lasers on air holes with arbitrary sidewalls", Optics Express, vol. 19, No. 24, Nov. 2011; p. 24672-p. 24686.
Lee, "Sampled Fourier Transform Hologram Generated by Computer", Applied Optics, Mar. 1970, vol. 9, No. 3, p. 639-p. 644.
International Preliminary Report on Patentability (IPRP) dated Dec. 26, 2019 that issued in WO Patent Application No. PCT/JP2018/022609.
International Preliminary Report on Patentability dated Jun. 18, 2020 in PCT/JP2018/043843.
English-language translation of International Preliminary Report on Patentability (IPRP) dated Dec. 17, 2020 that issued in WO Patent Application No. PCT/JP2019/022363.
JP Office Action dated Mar. 23, 2021 from counterpart Japanese patent application No. 2017-117736 (with attached English-language translation).

* cited by examiner

*Fig.8A*

| A2 | A1 |
|----|----|
| A3 | A4 |

ORIGINAL IMAGE

*Fig.8B*

| A4<br><br>A2 ROTATION | A3<br><br>A1 ROTATION |
|----|----|
| A1<br><br>A3 ROTATION | A2<br><br>A4 ROTATION |

BEAM PATTERN OBTAINED

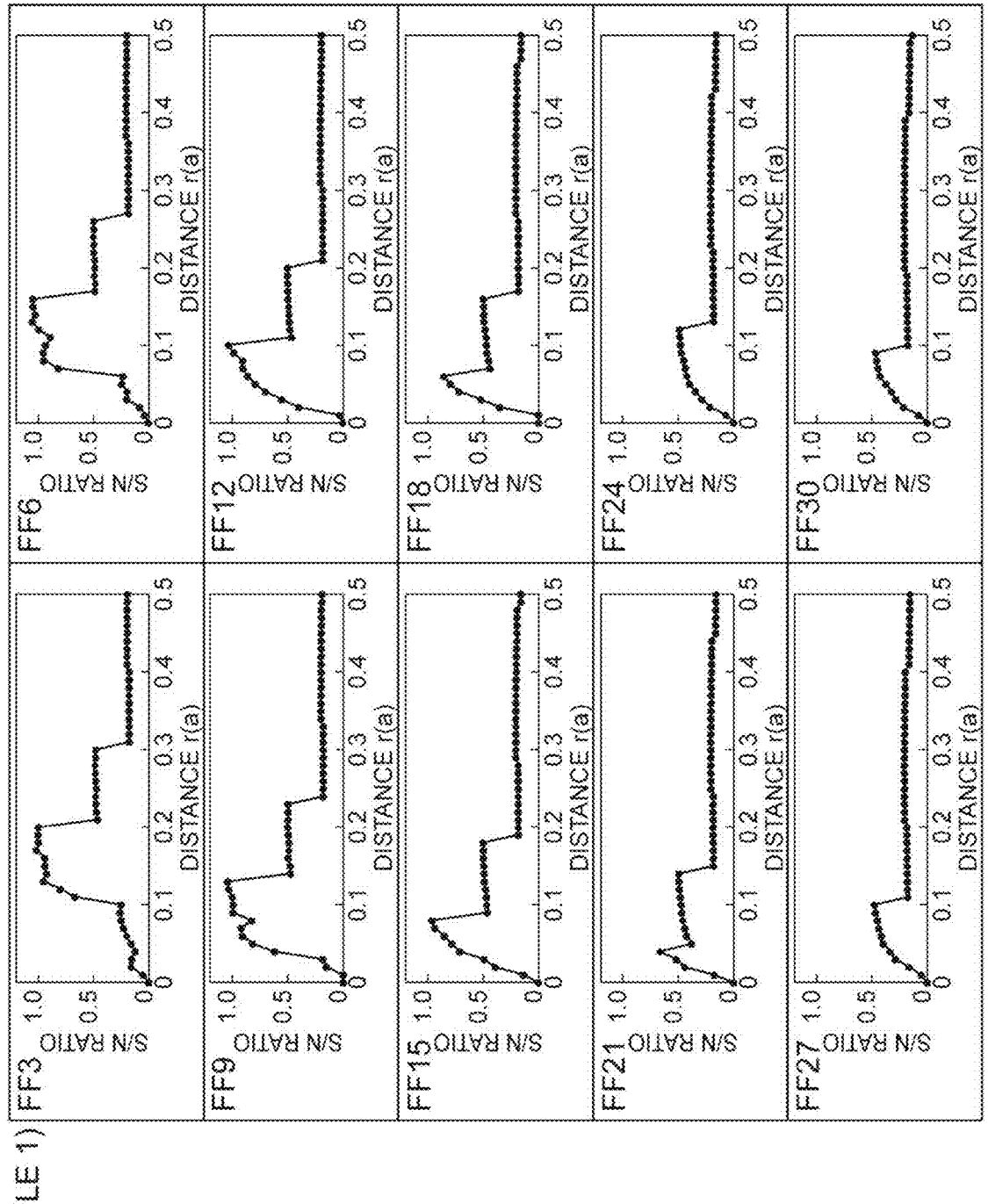
Fig.12 (SAMPLE 1)

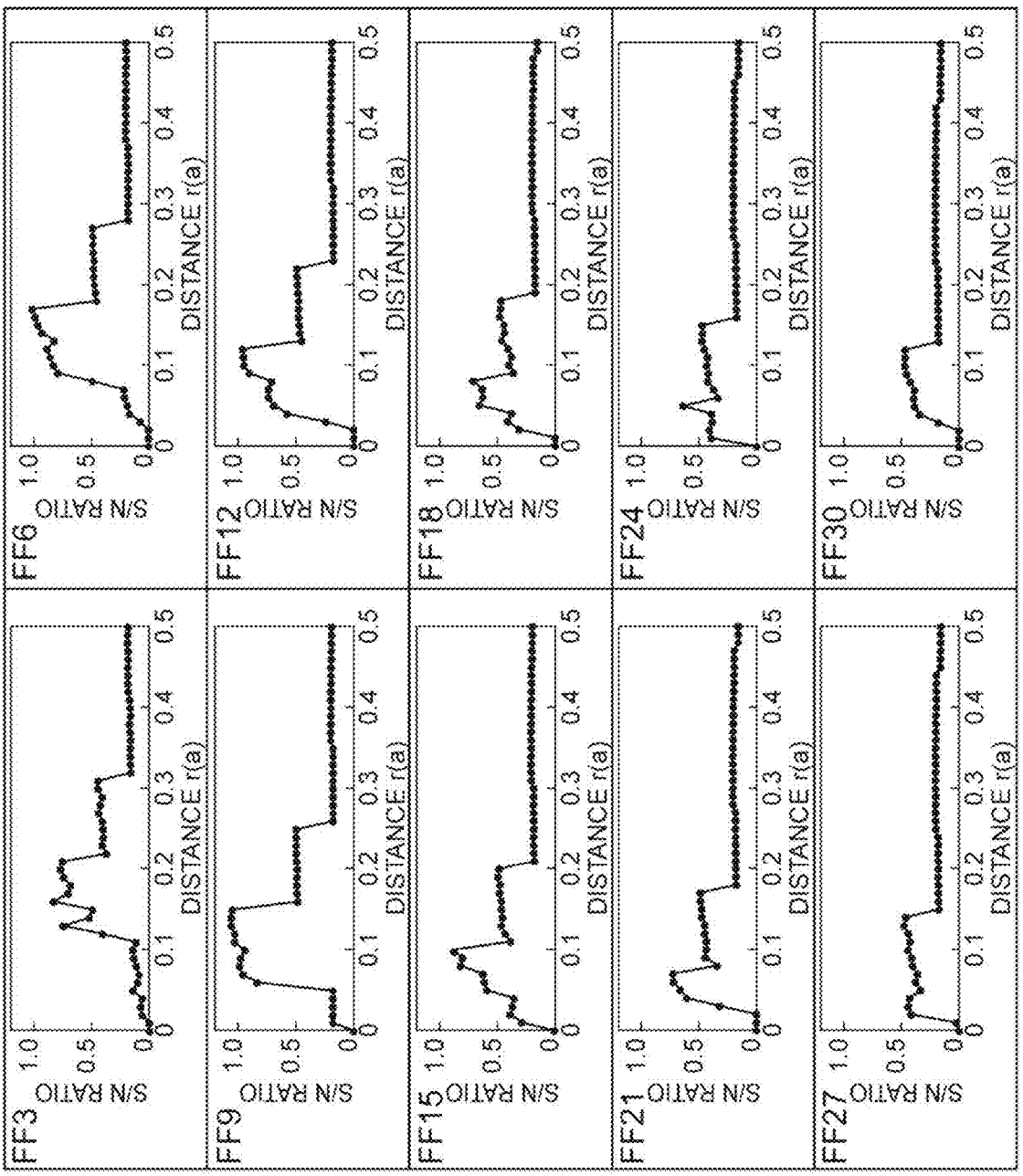
Fig. 15 (SAMPLE 2)

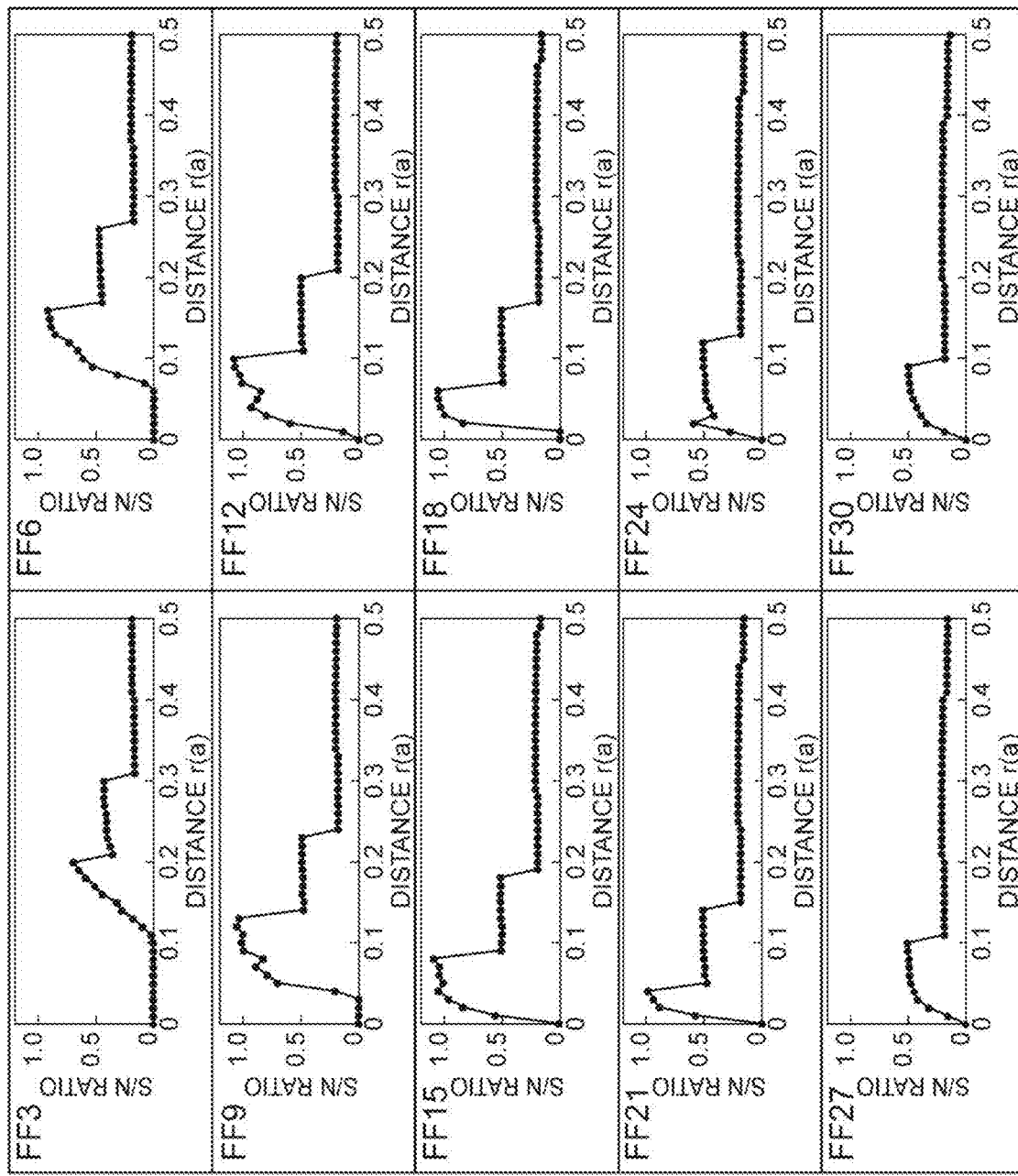
Fig. 18 (SAMPLE 3)

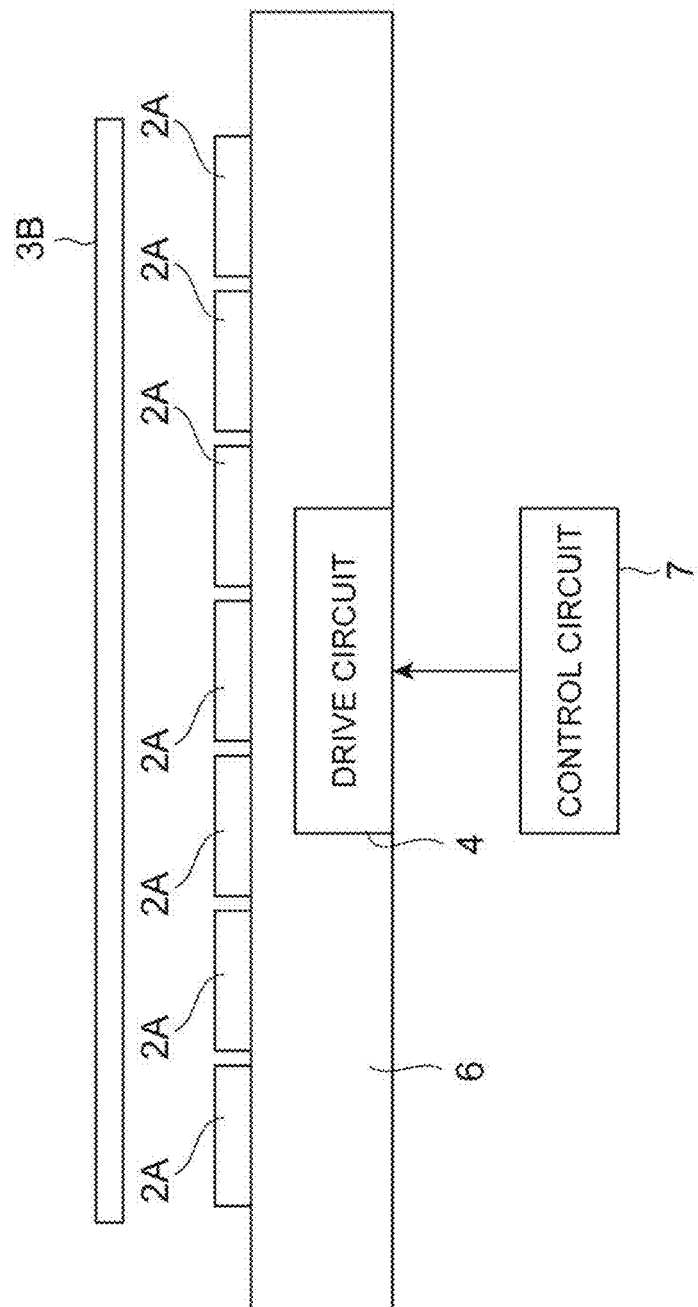

LIGHT-EMITTING DEVICE

CROSS-REFERENCE TO RELATED APPLICATIONS

This application is a Continuation-In-Part application of patent application Ser. No. 16/323,625 claiming the benefit of priority of the Japanese Patent Application No. 2016-157792 filed on Aug. 10, 2016 and further claims the benefit of priority of the Japanese Patent Application No. 2018-110112 filed on Jun. 8, 2018, the entire contents of which are incorporated herein by reference.

TECHNICAL FIELD

The present invention relates to a light emitting device.

BACKGROUND ART

The semiconductor light emitting element described in Patent Document 1 includes an active layer, a pair of cladding layers sandwiching the active layer, and a phase modulation layer provided optically coupled to the active layer. The phase modulation layer has a basic layer and a plurality of modified refractive index regions each having a different refractive index from a refractive index of the basic layer. In the case of setting a square lattice on the phase modulation layer, each of the modified refractive index regions (main holes) is disposed so as to coincide with the center point (lattice point) of a corresponding region (having a square shape) in the square lattice. An auxiliary modified refractive index region (auxiliary hole) is provided around the modified refractive index region, and light having a predetermined beam pattern can be emitted.

CITATION LIST

Patent Literature

Patent Document 1: International Publication No. 2014/136962

SUMMARY OF INVENTION

Technical Problem

As a result of examining the conventional semiconductor light emitting element, the inventors of the present invention have found the following problems. That is, a semiconductor light emitting element is under study which outputs an arbitrary optical image by controlling phase spectrum and intensity spectrum of light emitted from a plurality of two-dimensionally arranged light emitting points. As one structure of such a semiconductor light emitting element, a lower cladding layer, an active layer, and an upper cladding layer are provided on a semiconductor substrate, and between the lower cladding layer and the active layer or between the active layer and the upper cladding layer, a phase modulation layer is provided. The phase modulation layer includes a basic layer and a plurality of modified refractive index regions each having a different refractive index from a refractive index of the basic layer. When a virtual square lattice is set in a thickness direction of the phase modulation layer on a vertical surface, the position of the center of gravity of the modified refractive index region allocated to each of a plurality of square regions forming the square lattice shifts from a lattice point position of the square region allocated according to an optical image to be generated. Such a semiconductor light emitting element is called an S-iPM (Static-integrable Phase Modulating) laser and outputs a beam for forming an optical image having a two-dimensional arbitrary shape along a direction (normal direction) perpendicular to a main surface of the semiconductor substrate and a direction having a predetermined spread angle with respect to the normal direction.

However, in addition to a signal light which is a desired output optical image, zero order light is output from the above-described semiconductor light emitting element. The zero order light is a light output in a direction perpendicular to the main surface of a semiconductor substrate (that is, a direction perpendicular to the light emitting surface) and is not normally used in the S-iPM laser. Therefore, in order to obtain a desired output optical image, the zero order light becomes noise light, and therefore it is desirable to remove the zero order light from an optical image.

To solve the above-described problems, an object of the present invention is to provide a light emitting device having a structure capable of removing zero order light from output light of an S-iPM laser.

Solution to Problem

In order to solve the above-described problem, a light emitting device according to an embodiment of the present invention includes, for example, a semiconductor light emitting element and a light shielding member. The semiconductor light emitting element has a light emitting surface and outputs an optical image having an arbitrary shape along a normal direction of the light emitting surface and an inclined direction having a predetermined inclination and a spread angle with respect to the normal direction. The light shielding member is disposed such that an axis orthogonal to the light emitting surface at a position of the center of gravity of the light emitting surface crosses a part of the light shielding member. Further, the semiconductor light emitting element includes an active layer, a pair of cladding layers sandwiching the active layer, and a phase modulation layer provided between the active layer and either a pair of the cladding layers and optically coupled to the active layer. The light shielding member is disposed so as to pass through a specific optical image output in an inclined direction among the output optical images and to shield zero order light output in a normal direction of the light emitting surface. The phase modulation layer has a basic layer and a plurality of modified refractive index regions each having a different refractive index from a refractive index of the basic layer. On the other hand, a method of manufacturing a semiconductor light emitting element includes first to fourth steps. In the first step, a lower cladding layer (one of a pair of the cladding layers) is provided on a substrate. In the second step, the active layer is provided on the lower cladding layer. In the third step, an upper cladding layer (the other one of a pair of the cladding layers) is provided on the active layer. The fourth step is performed between the first step and the second step or between the second step and the third step, and the phase modulation layer is provided between the lower cladding layer and the active layer or between the active layer and the upper cladding layer. In the method of manufacturing the light emitting device, a desired light emitting device can be obtained by disposing, to the semiconductor light emitting element manufactured in this way, the light shielding member such that the axis line orthogonal to the light emitting surface at a position of the center of gravity of the light emitting surface crosses a part of the light shielding member.

In particular, in the light emitting device and the method of manufacturing the semiconductor light emitting element according to the present embodiment, the phase modulation layer is configured such that each of a plurality of the modified refractive index regions is individually disposed at a specific position. Specifically, the phase modulation layer is formed such that, in an XYZ orthogonal coordinate system defined by a Z axis that coincides with a normal direction and an X-Y plane that coincides with one surface of the phase modulation layer including a plurality of modified refractive index regions and that includes mutually orthogonal X and Y axes, where a virtual square lattice including M1 (integer of 1 or more)×N1 (integer of 1 or more) unit constituent regions R each having a square shape is set on the X-Y plane, in the unit constituent region R (x, y) on the X-Y plane specified by a coordinate component x (an integer of from 1 to M1) in the X axis direction and a coordinate component y (an integer of from 1 to N1) in the Y axis direction, the center of gravity G1 of the modified refractive index region located in the unit constituent region R (x, y) is away from the lattice point O (x, y) which is the center of the unit constituent region R (x, y), and a vector from the lattice point O (x, y) to the center of gravity G1 is oriented in a specific direction.

Advantageous Effects of Invention

According to the light emitting device and the method of manufacturing the semiconductor light emitting element according to the present embodiment, a zero order light can be removed from the output of a S-iPM laser.

BRIEF DESCRIPTION OF DRAWINGS

FIGS. 8A and 8B are views for explaining points to be noted in determining a rotation angle distribution from a result of Fourier transform of an optical image and determining the arrangement of modified refractive index regions.

FIG. 12 is graphs indicating a relationship between the distance r(a) and the S/N ratio in the first configuration of a phase modulation layer.

FIG. 15 is graphs indicating a relationship between the distance r(a) and the S/N ratio in the second configuration of the phase modulation layer.

FIG. 18 is graphs indicating a relationship between the distance r(a) and the S/N ratio in the third configuration of a phase modulation layer.

FIG. 37 illustrates a configuration of a light emitting device according to a third modification.

DESCRIPTION OF EMBODIMENTS

Figure 1:
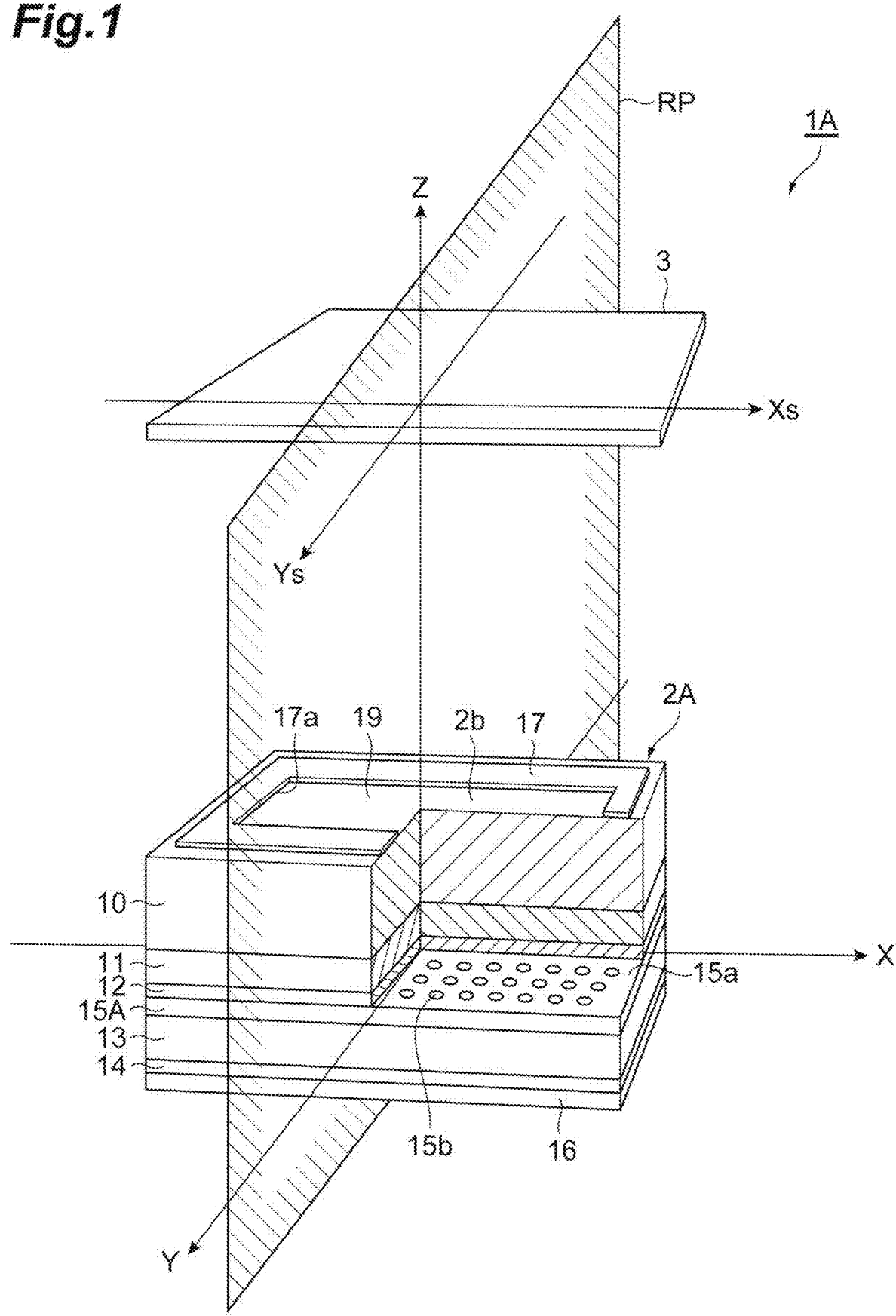
FIG. 1 is a perspective view illustrating a configuration of a light emitting device according to an embodiment of the present invention.

Description of Embodiments of the Present Invention

First, the contents of an embodiment of the present invention will be individually listed and described individually.

(1) A light emitting device according to the embodiment of the present invention includes a semiconductor light emitting element and a light shielding member as an aspect thereof. The semiconductor light emitting element has a light emitting surface and outputs an optical image having an arbitrary shape along a normal direction of the light emitting surface and an inclined direction having a predetermined inclination and a spread angle with respect to the normal direction. The light shielding member is disposed such that an axis orthogonal to the light emitting surface at a position of the center of gravity of the light emitting surface crosses a part of the light shielding member. Further, the semiconductor light emitting element includes an active layer, a pair of cladding layers sandwiching the active layer, and a phase modulation layer provided between the active layer and either a pair of the cladding layers and optically coupled to the active layer. The light shielding member is disposed so as to pass through a specific optical image output in an inclined direction among the output optical images and to shield zero order light output in a normal direction of the light emitting surface. The phase modulation layer has a basic layer and a plurality of modified refractive index regions each having a different refractive index from a refractive index of the basic layer. On the other hand, a method of manufacturing a semiconductor light emitting element includes first to fourth steps. In the first step, a lower cladding layer (one of a pair of the cladding layers) is provided on a substrate. In the second step, the active layer is provided on the lower cladding layer. In the third step, an upper cladding layer (the other one of a pair of the cladding layers) is provided on the active layer. The fourth step is performed between the first step and the second step or between the second step and the third step, and the phase modulation layer is provided between the lower cladding layer and the active layer or between the active layer and the upper cladding layer. In the method of manufacturing the light emitting device, a desired light emitting device can be obtained by disposing, to the semiconductor light emitting element manufactured in this way, the light shielding member such that the axis line orthogonal to the light emitting surface at a position of the center of gravity of the light emitting surface crosses a part of the light shielding member.

In particular, in the light emitting device and the method of manufacturing the semiconductor light emitting element according to the present embodiment, the phase modulation layer is configured such that each of a plurality of the modified refractive index regions is individually disposed at a specific position. Specifically, as a first precondition, in an XYZ orthogonal coordinate system defined by a Z axis that coincides with a normal direction and an X-Y plane that includes X and Y axes orthogonal to each other and coincides with one face of the phase modulation layer including a plurality of modified refractive index regions, a virtual square lattice including M1 (an integer of 1 or more)×N1 (an integer of 1 or more) unit constituent regions R each having a square shape is set on the X-Y plane. At this time, in the unit constituent region R (x, y) on the X-Y plane specified by a coordinate component x (an integer of from 1 to M1) in the X axis direction and a coordinate component y (an integer of from 1 to N1) in the Y-axis direction, a phase modulation layer is formed such that the center of gravity G1 of the modified refractive index region located in the unit constituent region R (x, y) is away from the lattice point O (x, y) which is the center of the unit constituent region R (x, y), and a vector from the lattice point O (x, y) to the center of gravity G1 is oriented in a specific direction.

In the semiconductor light emitting element having the above-described structure, the phase modulation layer optically coupled to the active layer includes a basic layer and a plurality of modified refractive index regions each being embedded in the basic layer and having a refractive index different from a refractive index of the basic layer. Further, in the unit constituent region R (x, y) constituting a virtual square lattice, the center of gravity G1 of the corresponding modified refractive index region is disposed away from the lattice point O (x, y). Further, a direction of the vector from the lattice point O to the center of gravity G1 is individually set for each unit constituent region R. In such a configuration, depending on the direction of the vector from the lattice point O to the center of gravity G1 of the corresponding modified refractive index region, that is, a phase of beam changes according to an angular position around the lattice point of the center of gravity G1 of the modified refractive index region. As described above, according to the present embodiment, it is possible to control the phase of a beam output from each of the modified refractive index regions only by changing a position of the center of gravity in the modified refractive index region. A beam pattern (beam group forming an optical image) formed as a whole can be controlled to a desired shape. At this time, the lattice point in the virtual square lattice may be located outside the modified refractive index region, and the lattice point may be located inside the modified refractive index region.

That is, the semiconductor light emitting element applicable to the present embodiment is an S-iPM laser and can output an optical image having an arbitrary shape (for example, a beam pattern formed on a two-dimensional plane) along a normal direction of the light emitting surface and an inclined direction having a predetermined inclination and a spread angle with respect to the normal direction. Furthermore, a light shielding member is disposed such that an axis orthogonal at a position of the center of gravity of a light emitting surface (coinciding with the Z axis) crosses a part of the light shielding member, and the light shielding member functions to shield zero order light while passing through a specific optical image output along the inclined direction. As a result, the zero order light can be removed from the output of the S-iPM laser.

(2) As an aspect of the present embodiment, where a lattice constant of a virtual square lattice (substantially corresponding to a lattice spacing) is a, it is preferable that the distance r between the center of gravity G1 of a modified refractive index region located in the unit constituent region R (x, y) and the lattice point O (x, y) satisfies 0≤r≤0.3a. Further, in the above-described light emitting device, as an original image (optical image before two-dimensional inverse Fourier return) represented by the beam pattern emitted from the semiconductor light emitting element, at least one of a spot, a straight line, a cross, a line drawing, a lattice pattern, photographs, striped patterns, computer graphics, and letters is preferably included.

Figure 38:
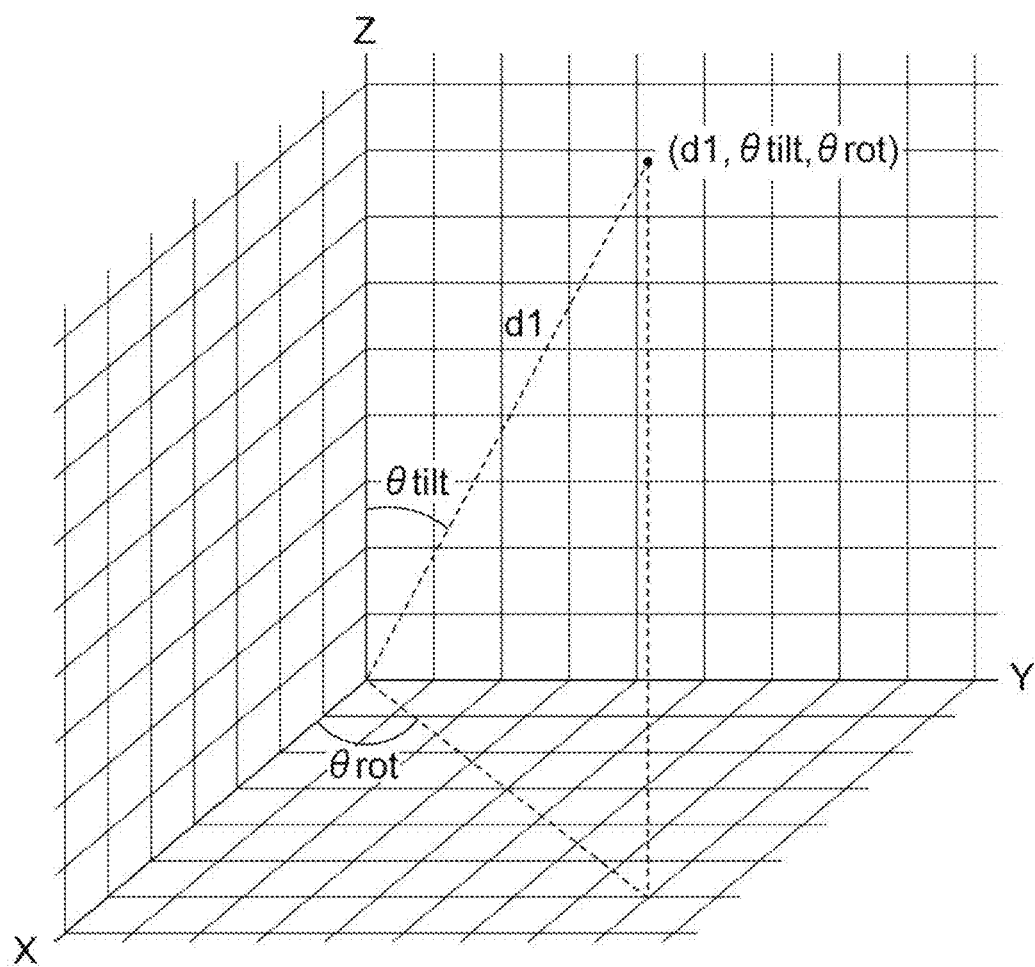
FIG. 38 is a diagram for explaining coordinate transformation from spherical coordinates ($d1$, $\theta_{tilt}$, $\theta_{rot}$) to coordinates (x, y, z) in an XYZ orthogonal coordinate system.

(3) In an aspect of the present embodiment, in addition to the first precondition, as the second precondition, it is assumed that the coordinates (x, y, z) in the XYZ orthogonal coordinate system satisfies the relationship expressed by the following expressions (1) to (3), as illustrated in FIG. 38, with respect to the spherical coordinates $(d1, \theta_{rot})$ defined by the length d1 of a moving radius, the inclination angle $\theta_{tilt}$ from the Z axis, and the rotation angle $\theta_{rot}$ from the X axis specified on the X-Y plane. FIG. 38 is a diagram for explaining the coordinate transformation from the spherical coordinates $(d1, \theta_{rot})$ to the coordinates (x, y, z) in the XYZ orthogonal coordinate system, and a designed optical image on a predetermined plane set in the XYZ orthogonal coordinate system which is a real space is expressed. Where a beam pattern corresponding to an optical image output from a semiconductor light emitting element is a set of bright points directed in directions defined by angles $\theta_{tilt}$ and $\theta_{rot}$, the angles $\theta_{tilt}$ and $\theta_{rot}$ are converted into a coordinate value $k_x$ on the Kx axis corresponding to the X axis which is a normalized wave number defined by the following formula (4) and a coordinate value $k_y$ on the Ky axis orthogonal to the Kx axis corresponding to the Y axis which is a normalized wave number defined by the following formula (5). The normalized wavenumber means a wavenumber normalized with a wavenumber corresponding to a lattice spacing of a virtual square lattice taken as 1.0. At this time, in a wavenumber space defined by the Kx axis and the Ky axis, a specific wavenumber range including a beam pattern corresponding to an optical image includes M2 (an integer of 1 or more)×N2 (an integer of 1 or more) image regions FR. Note that the integer M2 does not have to match the integer M1. Likewise, the integer N2 does not have to match the integer N1. Further, formulas (4) and (5) are disclosed in, for example, Y. Kurosaka et al., "Effects of non-lasing band in two-dimensional photonic-crystal lasers clarified using omnidirectional band structure," Opt. Express 20, 21773-21783 (2012).

$$x = d1\sin\theta_{tilt}\cos\theta_{rot} \quad (1)$$

$$y = d1\sin\theta_{tilt}\sin\theta_{rot} \quad (2)$$

$$z = d1\cos\theta_{tilt} \quad (3)$$

$$k_x = \frac{a}{\lambda}\sin\theta_{tilt}\cos\theta_{rot} \quad (4)$$

$$k_y = \frac{a}{\lambda}\sin\theta_{tilt}\sin\theta_{rot} \quad (5)$$

a: Lattice constant of vertical square lattice
λ: Oscillation wavelength of semiconductor light emitting element As a third precondition, in a wavenumber space, a complex amplitude F (x, y) obtained by performing two-dimensional inverse Fourier transform to transform each of the image regions FR $(k_x, k_y)$ specified by a coordinate component $k_x$ (an integer of from 0 to M2−1) in the Kx axis direction and a coordinate component $k_y$ (an integer of from 0 to N2−1) in the Ky axis direction to the unit constituent region R (x, y) on the X-Y plane specified by a coordinate component x (an integer of from 1 to M1) in the X axis direction and a coordinate component y (an integer of from 1 to N1) in the Y axis direction is expressed by the following formula (6) with j being an imaginary unit: Further, this complex amplitude F (x, y) is defined by the following formula (7) where the amplitude term is denoted by A (x, y) and the phase term is denoted by P (x, y). Furthermore, as a fourth precondition, the unit constituent region R (x, y) is defined by s and t axes mutually orthogonal at the lattice point O (x, y) that is parallel to the X axis and the Y axis and is the center of the unit constituent region R (x, y).

$$F(x, y) = \sum_{k_x=0}^{M2-1}\sum_{k_y=0}^{N2-1} FR(k_x, k_y)\exp\left[j2\pi\left(\frac{k_x}{M2}x + \frac{k_y}{N2}y\right)\right] \quad (6)$$

$$F(x, y) = A(x, y) \times \exp[jP(x, y)] \quad (7)$$

Under the above-described first to fourth preconditions, the phase modulation layer is configured to satisfy the following first and second conditions. That is, the first condition is that, in the unit constituent region R (x, y), one of a plurality of the modified refractive index regions corresponds to a state in which the center of gravity G1 is disposed away from the lattice point O (x, y). Further, under, the second condition, the corresponding modified refractive index region is disposed in the unit constituent region R (x, y) such that the angle φ (x, y) formed by the line segment connecting the lattice point O (x, y) and the center of gravity G1 of the corresponding modified refractive index region and the s axis satisfies the following relationship in a state in which the line segment length r (x, y) from the lattice point O (x, y) to the center of gravity G1 of the corresponding modified refractive index region is set to a common value in each of M1×N1 unit constituent regions R:

φ(x,y)=C×P(x,y)+B

C: Proportional constant, for example 180°/π
B: Arbitrary constant, for example 0

In the semiconductor light emitting element having the above-described structure, in the phase modulation layer, the distance r between the center (lattice point) of each unit constituent region constituting a virtual square lattice and the center of gravity G1 of the corresponding modified refractive index region is preferably constant over the entire phase modulation layer. Thereby, in the case where the phase distribution (the distribution of the phase term P (x, y) in the complex amplitude F (x, y) assigned to the unit constituent region R (x, y)) in the entire phase modulation layer is equally distributed from 0 to $2\pi$ (rad), on average, the center of gravity of the modified refractive index region coincides with the lattice point of the unit constituent region R in a square lattice. Therefore, since the two-dimensional distributed Bragg diffraction effect in the above-described phase modulation layer approaches the two-dimensional distributed Bragg diffraction effect in the case where the modified refractive index region is disposed on each lattice point of the square lattice, a standing wave can be easily formed, and reduction in threshold current for oscillation can be expected.

(4) As an aspect of the present embodiment, a distance from a light emitting surface to a light shielding member is denoted by z, a distance from an axis to the nearest edge of the light shielding member on a reference plane including the axis is denoted by Wa, the beam width of zero order light at a point of the distance z is denoted by $W_z$, the width of the light emitting surface defined on the reference plane is denoted by L, an angle formed by an axial side edge of a specific optical image and the axis on the reference plane is denoted by $\theta_{PB}$, and the emission wavelength of the active layer is denoted by $\lambda$, the distance z is preferably longer than $z_{sh}$ defined by the following formula (8):

$$z_{sh} = \frac{W_z + L}{2\tan\theta_{PB}} \tag{8}$$

In addition, the distance Wa is preferably longer than half of $W_z$ defined by the following formula (9).

$$W_Z = \frac{4\lambda}{\pi L} z \text{ (where } z \geq z_0\text{)} \tag{9}$$
$$W_Z = \sqrt{2} L \text{ (where } z < z_0\text{)}$$

However, $Z_0$ in the above formula (9) is a numerical value defined by the following formula (10).

$$z_0 = \frac{\pi}{\lambda}\left(\frac{L}{2}\right)^2 \tag{10}$$

Thereby, the light shielding member can effectively shield the zero order light.

(5) As an aspect of the present embodiment, the optical image may include a first optical image portion output in a first direction inclined with respect to an axis and a second optical image portion output in a second direction symmetrical to the first direction with respect to the axis and rotationally symmetric to the first optical image portion with respect to the axis. In this case, the light shielding member is disposed to further shield the second optical image portion. As described above, according to the present aspect, it is possible to effectively remove unnecessary second optical image portions when the first optical image portion is the above-described specific optical image.

(6) In one aspect of the present embodiment, the light shielding member preferably includes a light absorbing material. When the light shielding member reflects the zero order light, the reflected light again enters the semiconductor light emitting element, which may affect the operation inside the semiconductor light emitting element. By including the light absorbing material in the light shielding member, it is possible to absorb the zero order light and prevent the zero order light from entering the semiconductor light emitting element again.

(7) As an aspect of the present embodiment, the light emitting device may include a plurality of semiconductor light emitting elements each having a light emitting surface, a light shielding member, and a drive circuit for individually driving a plurality of the semiconductor light emitting elements. Each of a plurality of the semiconductor light emitting elements outputs an optical image having an arbitrary shape along a normal direction of the light emitting surface and an inclined direction having a predetermined inclination and a spread angle with respect to the normal direction. The light shielding member is disposed such that each of the axis lines orthogonal to the light emitting surface and a part the light shielding member cross each other at the center of gravity of the light emitting surface of each of a plurality of the semiconductor light emitting elements. Further, each of a plurality of the semiconductor light emitting elements includes an active layer, a pair of cladding layers sandwiching the active layer, and a phase modulation layer provided between the active layer and either a pair of the cladding layers and optically coupled to the active layer. The light shielding member is disposed so as to pass through a specific optical image output in an inclined direction among the output optical images and to shield zero order light output in a normal direction of the light emitting surface. In each of a plurality of the semiconductor light emitting elements, the phase modulation layer has a basic layer and a plurality of modified refractive index regions each having a different refractive index from a refractive index of the basic layer.

Further, the phase modulation layers of each of a plurality of the semiconductor light emitting elements are configured as follows. That is, in each of a plurality of the semiconductor light emitting elements, in an XYZ orthogonal coordinate system defined by a Z axis that coincides with a normal direction and an X-Y plane that includes X and Y axes orthogonal to each other and coincides with one surface of the phase modulation layer including a plurality of modified refractive index regions, a virtual square lattice including M1 (an integer of 1 or more)×N1 (an integer of 1 or more) unit constituent regions R each having a square shape is set on the X-Y plane. At this time, a phase modulation layer is formed such that, in the unit constituent region R (x, y) on the X-Y plane specified by a coordinate component x (an integer of from 1 to M1) in the X axis direction and a coordinate component y (an integer of from 1 to N1) in the Y axis direction, the center of gravity G1 of the modified refractive index region located in the unit constituent region R (x, y) is away from the lattice point O (x, y) which is the center of the unit constituent region R (x, y), and the vector from the lattice point O (x, y) to the center of gravity G1 is oriented in a specific direction. As described above, the light emitting device includes a plurality of individually driven semiconductor light emitting elements, such that it is possible to extract only a desired optical image from each of the semiconductor light emitting elements. With this, it is possible to suitably realize a head up display or the like by appropriately driving required elements for a module in which semiconductor light emitting elements corresponding to a plurality of patterns are aligned in advance.

(8) As an aspect of the present embodiment, it is preferable that each of a plurality of semiconductor light emitting elements includes any one of a semiconductor light emitting element that outputs an optical image in a red wavelength range, a semiconductor light emitting element that outputs an optical image in a blue wavelength range, and a semiconductor light emitting element that outputs an optical image in a green wavelength range. In this case, a color head up display or the like can be suitably realized.

As described above, each aspect listed in "Description of Embodiments of the Present Invention" can be applied to all of the remaining aspects or to all combinations of these remaining aspects.

Details of Embodiment of Present Invention

Hereinafter, a specific structure of the light emitting device according to the present embodiment will be described in detail with reference to the attached drawings. It should be noted that the present invention is not limited to these illustrative examples, but is indicated by the scope of the claims, and it is intended to include meanings equivalent to the claims and all changes within the scope. In the description of the drawings, the same elements are denoted by the same reference numerals, and redundant explanations are omitted.

FIG. 1 is a perspective view of a configuration of a light emitting device 1A according to an embodiment of the present invention. The light emitting device 1A includes a laser element 2A as a semiconductor light emitting element and a light shielding member 3 optically coupled to the light emitting surface 2b of the laser element 2A. An XYZ orthogonal coordinate system is defined by a Z axis passing through the center of the laser element 2A (the position of the center of gravity of the light emitting surface 2b) and extending in the thickness direction of the laser element 2A, and an X-Y plane that is a plane orthogonal to the Z axis and that coincides with one surface of the phase modulation layer 15A including modified refractive index regions 15b and includes mutually orthogonal X axis and Y axis. The laser element 2A is an S-iPM laser that forms a standing wave along the X-Y plane and outputs a phase-controlled plane wave in the Z-axis direction. As will be described later, the laser element 2A outputs a two dimensional optical image having an arbitrary shape along a normal direction (that is the Z-axis direction) of the light emitting surface 2b and an inclined direction having a predetermined inclination and a spread angle with respect to the normal direction. The light shielding member 3 is disposed to face the light emitting surface 2b of the laser element 2A and shields zero order light included in a beam pattern output from the laser element 2A. Hereinafter, the configurations of the laser element 2A and the light shielding member 3 will be described in detail.

Figure 2:
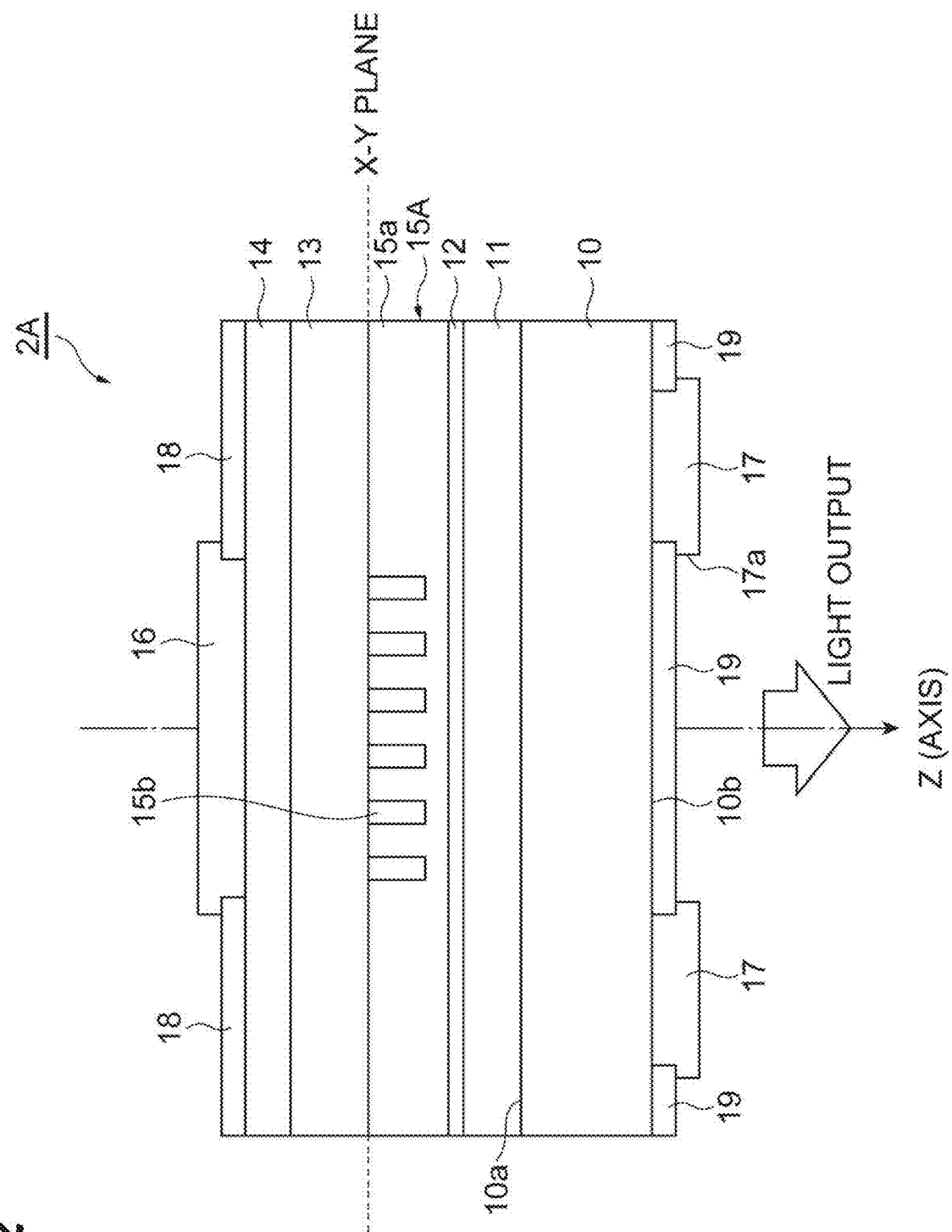
FIG. 2 is a cross-sectional view illustrating a configuration of a laser element.

FIG. 2 is a cross-sectional view of a laminate configuration of the laser element 2A. As illustrated in FIGS. 1 and 2, the laser element 2A includes an active layer 12 provided on a semiconductor substrate 10, a pair of cladding layers 11 and 13 sandwiching the active layer 12, and a contact layer 14 provided on the cladding layer 13 (upper cladding). The semiconductor substrate 10 and each of the layers 11 to 14 include a compound semiconductor such as a GaAs-based semiconductor, an InP-based semiconductor, or a nitride-based semiconductor. An energy band gap of the cladding layer 11 (lower cladding layer) and an energy band gap of the cladding layer 13 are larger than an energy band gap of the active layer 12. Thickness directions (lamination directions) of the semiconductor substrate 10 and each of the layers 11 to 14 coincide with the Z axis direction.

The laser element 2A further includes a phase modulation layer 15A optically coupled to the active layer 12. In the present embodiment, the phase modulation layer 15A is provided between the active layer 12 and the cladding layer 13. If necessary, an optical guide layer may be provided between at least one of the active layer 12 and the cladding layer 13 and the active layer 12 and the cladding layer 11. When the optical guide layer is provided between the active layer 12 and the cladding layer 13, the phase modulation layer 15A is provided between the cladding layer 13 and the optical guide layer. The thickness direction of the phase modulation layer 15A coincides with the Z axis direction.

Figure 3:
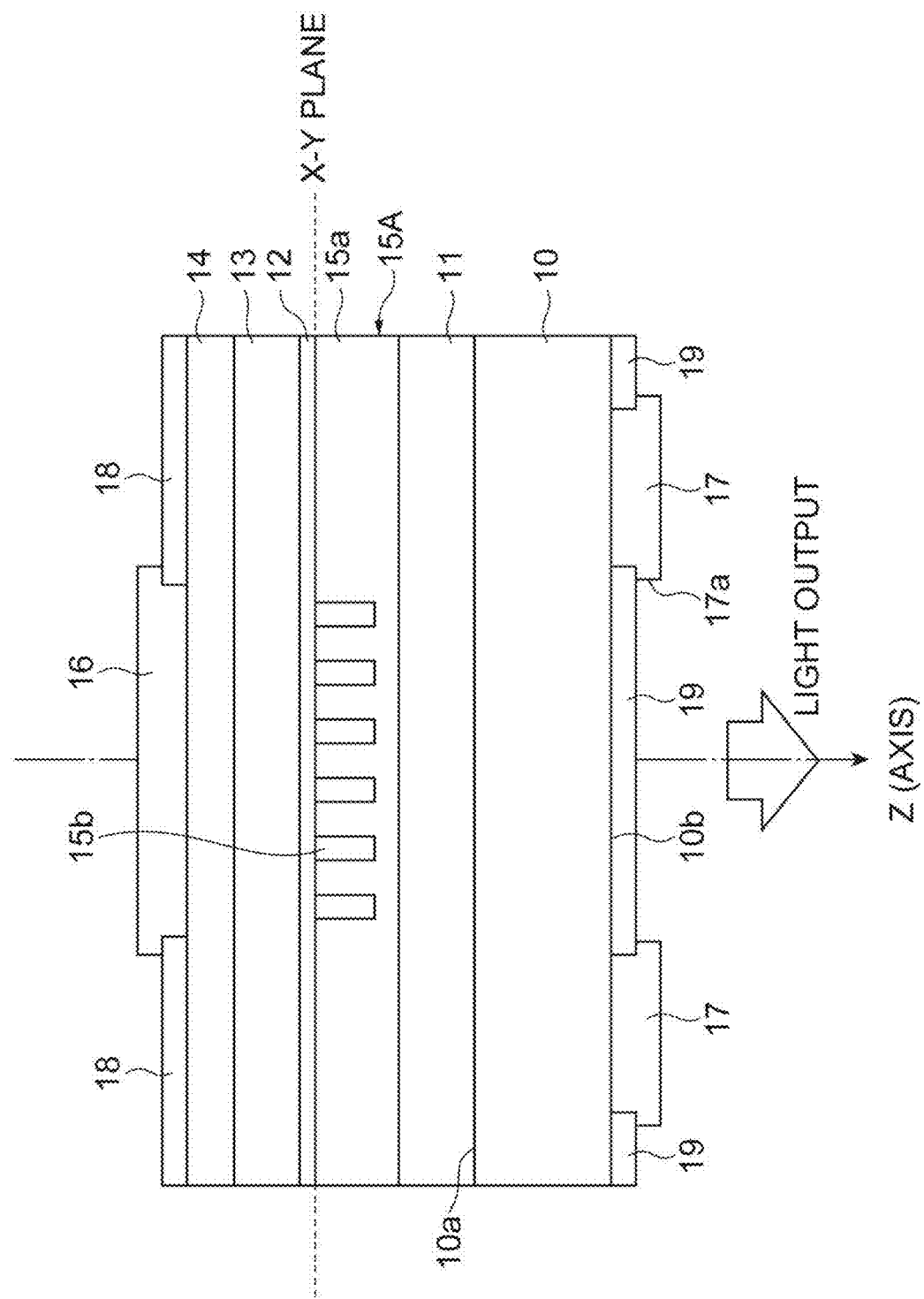
FIG. 3 is a view illustrating a modification relating to a phase modulation layer.

As illustrated in FIG. 3, the phase modulation layer 15A may be provided between the cladding layer 11 and the active layer 12. Furthermore, when the optical guide layer is provided between the active layer 12 and the cladding layer 11, the phase modulation layer 15A is provided between the cladding layer 11 and the optical guide layer.

The phase modulation layer 15A includes the basic layer 15a including a first refractive index medium and multiple modified refractive index regions 15b including a second refractive index medium having a refractive index different from that of the first refractive index medium and arranged in the basic layer 15a. A plurality of the modified refractive index regions 15b includes a substantially periodic structure. Where an effective refractive index of the phase modulation layer 15A is denoted by n, the wavelength $\lambda_0$ (=a×n, a is a lattice spacing) selected by the phase modulation layer 15A is included within an emission wavelength range of the active layer 12. The phase modulation layer (diffraction lattice layer) 15A can select the wavelength $\lambda_0$ out of the emission wavelength of the active layer 12 and output the light of the selected wavelength to the outside. The laser light incident into the phase modulation layer 15A forms a predetermined mode corresponding to the arrangement of the modified refractive index region 15b in the phase modulation layer 15A, and is output as a laser beam having a desired pattern from a surface of the laser element 2A (light emitting surface 2b) to the outside.

The laser element 2A further includes an electrode 16 provided on the contact layer 14 and an electrode 17 provided on a back surface 10b of the semiconductor substrate 10. The electrode 16 is in ohmic contact with the contact layer 14, and the electrode 17 is in ohmic contact with the semiconductor substrate 10. Furthermore, the electrode 17 has an opening 17a. A portion other than the electrode 16 on the contact layer 14 is covered with a protective film 18 (refer to FIG. 2). Note that the contact layer 14 not in contact with the electrode 16 may be removed. A portion (including the inside of the opening 17a) other than the electrode 17 of the back surface 10b of the semiconductor substrate 10 is covered with an antireflection film 19. The antireflection film 19 in a region other than the opening 17a may be removed.

When a driving current is supplied between the electrode 16 and the electrode 17, recombination of electrons and holes occurs in the active layer 12 (light emission). The electrons and holes contributing to the light emission and the generated light are efficiently confined between the cladding layer 11 and the cladding layer 13.

The laser light emitted from the active layer 12 is incident inside the phase modulation layer 15A and forms a predetermined mode corresponding to the lattice structure inside the phase modulation layer 15A. The laser light scattered and emitted in the phase modulation layer 15A is reflected by the electrode 16 and is emitted from the back surface 10b through the opening 17a to the outside. At this time, the zero order light of the laser light is emitted in a direction perpendicular to a main surface 10a. On the other hand, a signal light of the laser light is emitted along a direction perpendicular to the main surface 10a (normal direction) and a direction having a predetermined spread angle with respect to the normal direction. It is the signal light that forms a desired optical image (specific optical image), and the zero order light is not used in the present embodiment.

As an example, the semiconductor substrate 10 is a GaAs substrate, and the cladding layer 11, the active layer 12, the phase modulation layer 15A, the cladding layer 13, and the contact layer 14 are a compound semiconductor layer that includes elements contained in the group consisting of group III elements Ga, Al, and In and group V element As. As a specific example, the cladding layer 11 is an AlGaAs layer, the active layer 12 has a multiple quantum well structure (barrier layer: AlGaAs/well layer: InGaAs), the basic layer 15a of the phase modulation layer 15A is GaAs, the modified refractive index region 15b is a hole, the cladding layer 13 is an AlGaAs layer, and the contact layer 14 is a GaAs layer.

In AlGaAs, an energy band gap and a refractive index can be easily changed by changing an Al composition ratio. In $Al_xGa_{1-x}As$, when decreasing (increasing) the composition ratio X of Al having a relatively small atomic radius, the energy band gap positively correlated with this decreases (increases). In addition, if In having a large atomic radius is mixed with GaAs to form InGaAs, the energy band gap becomes small. That is, the Al composition ratio of the cladding layers 11 and 13 is larger than the Al composition ratio of the barrier layer (AlGaAs) of the active layer 12. The Al composition ratio of the cladding layers 11 and 13 is set to, for example, 0.2 to 0.4, and is 0.3 in one example. The Al composition ratio of the barrier layer of the active layer 12 is set to, for example, 0.1 to 0.15, and is 0.1 in one example.

As another example, the semiconductor substrate 10 is an InP substrate, and the cladding layer 11, the active layer 12, the phase modulation layer 15A, the cladding layer 13, and the contact layer 14 are made of a compound semiconductor, for example, an InP-based compound semiconductor, which is not constituted only by an element contained in the group consisting of group III elements Ga, Al, and In and group V element As. As a specific example, the cladding layer 11 is an InP layer, the active layer 12 has a multiple quantum well structure (barrier layer: GaInAsP/well layer: GaInAsP), the basic layer 15a of the phase modulation layer 15A is GaInAsP, the modified refractive index region 15b is a hole, the cladding layer 13 is an InP layer, and the contact layer 14 is a GaInAsP layer.

Further, as another example, the semiconductor substrate 10 is a GaN substrate, and the cladding layer 11, the active layer 12, the phase modulation layer 15A, the cladding layer 13, and the contact layer 14 are a compound semiconductor layer, for example, made of a nitride-based compound semiconductor. The compound semiconductor layer is not constituted only by an element contained in the group consisting of group III elements Ga, Al, and In and group V element As. As a specific example, the cladding layer 11 is an AlGaN layer, the active layer 12 has a multiple quantum well structure (barrier layer: InGaN/well layer: InGaN), the basic layer 15a of the phase modulation layer 15A is GaN, the modified refractive index region 15b is a hole, the cladding layer 13 is an AlGaN layer, and the contact layer 14 is a GaN layer.

Note that the same conductivity type as that of the semiconductor substrate 10 is imparted to the cladding layer 11, and a conductivity type opposite to that of the semiconductor substrate 10 is imparted to the cladding layer 13 and the contact layer 14. In one example, the semiconductor substrate 10 and the cladding layer 11 are n-type, and the cladding layer 13 and the contact layer 14 are p-type. When the phase modulation layer 15A is provided between the active layer 12 and the cladding layer 11, the phase modulation layer 15A has the same conductivity type as that of the semiconductor substrate 10. On the other hand, when the phase modulation layer 15A is provided between the active layer 12 and the cladding layer 13, the phase modulation layer 15A has a conductivity type opposite to that of the semiconductor substrate 10. The impurity concentration is, for example, $1 \times 10^{17}$ to $1 \times 10^{21}/cm^3$. The phase modulation layer 15A and the active layer 12 are intrinsic (i-type) not intentionally doped with any impurity, and their impurity concentration is $1 \times 10^{15}/cm^3$ or less.

The thickness of the cladding layer 11 is $1 \times 10^3$ to $3 \times 10^3$ (nm), and in one example, it is $2 \times 10^3$ (nm). The thickness of the active layer 12 is 10 to 100 (nm), and in one example, it is 30 (nm). The thickness of the phase modulation layer 15A is 50 to 200 (nm), and in one example, it is 100 (nm). The thickness of the cladding layer 13 is $1 \times 10^3$ to $3 \times 10^3$ (nm), and in one example, it is $2 \times 10^3$ (nm). The thickness of the contact layer 14 is 50 to 500 (nm), and in one example, it is 200 (nm).

In the above-described structure, the modified refractive index region 15b is a hole, but the modified refractive index region 15b may be formed by embedding a semiconductor having a refractive index different from that of the basic layer 15a in the hole. In that case, for example, the holes of the basic layer 15a may be formed by etching. The semiconductor may be embedded in the holes using a metal organic vapor phase epitaxy method, a sputtering method, or an epitaxial method. Further, after the modified refractive index region 15b is formed by embedding a semiconductor in the holes of the basic layer 15a, the same semiconductor as the modified refractive index region 15b may be further deposited thereon. In the case where the modified refractive index region 15b is a hole, an inert gas such as argon, nitrogen, or hydrogen or air may be sealed in the hole.

The antireflection film 19 is made of a dielectric single layer film such as silicon nitride (for example, SiN), silicon oxide (for example, $SiO_2$), or a dielectric multilayer film. As the dielectric multilayer film, for example, a film is applicable in which two or more types of dielectric layers are laminated, and the dielectric layers are selected from the group of dielectric layers such as titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), and zirconium oxide ($ZrO_2$). For example, a film having a thickness of λ/4 is laminated with an optical film thickness for light of wavelength λ. The protective film 18 is an insulating film such as a silicon nitride (for example, SiN) or a silicon oxide (for example, $SiO_2$).

It is also possible to deform an electrode shape and emit laser light from a surface of the contact layer 14. That is, when the opening 17a of the electrode 17 is not provided, and the electrode 16 is open on a surface of the contact layer 14, the laser beam is emitted to the outside from the surface of the contact layer 14. In this case, an antireflection film is provided in and around the opening of the electrode 16.

Figure 4:
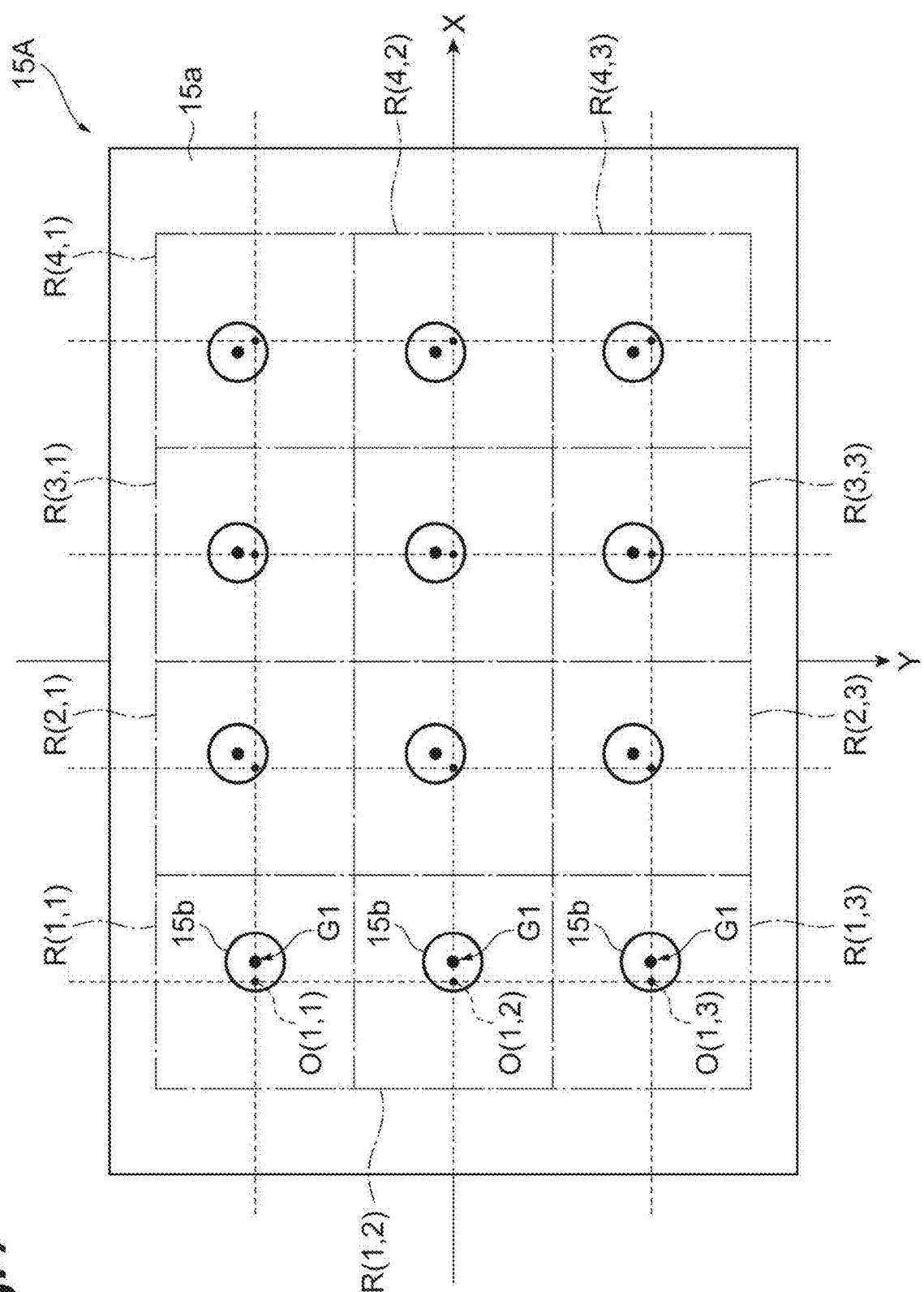
FIG. 4 is a plan view of a phase modulation layer.

FIG. 4 is a plan view of the phase modulation layer 15A. The phase modulation layer 15A includes a basic layer 15a formed of a first refractive index medium and a modified refractive index region 15b formed of a second refractive index medium having a refractive index different from that of the first refractive index medium. Here, a virtual square lattice in the X-Y plane is set in the phase modulation layer 15A. One side of the square lattice is parallel to the X axis, and the other side is parallel to the Y axis. At this time, a square unit constituent region R centered on the lattice point O of the square lattice can be set two-dimensionally over a plurality of rows along the X axis and a plurality of rows along the Y axis. A plurality of the modified refractive index regions 15b is provided one by one in each unit constituent region R. The planar shape of the modified refractive index region 15b is, for example, a circular shape. In each unit constituent region R, the center of gravity G1 of the modified refractive index region 15b is disposed away from the nearest lattice point O. Specifically, the X-Y plane is a plane orthogonal to the thickness direction (Z axis) of the laser element 2A illustrated in FIGS. 2 and 3 and coincides with one surface of the phase modulation layer 15A including the modified refractive index region 15b. Each unit constituent region R constituting a square lattice is specified by a coordinate component x (an integer of 1 or more) in the X axis direction and a coordinate component y (an integer of 1 or more) in the Y axis direction and represented as the unit constituent region R (x, y). At this time, the center of the unit constituent region R (x, y), that is, the lattice point is represented by O (x, y). Note that the lattice point O may be located outside the modified refractive index region 15b or may be included in the modified refractive index region 15b.

In the case where the modified refractive index region 15b is circular, the area $S=\pi(D/2)^2$ where its diameter is denoted by D. A ratio of the area S of the modified refractive index region 15b occupying within one unit constituent region R is defined as a filling factor (FF). The area of one unit constituent region R is equal to the area in one unit lattice of a virtual square lattice.

Figure 5:
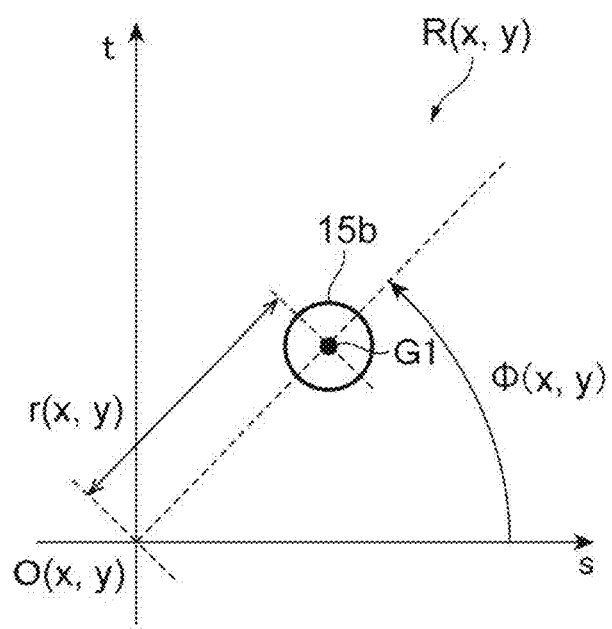
FIG. 5 indicates a positional relationship of modified refractive index regions in a phase modulation layer.

As illustrated in FIG. 5, the unit constituent region R (x, y) constituting a square lattice are defined by s and t axes orthogonal to each other at the lattice point O (x, y). Note that the s axis is an axis parallel to the X axis, and the t axis is an axis parallel to the Y axis. In this way, in the s-t plane defining the unit constituent region R (x, y), an angle formed by the direction from the lattice point O (x, y) to the center of gravity G1 and the s axis is obtained by φ (x, y). When the rotation angle φ (x, y) is 0°, the direction of a vector connecting the lattice point O (x, y) and the center of gravity G1 coincides with the positive direction of the s axis. Further, the length of the vector connecting the lattice point O (x, y) and the center of gravity G1 is obtained by r (x, y). As an example, r (x, y) is constant (over the entire phase modulation layer 15A) in the entire unit constituent region.

As illustrated in FIG. 4, in the phase modulation layer 15A, the rotation angle φ (x, y) of the center of gravity G1 of the modified refractive index region 15b around the lattice point O (x, y) is set independently for each unit constituent region R accordingly. The rotation angle φ (x, y) has a specific value in the unit constituent region R (x, y), but it is not necessarily expressed by a specific function. That is, the rotation angle φ (x, y) is determined from a phase term of a complex amplitude obtained by converting a desired optical image to a wavenumber space and performing two-dimensional inverse Fourier transform to a constant wave number range of the wavenumber space. When the complex amplitude distribution (the complex amplitude of each unit constituent region R) is obtained from a desired optical image, by applying an iterative algorithm such as the Gerchberg-Saxton (GS) method generally used at the time of calculation of hologram generation, the reproducibility of a beam pattern is improved.

Figure 6:
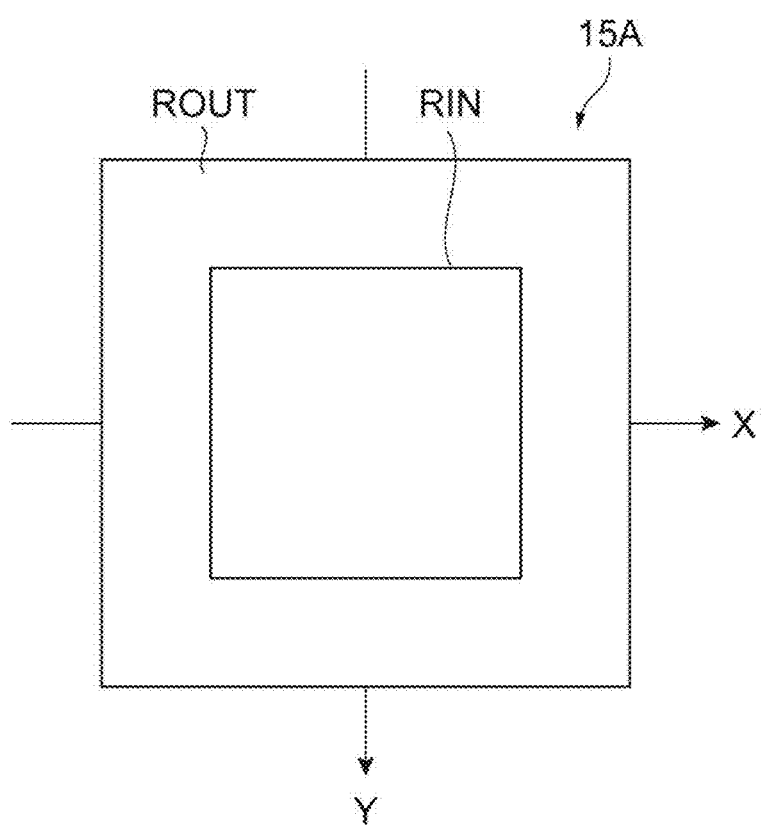
FIG. 6 is a plan view of an example in which a refractive index substantially periodic structure of FIG. 4 is applied only in a specific region of a phase modulation layer.

FIG. 6 is a plan view of an example in which a refractive index substantially periodic structure of FIG. 4 is applied only in a specific region of a phase modulation layer. In the example of FIG. 6, a substantially periodic structure (for example, the structure of FIG. 4) for emitting a target beam pattern is formed inside a square inner region RIN. On the other hand, in an outer region ROUT surrounding the inner region RIN, a true circular modified refractive index region in which the position of the center of gravity coincides with a lattice point position of the square lattice is disposed. For example, the filling factor FF in the outer region ROUT is set to 12%. Further, the lattice spacing of the square lattice that is virtually set is the same (=a) both within the inner region RIN and inside the outside region ROUT. In the case of this structure, since the light is distributed also in the outer region ROUT, there is an advantage that it is possible to suppress the occurrence of high frequency noise (so-called window function noise) caused by abrupt change in light intensity in the peripheral part of the inner region RIN. In addition, light leakage in an in-plane direction can be suppressed, and a reduction in a threshold current can be expected.

Figure 7:
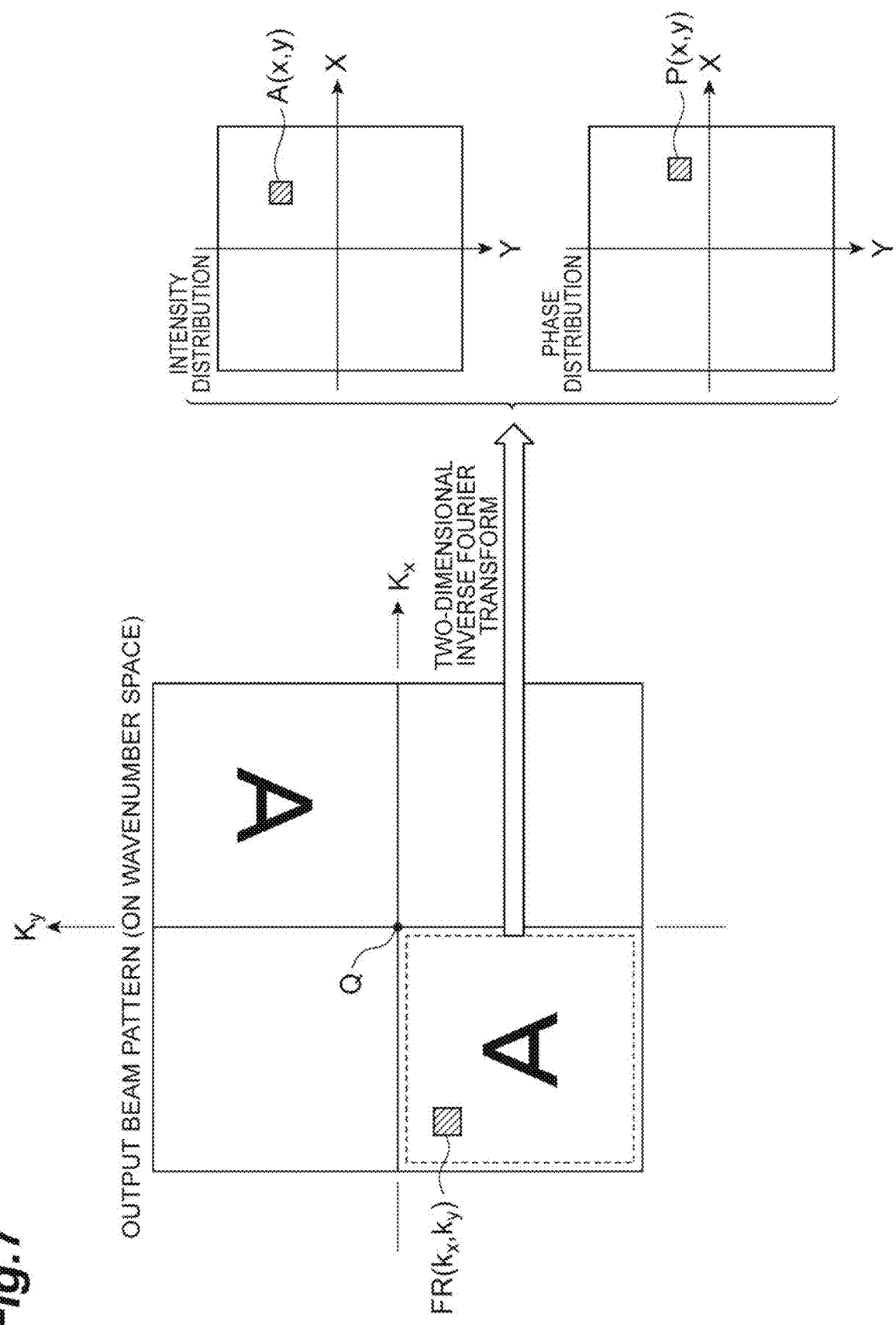
FIG. 7 is a view for explaining a relationship between an optical image obtained by imaging an output beam pattern of a laser element and a rotation angle distribution in a phase modulation layer.

FIG. 7 is a diagram for explaining the relationship between an optical image corresponding to the beam pattern output from the laser element 2A and the distribution of the rotation angle φ (x, y) in the phase modulation layer 15A. More specifically, it is studied about the Kx-Ky plane obtained by converting, to a wavenumber space, a plane (an installation surface of a design optical image expressed by coordinates (x, y, z) in the XYZ orthogonal coordinate system) on which an optical image is formed by the beam emitted from the laser element 2A. The Kx axis and the Ky axis defining the Kx-Ky plane are orthogonal to each other, and each of them corresponds to an angle with respect to a normal direction when the emission direction of a beam is swung from the normal direction of the main surface 10a of the semiconductor substrate 10 to the main surface 10a in accordance with the above-described formulas (1) to (5). On this Kx-Ky plane, a specific region including a beam pattern corresponding to an optical image includes M2 (an integer of 1 or more)×N2 (an integer of 1 or more) image regions FR. Further, it is assumed that a virtual square lattice set on the X-Y plane on the phase modulation layer 15A includes M1 (an integer of 1 or more)×N1 (an integer of 1 or more) unit constituent regions R. Note that the integer M2 does not have to match the integer M1. Likewise, the integer N2 does not have to match the integer N1. At this time, a complex amplitude F (x, y) in the unit constituent region R (x,y) obtained by performing two-dimensional inverse Fourier transform to transform from each of the image regions FR ($k_x$, $k_y$) on the Kx-Ky plane specified by the coordinate component $k_x$ (an integer of from 0 to M2-1) in the Kx axis direction and the coordinate component $k_y$ (an integer of from 0 to N2-1) on the Ky axis direction to the unit constituent region R (x,y) specified by the coordinate component x (an integer of from 1 to M1) in the X axis direction and the coordinate component y (an integer of from 1 to N1) in the Y axis direction is obtained by the following formula (11) with j being an imaginary unit.

$$F(x, y) = \sum_{k_x=0}^{M2-1}\sum_{k_y=0}^{N2-1} FR(k_x, k_y)\exp\left[j2\pi\left(\frac{k_x}{M2}x + \frac{k_y}{N2}y\right)\right] \quad (11)$$

In the unit constituent region R (x, y), where the amplitude term is denoted by A (x, y), and the phase term is denoted by P (x, y), the complex amplitude F (x, y) is defined by the following formula (12).

$$F(x,y)=A(x,y)\times \exp[jP(x,y)] \quad (12)$$

As illustrated in FIG. 7, in the range of the coordinate components x=1 to M1 and y=1 to N1, the distribution of the amplitude term A (x, y) with the complex amplitude F (x, y) of the unit constituent region R (x, y) corresponds to the intensity distribution on the X-Y plane. Further, in the range of x=1 to M1 and y=1 to N1, the distribution of P (x, y) at the complex amplitude F (x, y) in the unit constituent region R (x, y) corresponds to the phase distribution on the X-Y plane. The rotation angle φ (x, y) in the unit constituent region R (x, y) is obtained from P (x, y) as will be described later and, within the range of the coordinate components x=1 to M1 and y=1 to N1, the distribution of the rotation angle φ (x, y) of the unit constituent region R (x, y) corresponds to the rotation angle distribution on the X-Y plane.

The center Q of the output beam pattern on the Kx-Ky plane is located on the axis perpendicular to the main surface 10a of the semiconductor substrate 10. FIG. 7 illustrates four quadrants having the center Q as the origin. FIG. 7 illustrates, as an example, the case where an optical image is obtained in the first quadrant and the third quadrant, but it is also possible to obtain images in the second quadrant and the fourth quadrant, or in all the quadrants. In the present embodiment, as illustrated in FIG. 7, an optical image which is point-symmetrical to the origin can be obtained. FIG. 7 illustrates, as an example, the case where a character "A" is obtained in the third quadrant and a pattern in which the character "A" is rotated by 180° is obtained in the first quadrant. In the case of a rotationally symmetric optical image (for example, a cross, a circle, a double circle, etc.), the images overlap and are observed as one optical image.

The beam pattern (optical image) output from the laser element 2A is an optical image corresponding to a design optical image (original image) represented by at least one of a spot, a straight line, a cross, a line drawing, a lattice pattern, a photograph, a stripe pattern, CG (computer graphics), and letters. Here, in order to obtain a desired optical image, the rotation angle φ (x, y) of the modified refractive index region 15b in the unit constituent region R (x, y) is determined by the following procedure.

As described above, in the unit constituent region R (x, y), the center of gravity G1 of the modified refractive index region 15b is arranged in a state away from the lattice point O (x, y) by r (x, y). At this time, the modified refractive index region 15b is disposed in the unit constituent region R (x, y) such that the rotation angle φ (x, y) satisfies the following relationship.

$$\varphi(x,y)=C\times P(x,y)+B$$

C: Proportional constant, for example 180°/π
B: Arbitrary constant, for example 0

Note that the proportional constant C and the arbitrary constant B are the same for all the unit constituent regions R.

That is, when it is desired to obtain a desired optical image, an optical image formed on the Kx-Ky plane projected on the wavenumber space is transformed into the unit constituent region R (x, y) on the X-Y plane on the phase modulation layer 15A by two-dimensional inverse Fourier transform, and the rotation angle φ (x,y) corresponding to the phase term P (x, y) of the complex amplitude F (x, y) is given to the modified refractive index region 15b disposed in the unit constituent region R (x,y). It should be noted that a far field pattern after the two-dimensional inverse Fourier transform of the laser beam may be formed into various shapes such as a single or a plurality of spot shapes, annular shapes, linear shapes, character shapes, double circular ring shapes, and Laguerre Gaussian beam shapes. Since the beam pattern is represented by wavenumber information in the wavenumber space (on the Kx-Ky plane), in the case of a bitmap image or the like in which the target beam pattern is represented by two-dimensional position information, two-dimensional inverse Fourier transform may be performed after conversion to wavenumber information once.

As a method for obtaining the intensity distribution and the phase distribution from the complex amplitude distribution on the X-Y plane obtained by the two-dimensional inverse Fourier transform, for example, the intensity distribution (the distribution of the amplitude term A (x, y) on the X-Y plane) can be calculated using the abs function of MathWorks' numerical analysis software "MATLAB". The phase distribution (the distribution of the phase terms P (x, y) on the X-Y plane) can be calculated using the angle function of MATLAB.

Here, the rotation angle distribution (the distribution of the rotation angle φ (x, y) on the X-Y plane) is obtained from the result of the two-dimensional inverse Fourier transform of an optical image, and when the arrangement of the modified refractive index region 15b in each of the unit constituent regions R is determined, points to be noted in calculation by using general discrete two-dimensional inverse Fourier transform or fast two-dimensional inverse Fourier transform will be described. When an optical image before the two-dimensional inverse Fourier transform (design optical image on a predetermined plane expressed by coordinates (x, y, z) in the XYZ orthogonal coordinate system) is divided into four quadrants such as A1, A2, A3, and A4, as the original image illustrated in FIG. 8A, the obtained beam pattern is a pattern illustrated in FIG. 8B. That is, in the first quadrant of the beam pattern of FIG. 8B, a pattern obtained by overlapping a pattern obtained by rotating the first quadrant of FIG. 8A by 180° and a pattern of the third quadrant of FIG. 8A appears. In the second quadrant of the beam pattern of FIG. 8B, a pattern obtained by overlapping a pattern obtained by rotating the second quadrant of FIG. 8A by 180° and a pattern in the fourth quadrant of FIG. 8A appears. In the third quadrant of the beam pattern of FIG. 8B, a pattern obtained by overlapping a pattern obtained by rotating the third quadrant of FIG. 8A by 180° and a pattern of the first quadrant of FIG. 8A appears. In the fourth quadrant of the beam pattern of FIG. 8B, a pattern obtained by overlapping a pattern obtained by rotating the fourth quadrant of FIG. 8A by 180° and a pattern of the second quadrant of FIG. 8A appears.

Therefore, when a pattern having a value only in the first quadrant is used as an optical image (original optical image) before the two-dimensional inverse Fourier transform, the pattern of the first quadrant of the original optical image appears in the third quadrant of the obtained beam pattern. On the other hand, in the first quadrant of the obtained beam pattern, a pattern obtained by rotating the first quadrant of the original optical image by 180° appears.

Next, a preferable distance between the center of gravity G1 of the modified refractive index region 15b and the lattice point O of the virtual square lattice will be described. When the lattice spacing of the square lattice is denoted by a, the filling factor FF of the modified refractive index region 15b is obtained as $S/a^2$. Here, S is the area of the modified refractive index region 15b in the X-Y plane. For example, in the case of a true circular shape, and obtained as $S=\pi \times (D/2)^2$ using the diameter D of the true circle. In the case of a square shape, $S=LA^2$ is given by using the length LA of one side of the square.

Figure 9A:
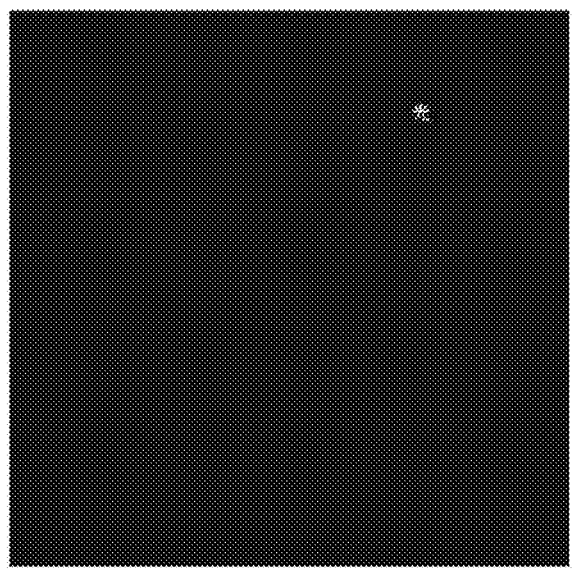
FIG. 9A is an image of an original pattern common to three specific aspects of a phase modulation layer.
Figure 9B:
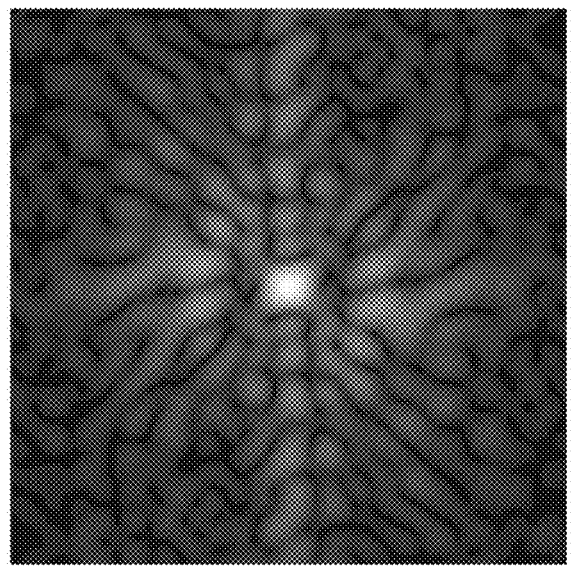
FIG. 9B is an image obtained by extracting an intensity distribution by performing two-dimensional inverse Fourier transform on FIG. 9A.
Figure 9C:
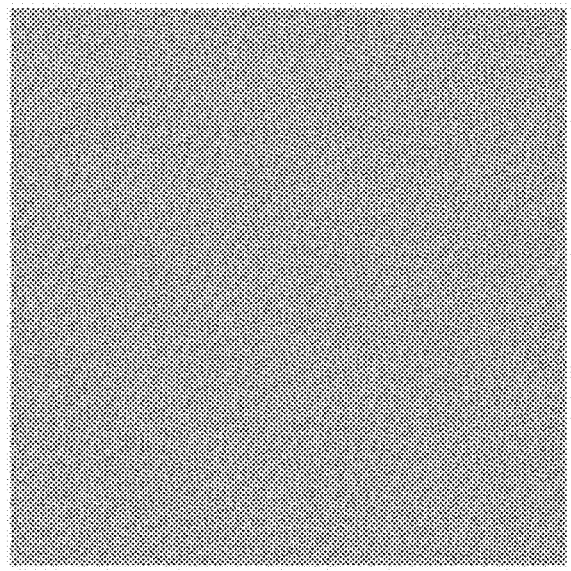
FIG. 9C is an image obtained by extracting a phase distribution by performing two-dimensional inverse Fourier transform on FIG. 9A.

Hereinafter, specific three configurations of the phase modulation layer 15A will be described. FIG. 9A is an image of an original pattern common to each configuration, and is a character of "light" composed of 704×704 pixels. At this time, the letter "light" exists in the first quadrant, and there are no patterns in the second quadrant to the fourth quadrant. FIG. 9B is an image obtained by extracting the intensity distribution by two-dimensional Fourier transform on FIG. 9A and is constituted by elements of 704×704. FIG. 9C is an image obtained by extracting a phase distribution by performing two-dimensional Fourier transform on FIG. 9A, which is constituted by elements of 704×704. This also corresponds to the angular distribution at the same time, and FIG. 9C shows the distribution of the phase from 0 to $2\pi$ (rad) depending on the shade of color. The black color part represents the phase 0 (rad).

Figure 10A:
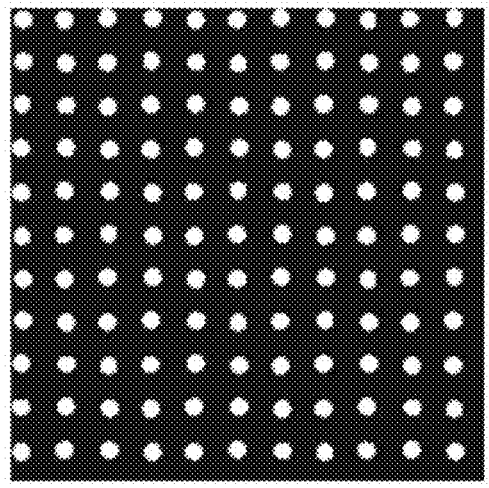
FIG. 10A is an image of a first configuration of a phase modulation layer for realizing the phase distribution illustrated in FIG. 9C.
Figure 10B:
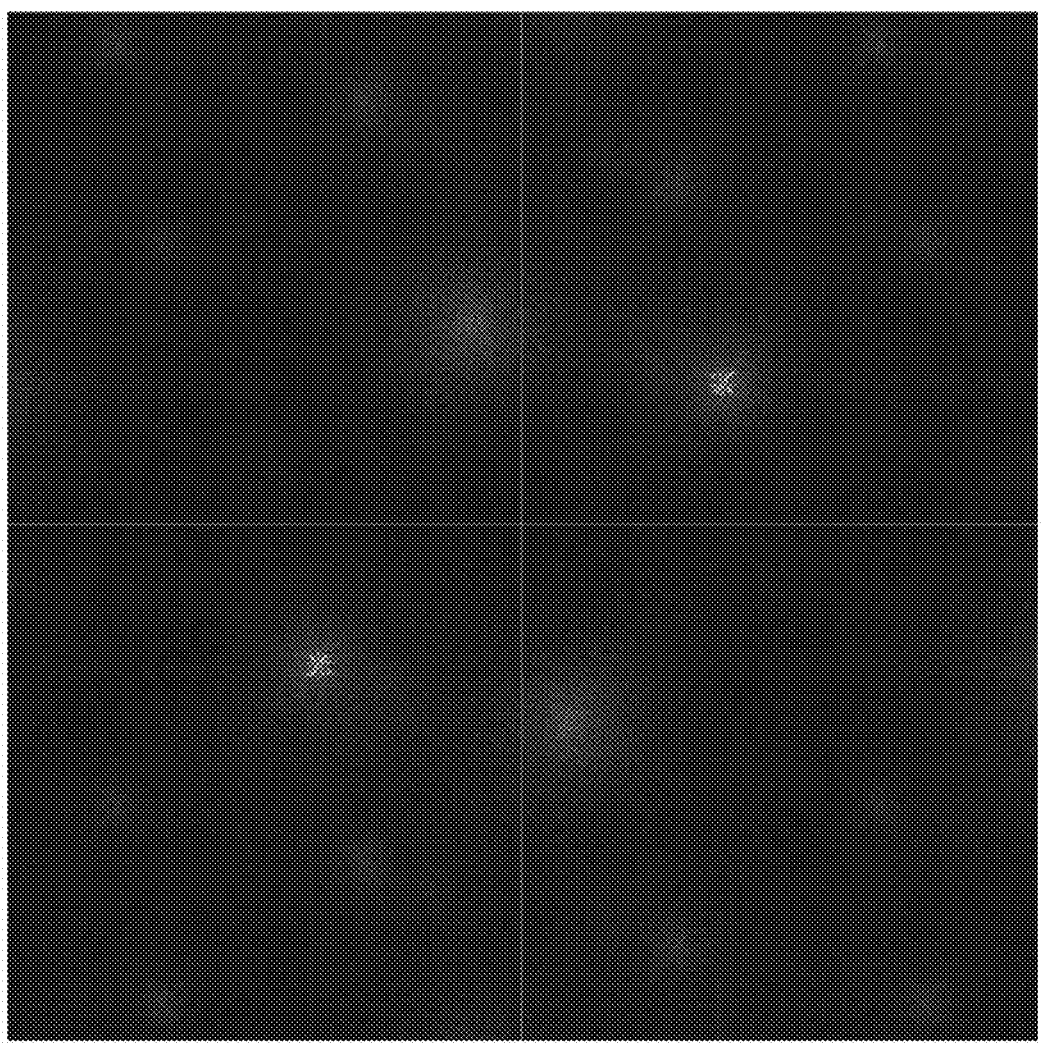
FIG. 10B is a predicted beam pattern obtained by Fourier transforming the entire modified refractive index regions.

FIG. 10A is an image indicating the first configuration of the phase modulation layer 15A for realizing the phase distribution illustrated in FIG. 9C, the basic layer 15a is illustrated in black, and the modified refractive index region 15b is illustrated in white. In this first configuration, 704× 704 modified refractive index regions 15b are included, the planar shape of the modified refractive index region 15b is a true circle, and the lattice spacing a of the square lattice is 284 nm. FIG. 10A illustrates the case where the diameter D of the modified refractive index region 15b is 111 nm, and the distance r between the lattice point O of the virtual square lattice and the center of gravity G1 of the modified refractive index region 15b is 8.52 nm. At this time, the filling factor FF of the modified refractive index region 15b is 12%, and the distance r is 0.03a. FIG. 10B is a predicted beam pattern obtained by Fourier transforming the entire modified refractive index region.

Figure 11:
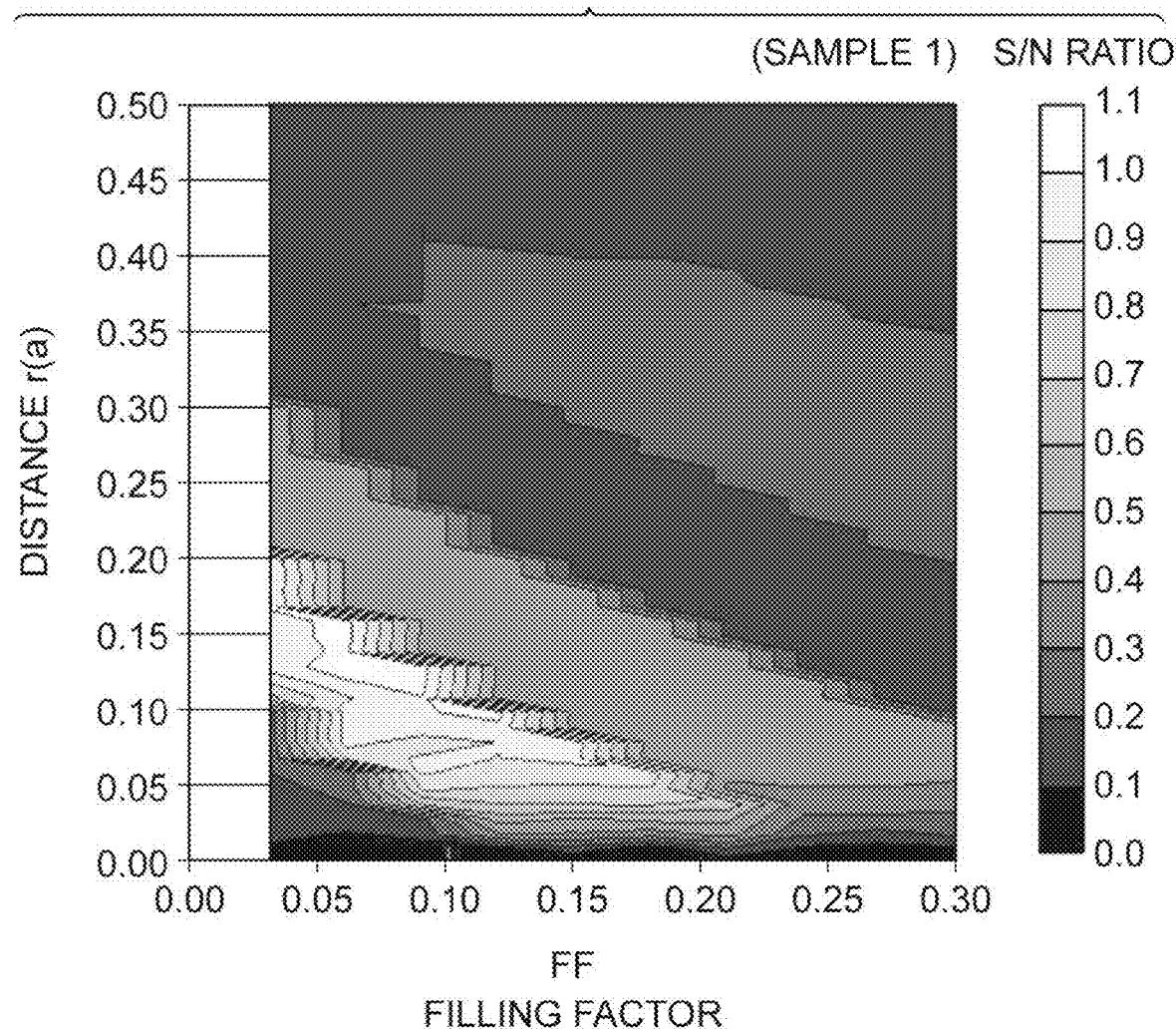
FIG. 11 is a graph indicating an S/N ratio of an output beam pattern according to a relationship between a filling factor and a distance r(a) in the first configuration of a phase modulation layer.

FIG. 11 is a graph indicating the S/N ratio of an output beam pattern according to the relationship between the filling factor FF and the distance r(a) in the first configuration (sample 1) of the phase modulation layer 15A, that is the intensity ratio of a desired beam pattern and noise. FIG. 12 is a graph indicating the relationship between the distance r(a) and the S/N ratio in the case of FIG. 11 (sample 1 of the first configuration). In the case of this structure, when the distance r is 0.3a or less, S/N is higher than the case of exceeding 0.3a, and when the distance r is 0.01a or more, S/N is higher than the case where the distance r is 0. In particular, referring to FIG. 12, a peak of the S/N ratio exists within these numerical ranges. That is, from the viewpoint of improving the S/N ratio, the distance r is preferably $0 \leq r \leq 0.3a$, more preferably $0.01a \leq r \leq 0.3a$, and still more preferably $0.03a \leq r \leq 0.25$. However, even when r is smaller than 0.01a, a beam pattern can be obtained although the S/N ratio is small.

Figure 13A:
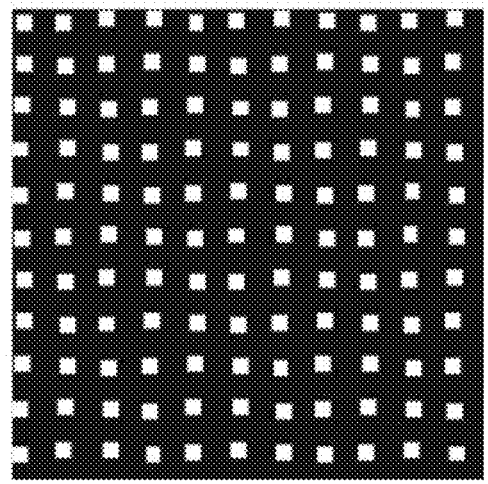
FIG. 13A is an image of a second configuration of a phase modulation layer for realizing the phase distribution illustrated in FIG. 9C.
Figure 13B:
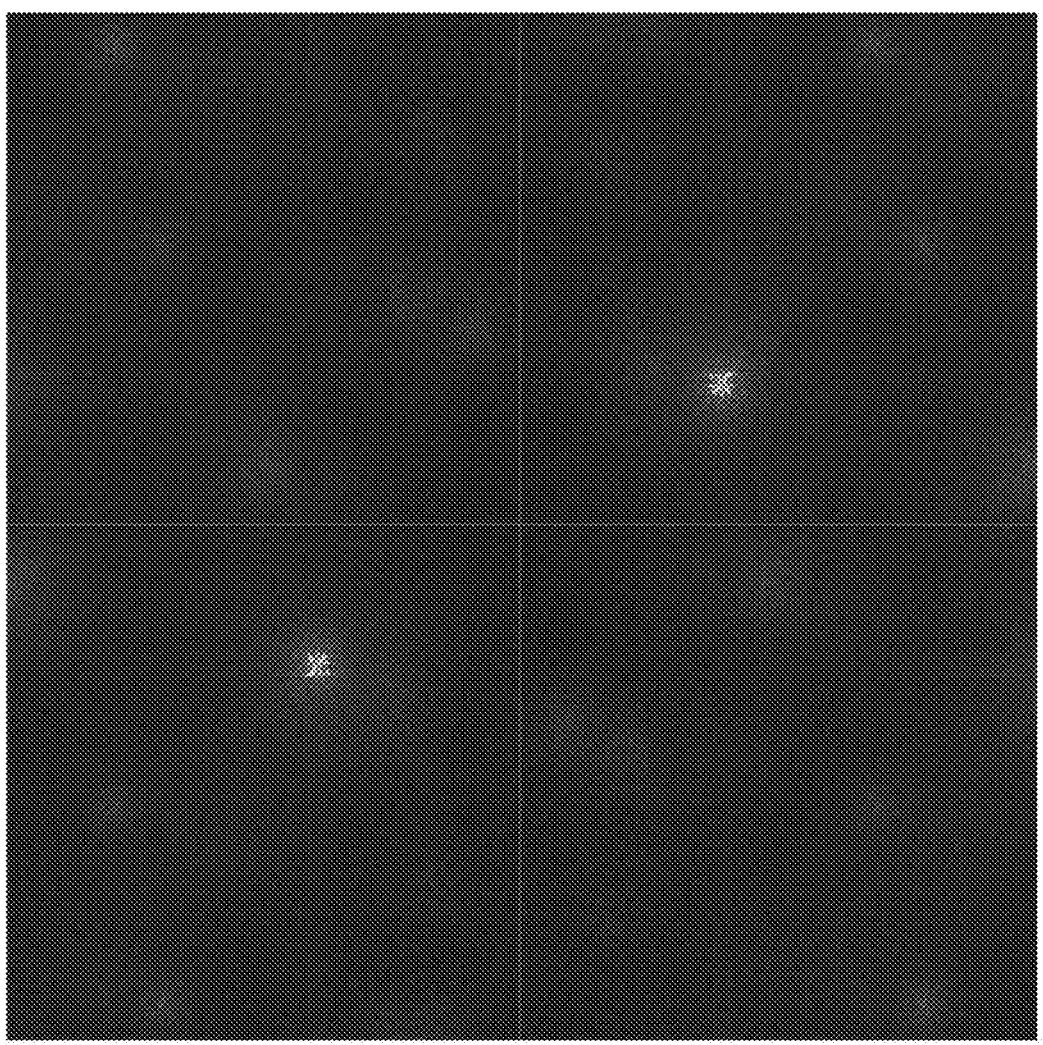
FIG. 13B is a predicted beam pattern obtained by Fourier transforming the entire modified refractive index regions.

FIG. 13A is an image (second configuration of the phase modulation layer 15A) indicating the arrangement of the modified refractive index region 15b for realizing the phase distribution illustrated in FIG. 9C, the basic layer 15a is illustrated in black, and the modified refractive index region 15b is illustrated in white. In this second configuration, the planar shape of the modified refractive index region 15b is a square, the number of the modified refractive index regions 15b, and the lattice spacing a of the square lattice are set to be the same as the first configuration. In FIG. 13A, the length L of one side of the modified refractive index region 15b is 98.4 nm, and the distance r between the lattice point O of the virtual square lattice and the center of gravity G1 of the modified refractive index region 15b is 8.52 nm. At this time, the filling factor FF of the modified refractive index region 15b is 12%, and the distance r is 0.03a. FIG. 13B is a predicted beam pattern obtained by Fourier transforming the entire modified refractive index region.

Figure 14:
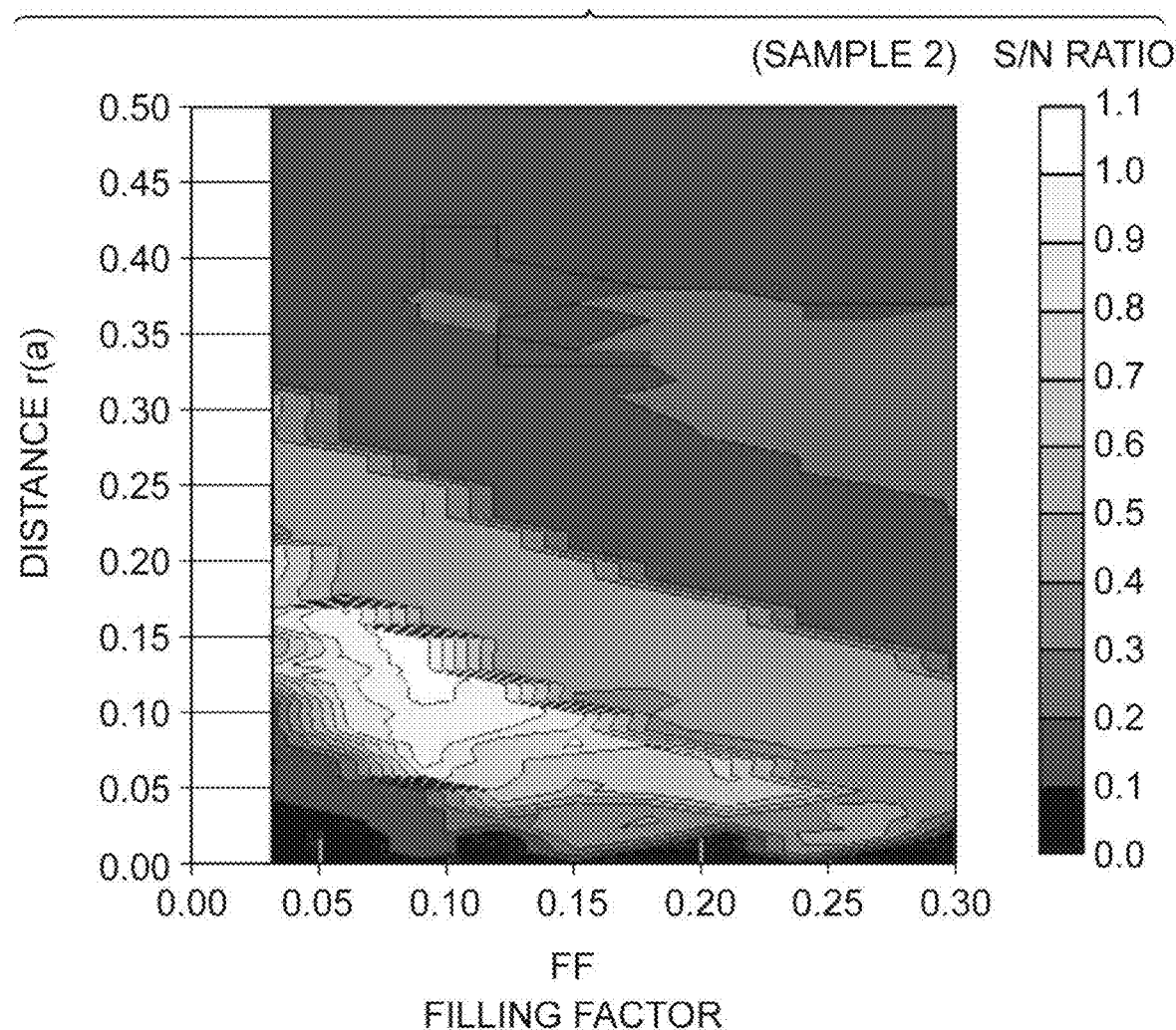
FIG. 14 is a graph indicating an S/N ratio of an output beam pattern according to a relationship between a filling factor and the distance r(a) in the second configuration of a phase modulation layer.

FIG. 14 is a graph indicating the S/N ratio of an output beam pattern according to the relationship between the filling factor FF and the distance r(a) in the second configuration (sample 2) of the phase modulation layer, that is the intensity ratio of a desired beam pattern and noise. FIG. 15 is a graph indicating the relationship between the distance r(a) and the S/N ratio in the case of FIG. 14 (sample 2 of the second configuration). Even in the case of this structure, when the distance r is 0.3a or less, S/N is higher than the case of exceeding 0.3a, and when the distance r is 0.01a or more, S/N is higher than the case where the distance r is 0. In particular, referring to FIG. 15, a peak of the S/N ratio exists within these numerical ranges. That is, from the viewpoint of improving the S/N ratio, the distance r is preferably $0<r\leq 0.3a$, more preferably $0.01a \leq r \leq 0.3a$, and still more preferably $0.03a \leq r \leq 0.25$. However, even when r is smaller than 0.01a, a beam pattern can be obtained although the S/N ratio is small.

Figure 16A:
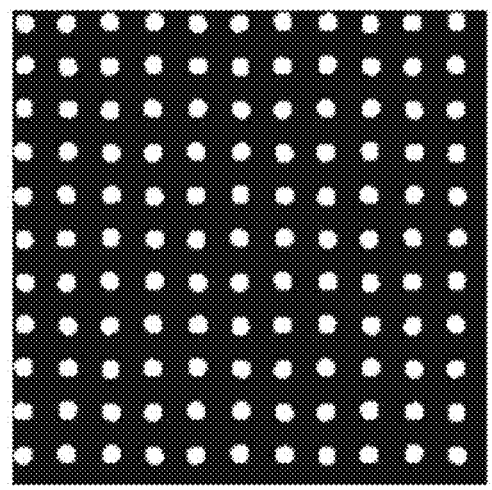
FIG. 16A is an image of a third configuration of a phase modulation layer for realizing the phase distribution illustrated in FIG. 9C.
Figure 16B:
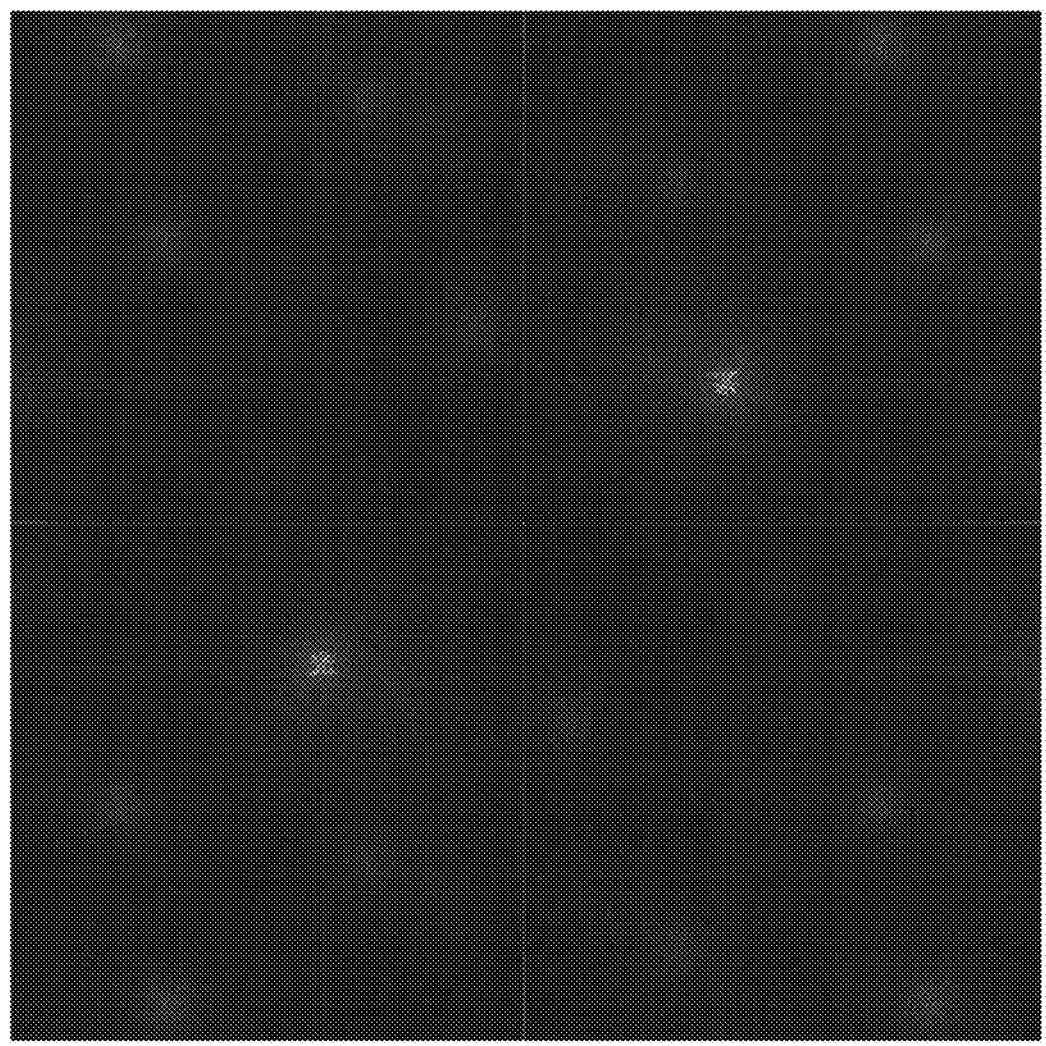
FIG. 16B is a predicted beam pattern obtained by Fourier transforming the entire modified refractive index regions.

FIG. 16A is an image (third configuration of the phase modulation layer 15A) indicating the arrangement of the modified refractive index region 15b for realizing the phase distribution illustrated in FIG. 9C, the basic layer 15a is illustrated in black, and the modified refractive index region 15b is illustrated in white. In the third configuration, the planar shape of the modified refractive index region 15b is a shape obtained by overlapping two true circles shifted from each other, and the center of gravity of one true circle is made to coincide with the lattice point O. The number of modified refractive index regions 15b and the lattice spacing a of the square lattice are set to be the same as in the first configuration. FIG. 10A illustrates the case where the diameters of the two perfect circles are both 111 nm and the distance r between the center of gravity of the other true circle and the lattice point O is 14.20 nm. At this time, the filling factor FF of the modified refractive index region 15b is 12%, and the distance r is 0.05a. FIG. 16B is a predicted beam pattern obtained by Fourier transforming the entire modified refractive index region.

Figure 17:
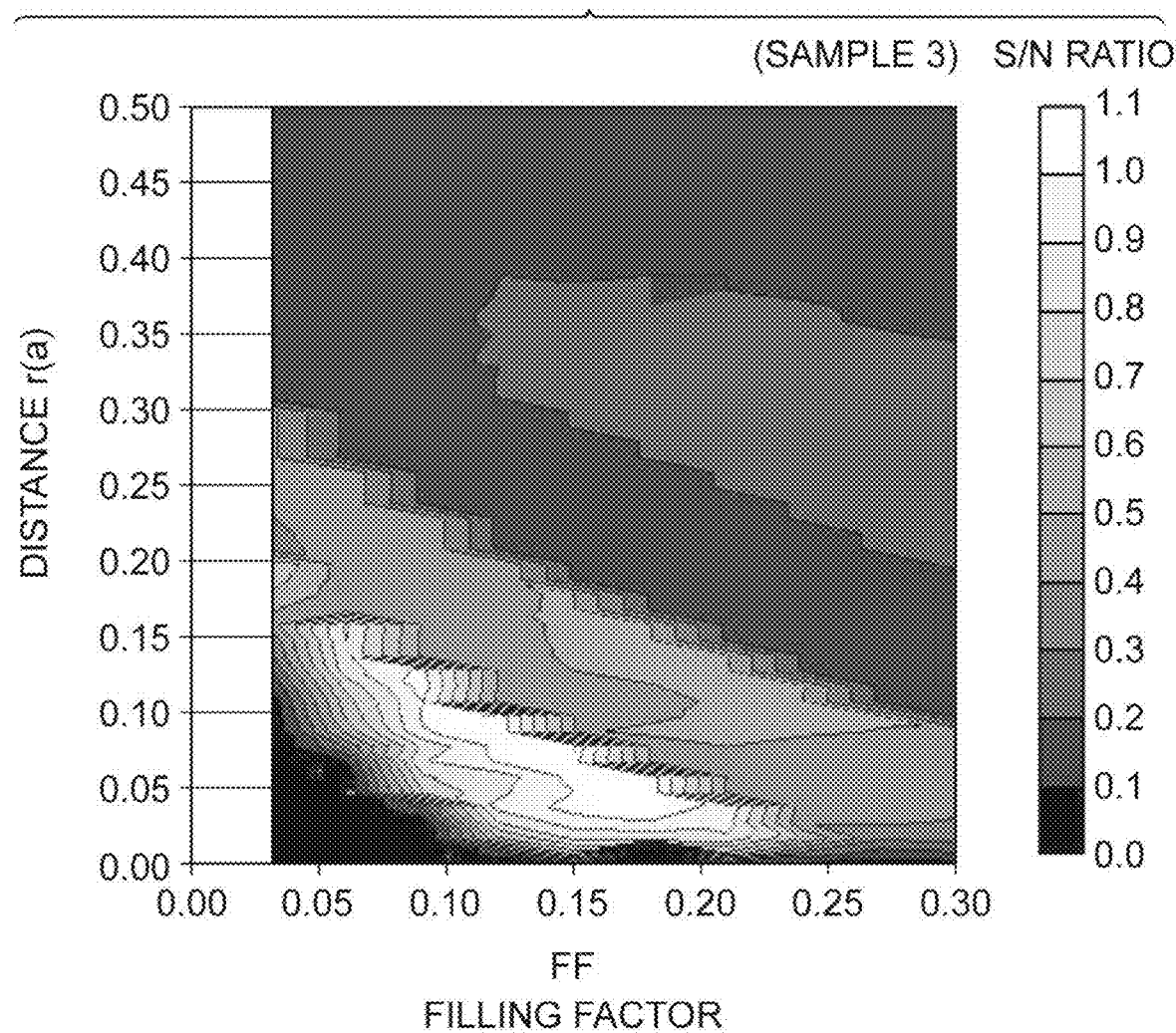
FIG. 17 is a graph indicating an S/N ratio of an output beam pattern according to a relationship between a filling factor and a distance r(a) in the third configuration of a phase modulation layer.

FIG. 17 is a graph indicating the S/N ratio of an output beam pattern according to the relationship between the filling factor FF and the distance r(a) in the third configuration (sample 3) of the phase modulation layer 15A, that is a graph indicating the intensity ratio of a desired beam pattern and noise. FIG. 18 is a graph indicating the relationship between the distance r(a) and the S/N ratio in the case of FIG. 17 (sample 3 of the third configuration). Even in the case of this structure, when the distance r is 0.3a or less, S/N is higher than the case of exceeding 0.3a, and when the distance r is 0.01a or more, S/N is higher than the case where the distance r is 0. In particular, referring to FIG. 18, a peak of the S/N ratio exists within these numerical ranges. That is, from the viewpoint of improving the S/N ratio, the distance r is preferably $0<r\leq 0.3a$, more preferably $0.01a \leq r \leq 0.3a$, and still more preferably $0.03a \leq r \leq 0.25$. However, even when r is smaller than 0.01a, a beam pattern can be obtained although the S/N ratio is small.

Note that in the case of FIG. 11 (sample 1), FIG. 14 (sample 2), and FIG. 17 (sample 3), the region where the S/N ratio exceeds 0.9, 0.6, 0.3 is given by the following function. FF 3, FF 6, FF 9, FF 12, FF 15, FF 18, FF 21, FF 24, FF 27, FF 30 in FIG. 12 (Sample 1), FIG. 15 (Sample 2), and FIG.

18 (Sample 3) are respectively FF=3%, FF=6%, FF=9%, FF=12%, FF=15%, FF=18%, FF=21%, FF=24%, FF=27%, FF=30%.

(S/N is 0.9 or more in FIG. 11.)

$FF>0.03$, $r>0.06$, $r<-FF+0.23$, and $r>-FF+0.13$ (S/N is 0.6 or more in FIG. 11.)

$FF>0.03$, $r>0.03$, $r<-FF+0.25$, and $r>-FF+0.12$ (S/N is 0.3 or more in FIG. 11.)

$FF>0.03$, $r>0.02$, $r<-(2/3)FF+0.30$, and $r>-(2/3)FF+0.083$ (S/N is 0.9 or more in FIG. 14.)

$r>-2FF+0.25$, $r<-FF+0.25$, and $r>FF-0.05$ (S/N is 0.6 or more in FIG. 14.)

$FF>0.03$, $r>0.04$, $r<-(3/4)FF+0.2375$, and $r>-FF+0.15$ (S/N is 0.3 or more in FIG. 14.)

$FF>0.03$, $r>0.01$, $r<-(2/3)FF+1/3$, and $r>-(2/3)FF+0.10$ (S/N is 0.9 or more in FIG. 17.)

$r>0.025$, $r>-(4/3)FF+0.20$, and $r<-(20/27)FF+0.20$ (S/N is 0.6 or more in FIG. 17)

$FF>0.03$, $r>0.02$, $r>-(5/4)FF+0.1625$, and $r<-(13/18)FF+0.222$ (S/N is 0.3 or more in FIG. 17.)

$FF>0.03$, $r>0.01$, $r<-(2/3)FF+0.30$, and $r>-(10/7)FF+1/7$

In the structure described above, the material system, the film thickness, and the layer configuration can be variously changed as long as it includes the active layer 12 and the phase modulation layer 15A. Here, for the so-called square lattice photonic crystal laser in which the perturbation from the virtual square lattice is 0, the scaling rule holds. That is, when the wavelength becomes a constant α times, the same standing wave state can be obtained by multiplying the entire square lattice structure by α. Similarly, also in this embodiment, it is possible to determine the structure of the phase modulation layer 15A according to the scaling rule corresponding to the wavelength. Therefore, it is also possible to realize a laser element 2A that outputs visible light by using the active layer 12 that emits light such as blue, green, and red, and by applying a scaling rule according to the wavelength.

In manufacturing the laser element 2A, each compound semiconductor layer is obtained by a metal organic chemical vapor deposition (MOCVD) method. A crystal growth is performed on a surface (001) of the semiconductor substrate 10, but it is not limited thereto. When the laser element 2A, in which AlGaN is used, is manufactured, a growth temperature of AlGaAs is 500° C. to 850° C., and the temperature has been set to 550 to 700° C. in the experiment. The following materials are used during growth: trimethylaluminum (TMA) as an Al material, trimethylgallium (TMG) and triethylgallium (TEG) as a gallium material, arsine ($AsH_3$) as an As material, disilane ($Si_2H_6$) as a material for N-type impurities, and diethyl zinc (DEZn) as a material for a P-type impurities. TMG and arsine are used for growth of GaAs, but TMA is not used. InGaAs is manufactured by using TMG, trimethylindium (TMI), and arsine. The insulating film may be formed by sputtering a target with the constituent material as a raw material.

That is, in the laser element 2A described above, an AlGaAs layer as the n-type cladding layer 11, an InGaAs/AlGaAs multiple quantum well structure as the active layer 12, a GaAs layer as the basic layer 15a of the phase modulation layer 15A is epitaxially grown one by one using the MOCVD (metal organic chemical vapor deposition) method on a GaAs substrate as an N-type semiconductor substrate 10. Next, in order to perform alignment after epitaxial growth, a SiN layer is formed on the basic layer 15a by a PCVD (plasma CVD) method, and then a resist is formed on the SiN layer. Further, the resist is exposed and developed, the SiN layer is etched using the resist as a mask, and an alignment mark is formed in a state where a part of the SiN layer is left. Remaining resist is removed.

Next, another resist is applied to the basic layer 15a, and a two-dimensional fine pattern is drawn on the resist with an electron beam drawing apparatus with reference to the alignment mark. A two-dimensional fine pattern is formed on the resist by developing the resist after drawing. Thereafter, using the resist as a mask, the two-dimensional fine pattern is transferred onto the basic layer 15a by dry etching, and the resist is removed after the formation of holes. The depth of the hole is, for example, 100 nm. These holes are used as the modified refractive index regions 15b. Alternatively, in these holes, compound semiconductors (AlGaAs) to be the modified refractive index regions 15b are regrown to more than the depth of the holes. When the hole is the modified refractive index region 15b, a gas such as air, nitrogen, or argon may be sealed in the hole. Next, an AlGaAs layer as the cladding layer 13 and a GaAs layer as the contact layer 14 are sequentially formed by MOCVD, and electrodes 16 and 17 are formed by a vapor deposition method or a sputtering method. Further, as necessary, the protective film 18 and the antireflection film 19 are formed by sputtering or the like.

In the case where the phase modulation layer 15A is provided between the active layer 12 and the cladding layer 11, the phase modulation layer 15A may be formed on the cladding layer 11 before the formation of the active layer 12. The lattice spacing a of the virtual square lattice is a degree obtained by dividing a wavelength by an equivalent refractive index and is set to about 300 nm, for example.

In the case of a square lattice of a lattice interval a, when unit vectors of an orthogonal coordinate are assumed to be x and y, basic parallel vectors are assumed to be $a_1=ax$, $a_2=ay$. A basic reciprocal lattice vectors with respect to the parallel vectors $a_1$, $a_2$ are assumed to be $b_1=(2\pi/a)y$, $b_2=(2\pi/a)x$. When the wave number vector of the wave existing in the lattice is $k=nb_1+mb_2$ (n, m is an arbitrary integer), the wave number k exists at a F point. In particular, when the size of a wave number vector is equal to the size of a basic reciprocal lattice vector, a resonance mode (standing wave in the X-Y plane) where the lattice spacing a is equal to the wavelength A, is obtained. In the present embodiment, oscillation in such a resonance mode (standing wave state) is obtained. Considering a TE mode in which an electric field is present in a plane parallel to the square lattice, there are four modes due to the symmetry of the square lattice in the standing wave state in which the lattice spacing and the wavelength are equal as described above. In the present embodiment, a desired beam pattern can be similarly obtained in oscillation in any mode of in these four standing wave states.

Note that the standing wave in the phase modulation layer 15A is scattered by the hole shape and the wavefront obtained in a vertical direction to the wavefront is phase-modulated, whereby a desired beam pattern can be obtained. Therefore, a desired beam pattern can be obtained even without a polarizing plate. This beam pattern is not only a pair of single peak beams (spots) but also can be a vector beam of a character shape or two or more identical shape spot groups or a vector beam in which the phase and the intensity distribution are spatially uneven.

A refractive index of the basic layer 15a is preferably 3.0 to 3.5. A refractive index of the modified refractive index region 15b is preferably 1.0 to 3.4. The average diameter of each modified refractive index region 15b in the hole of the basic layer 15a is, for example, 38 nm to 76 nm. As the size of this hole changes, the diffraction intensity in the Z axis direction changes. This diffraction efficiency is proportional to the optical coupling coefficient κ1 represented by the first order coefficient when the shape of the modified refractive index region 15b is Fourier transformed. The optical coupling coefficient is described in, for example, K. Sakai et al., "Coupled-Wave Theory for Square-Lattice Photonic Crystal Lasers With TE Polarization, IEEE J. Q. E. 46, 788-795 (2010)".

Subsequently, the light shielding member 3 illustrated in FIG. 1 will be described in detail. The light shielding member 3 is, for example, supported by a housing that houses the laser element 2A, or is a plate-shaped member that constitutes a part of the housing. Alternatively, the light shielding member 3 may be formed directly on the laser element 2A. The light shielding member 3 is disposed such that part of the light shielding member 3 crosses an axis orthogonal to the center of gravity of the light emitting surface 2b of the laser element 2A, that is, the Z axis illustrated in FIG. 1. One plate surface of the light shielding member 3 faces the light emitting surface 2b of the laser element 2A. More specifically, this axis passes through the center of the light emitting surface 2b (the position of the center of gravity of the rectangular light emitting surface 2b), that is, the center of the opening 17a. From the laser element 2A, zero order light is output along this axis, that is, along the normal direction of the light emitting surface 2b.

Figure 19A:
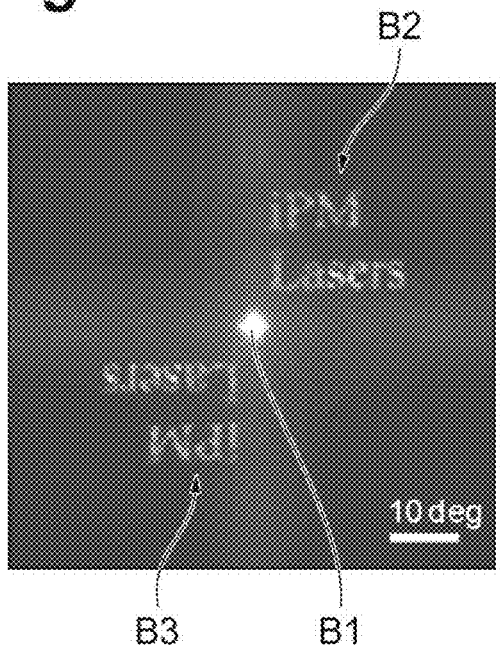
FIGS. 19A to 19C indicate examples of beam patterns (optical images) output from a laser element.
Figure 19B:
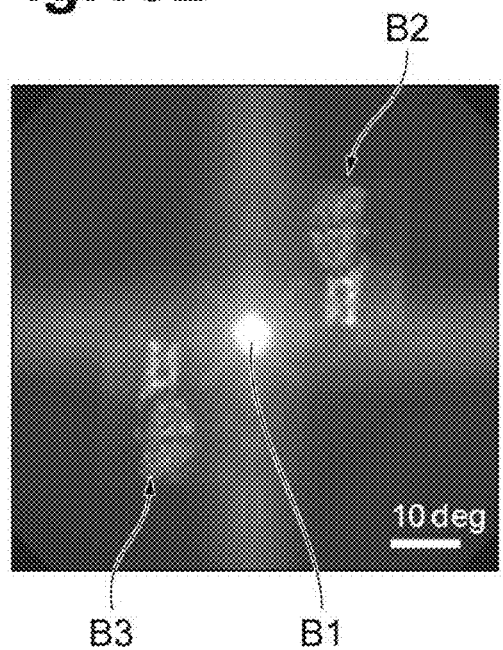
Figure 19C:
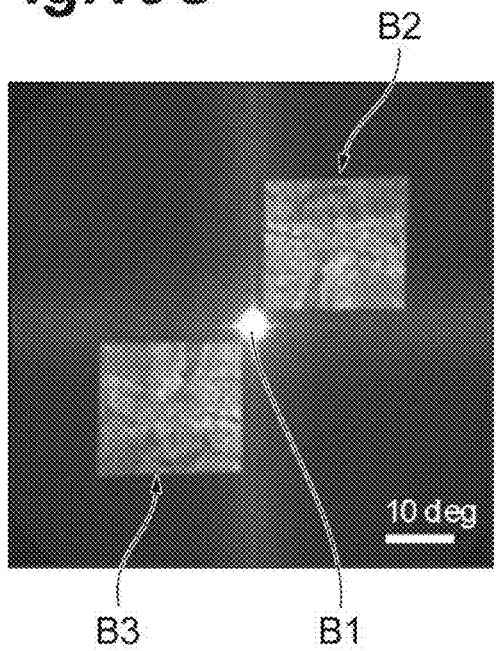

FIGS. 19A to 19C are examples of beam patterns (optical images) output from the laser element 2A. The center of each of FIGS. 19A to 19C corresponds to the axis orthogonal to the light emitting surface 2b of the laser element 2A. As illustrated in FIGS. 19A to 19C, the optical image output from the light emitting surface 2b includes zero order light B1 appearing as a bright spot on the axis and a first optical image portion B2 output in a first direction inclined to the axis, and a second optical image portion B3 which is output in a second direction symmetrical to the axis and which is rotationally symmetrical to the first optical image portion B2 with respect to the axis. Typically, the first optical image portion B2 is output in the first quadrant in the X-Y plane, and the second optical image portion B3 is output in the third quadrant in the X-Y plane.

The light shielding member 3 of the present embodiment is disposed so as to pass through a desired optical image (for example, the first optical image portion B2) out of such optical images and at least shield the zero order light B1 appearing as a bright spot. More preferably, the light shielding member 3 further shields the second optical image portion B3 which is not the desired optical image. The light shielding member 3 may absorb the zero order light and the second optical image portion B3 by including a light absorbing material on at least a surface on the laser element 2A side. In addition, the light shielding member 3 may transmit light of another wavelength light as long as emission wavelength light of the laser element 2A is shielded. Examples of a constituent material of the light shielding member 3 include a metal thin film such as Au, Ti, Cr, and Al. Examples of a light absorbing material include a cyanine dye, a phthalocyanine compound, a naphthalocyanine compound, a nickel dithiolene complex, a squarylium dye, a quinone compound, a diimmonium compound, an azo compound, lanthanum hexaboride, cesium tungsten oxide, ITO, and antimony oxide Tin.

Here, a preferable distance between the light shielding member 3 and the light emitting surface 2b in the Z axis direction and a preferable position of the light shielding member 3 in the X-Y plane will be examined in detail. As a preferable range of the light shielding member 3, a range of a so-called far field pattern (Fraunhofer diffraction area) is conceivable. However, the range of the Fraunhofer diffraction region in the Z axis direction is obtained as $z>L^2/\lambda$, where L is the maximum width of the opening 17a, and λ is the wavelength (Eugene Hecto, "Hect Optics II" page 244). Assuming that the width L of the opening 17a is 400 μm, and the wavelength λ is 940 nm, z>170 mm. Further, when the width L is 200 μm, and λ is 940 nm, z>42 mm. In any case, the far-field pattern is located at a distance of several centimeters or more from the light emitting surface 2b, and it may be difficult to dispose the light shielding member 3 at such a distant position on the laser element 2A having a side length of less than 1 mm. Therefore, the present inventor has studied to provide the light shielding member 3 at a position closer to the light emitting surface 2b.

Figure 20:
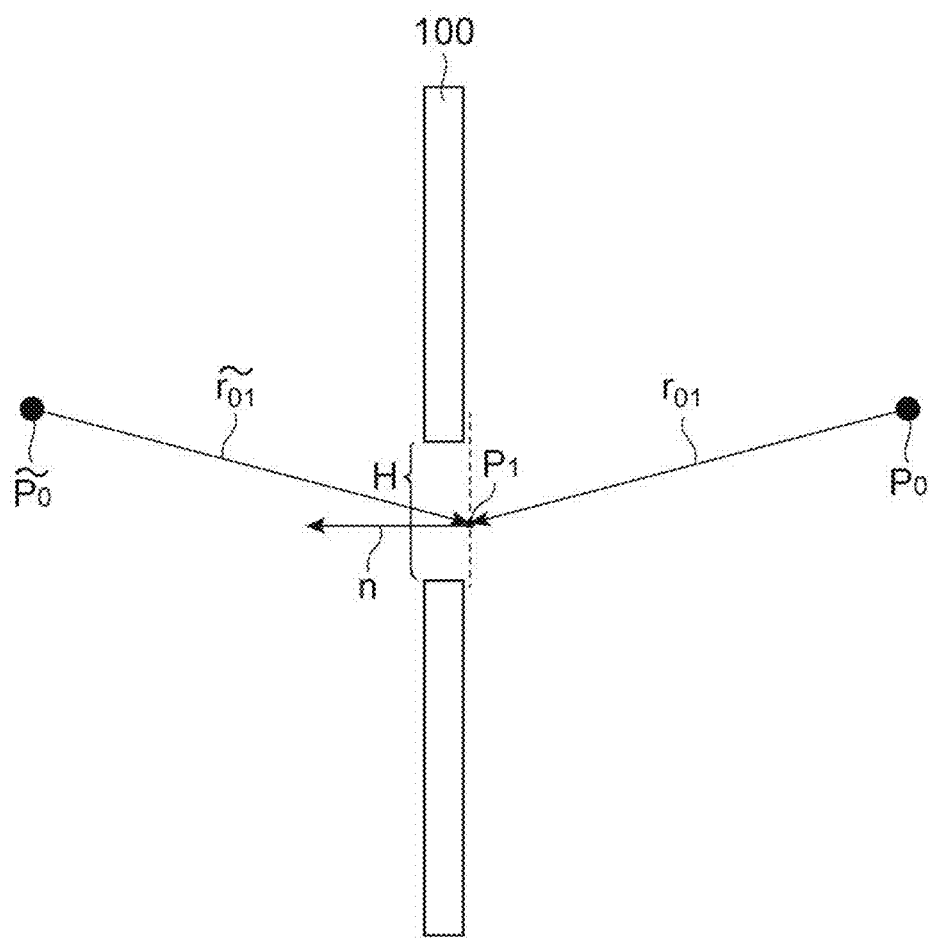
FIG. 20 is a view indicating conditions to be used for diffraction calculation.

Approximations are used in the so-called Fresnel diffraction image and Fraunhofer diffraction image calculation formulas, and the range of applicable distance is each limited. Therefore, as will be described below, the present inventor has calculated a diffraction image at the distance z from the light emitting surface 2b without approximation (the following formula (13)). The conditions used for the diffraction calculation have been set as indicated in FIG. 20. That is, how the light generated from the portion of the phase modulation layer 15A where light emission is obtained, that is, the portion corresponding to the electrode 16 in the phase modulation layer 15A diffracts is calculated. In the example of FIG. 20, the opening H of the mask 100 corresponds to the portion corresponding to the electrode 16 in the phase modulation layer 15A. Hereinafter, a width of the opening H is referred to as an opening size (electrode size). In addition, the first Rayleigh-Sommerfeld solution (Joseph W. Goodman "Fourier Optics" section 3.5) of Huygens-Fresnel principle has been used in the calculation of a diffraction image. In order to reproduce the zero order light, a constant value has been superimposed on the entire complex amplitude distribution on the light emitting surface 2b.

$$U(P_0) = \frac{1}{j\lambda} \int\int_\Sigma U(P_1) \frac{\exp(jkr_{01})}{r_{01}} \cos\theta \, ds \quad (13)$$

In the above formula (13), U(P) represents a complex amplitude at a certain position P, $P_0$ represents a position of an observation point at which a diffraction image is obtained, $P_1$ represents a position of the opening H (that is, a portion of the phase modulation layer 15A corresponding to the electrode 16), λ represents the wavelength of a plane wave, Σ represents the area of an opening, k represents a wavenumber, $r_{01}$ represents a distance between a point on a surface of the opening and a point on a diffracted image (that is, the length of a vector $r_{01}$). Here, the vector n represents a unit vector perpendicular to the opening H. Note that $P_0$ with a tilde "~" in FIG. 20 is a point set for convenience of calculation, it is at a symmetrical position on the opposite side to $P_0$ and $P_1$, and its phase is 180° different from $P_0$.

Figure 21A:
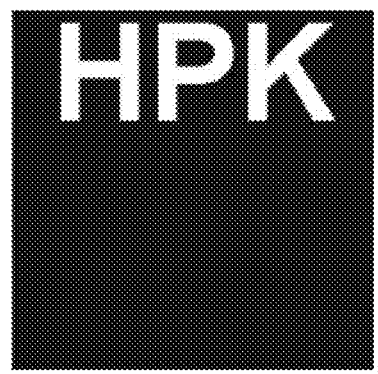
FIG. 21A is a diagram indicating a target image used for diffraction calculation.
Figure 21B:
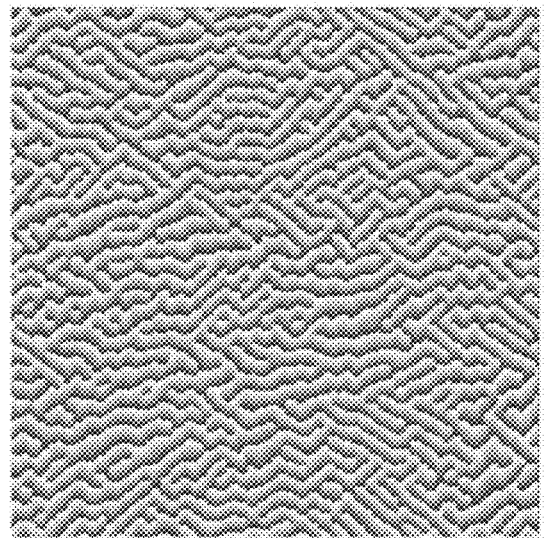
FIGS. 21B and 21C are views illustrating phase distribution in a phase modulation layer in the case of the lattice spacing a=282 nm and 141 nm, with shade of color.
Figure 21C:
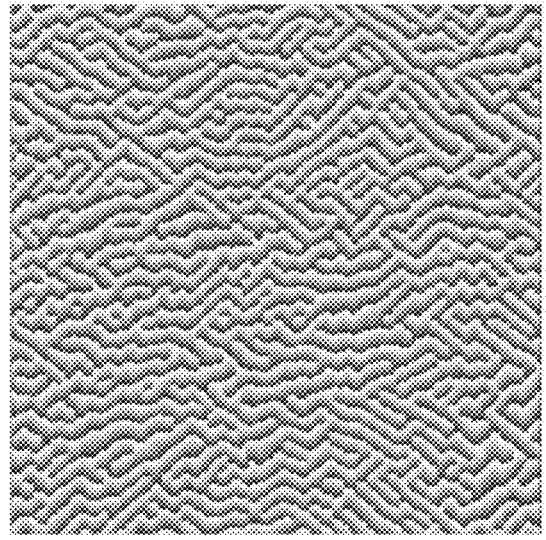

FIG. 21A is a view of a target image used for the above diffraction calculation. Further, FIGS. 21B and 21C are views illustrating a phase distribution in the phase modulation layer 15A in the case of the lattice spacing a=282 nm, 141 nm, with shade of color. Since the number of elements of a target image is 256×256, the number of elements of a phase distribution in the phase modulation layer 15A is also 256×256 in both FIGS. 21B and 21C. However, when the lattice spacing a is 282 nm, the opening size (electrode size) is 72.2 μm on one side, and when the lattice spacing a is 141 nm, the opening size (electrode size) is 36.1 μm on one side, reflecting the difference in lattice spacing.

Figure 22:
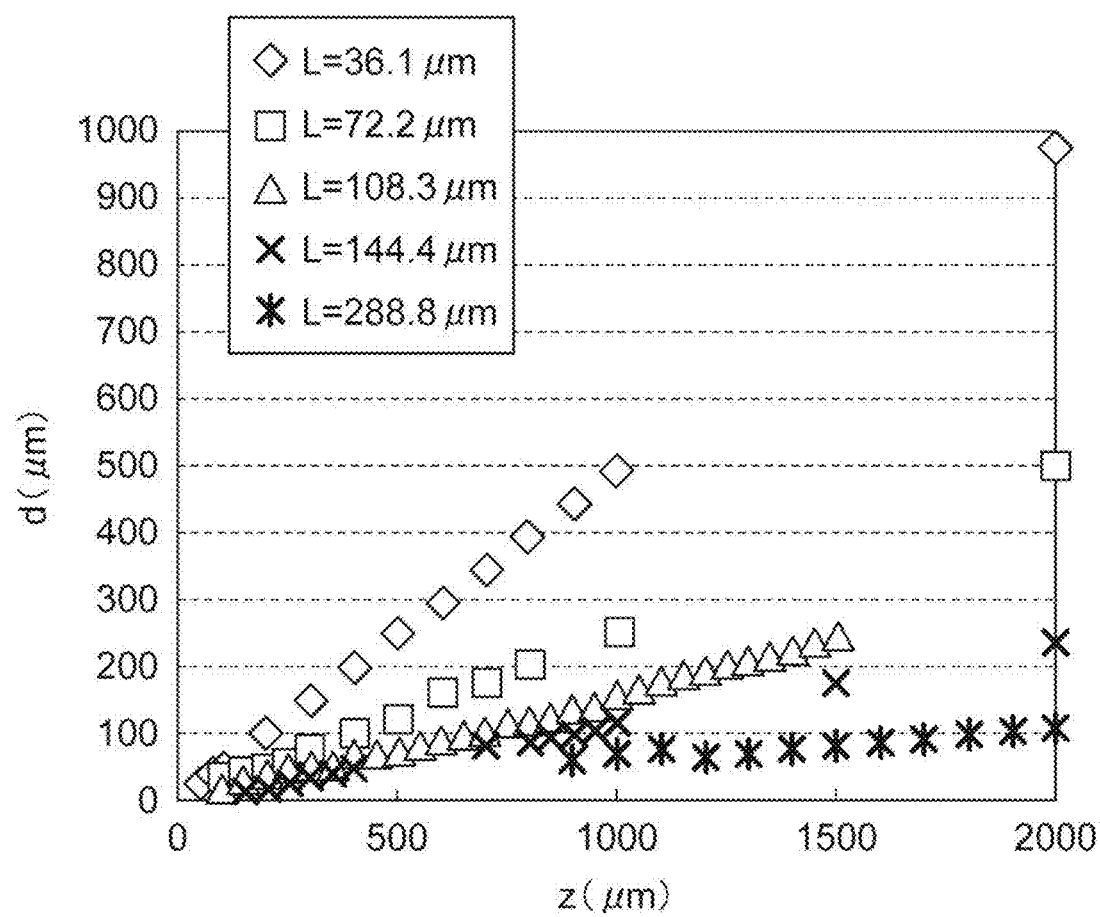
FIG. 22 is a graph indicating calculation results and indicates correlation between a distance d and a distance z in the case where a distance between one end on the Z axis on a diffraction image plane and the Z axis is denoted by d (μm), and a distance between the diffraction image surface and a light emitting surface 2b is denoted by z (μm).
Figure 23:
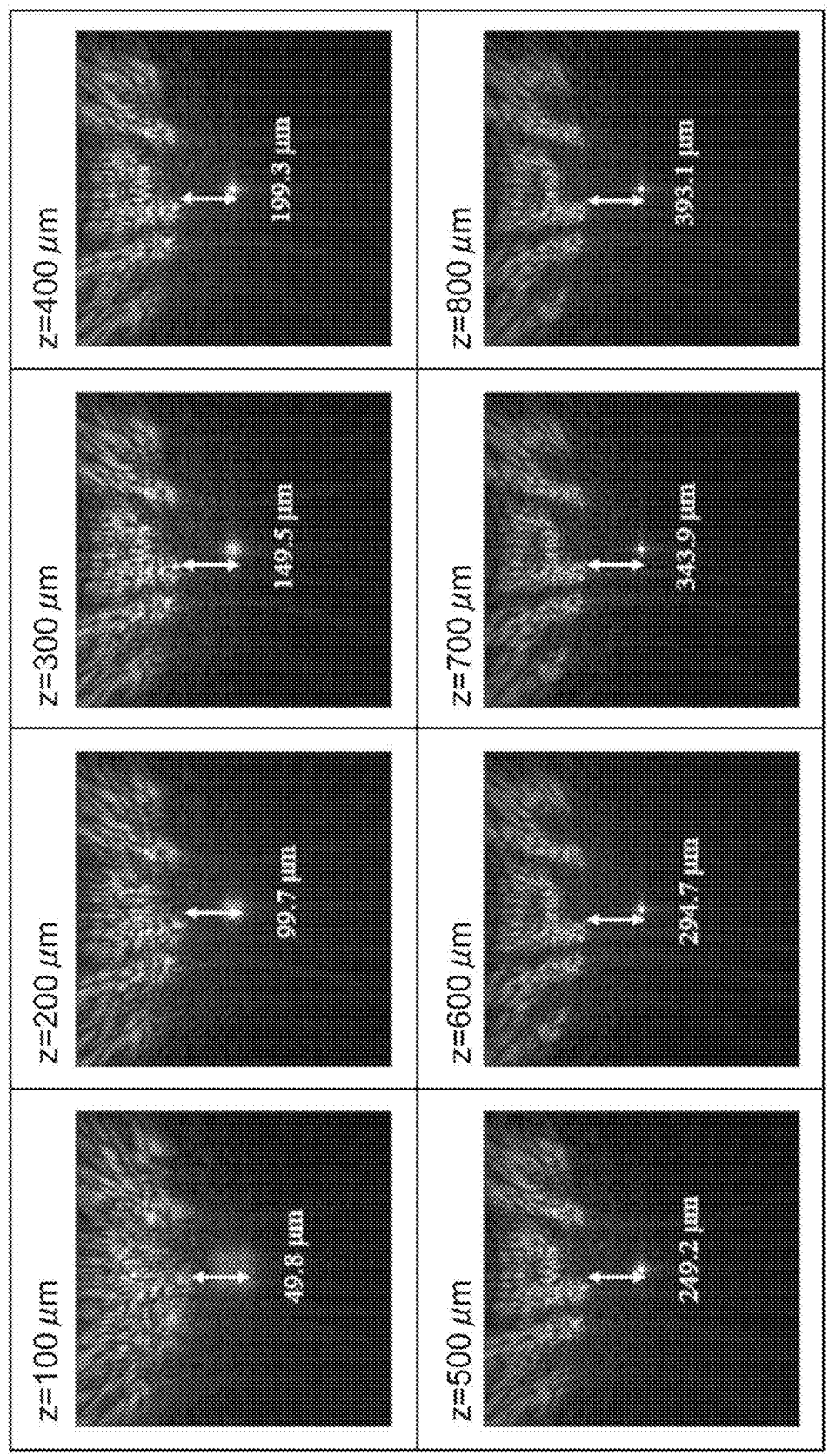
FIG. 23 illustrates a part of the diffraction image that is the basis of the graph of FIG. 22.
Figure 24:
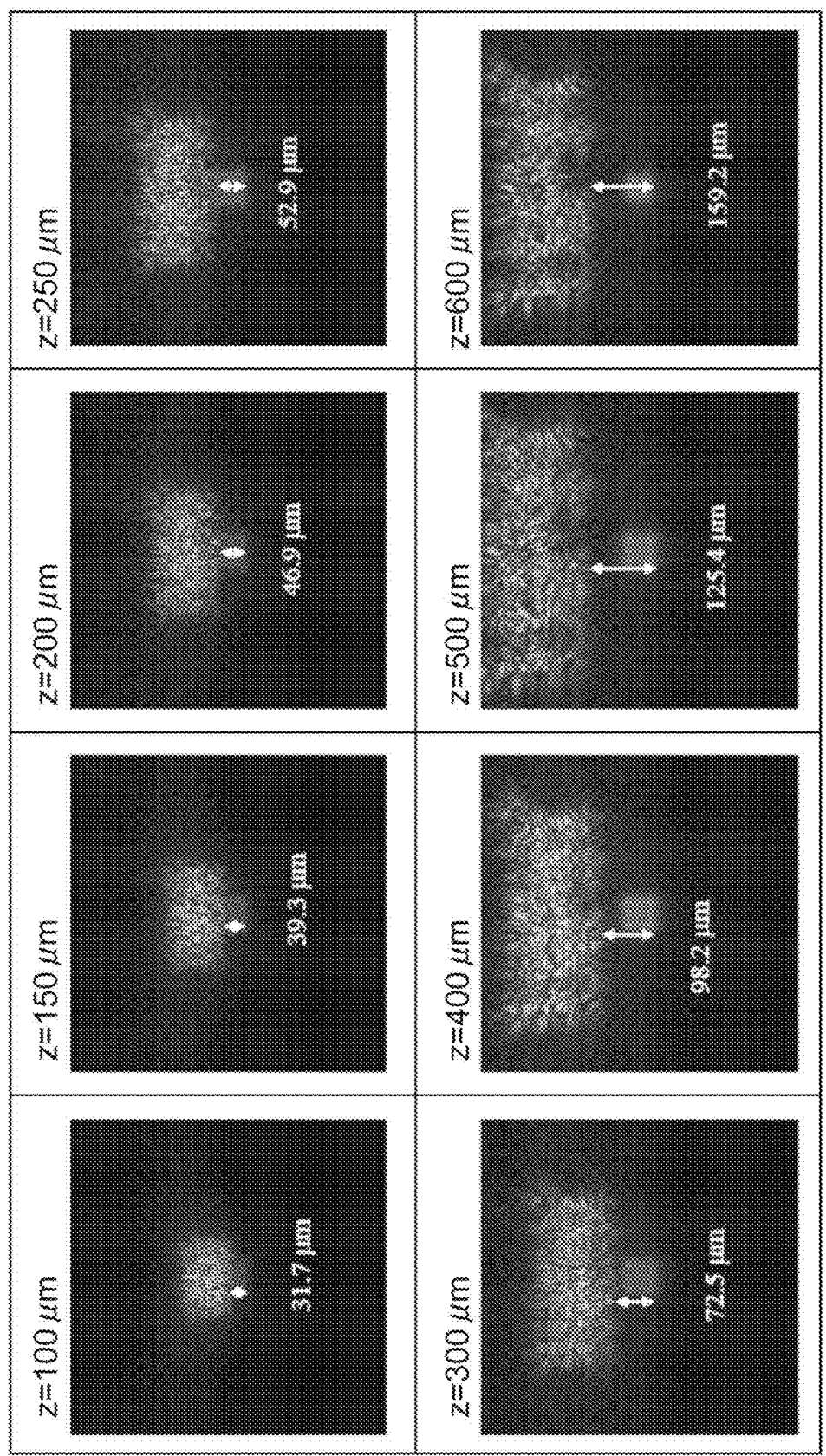
FIG. 24 illustrates a part of the diffraction image that is the basis of the graph of FIG. 22.
Figure 25:
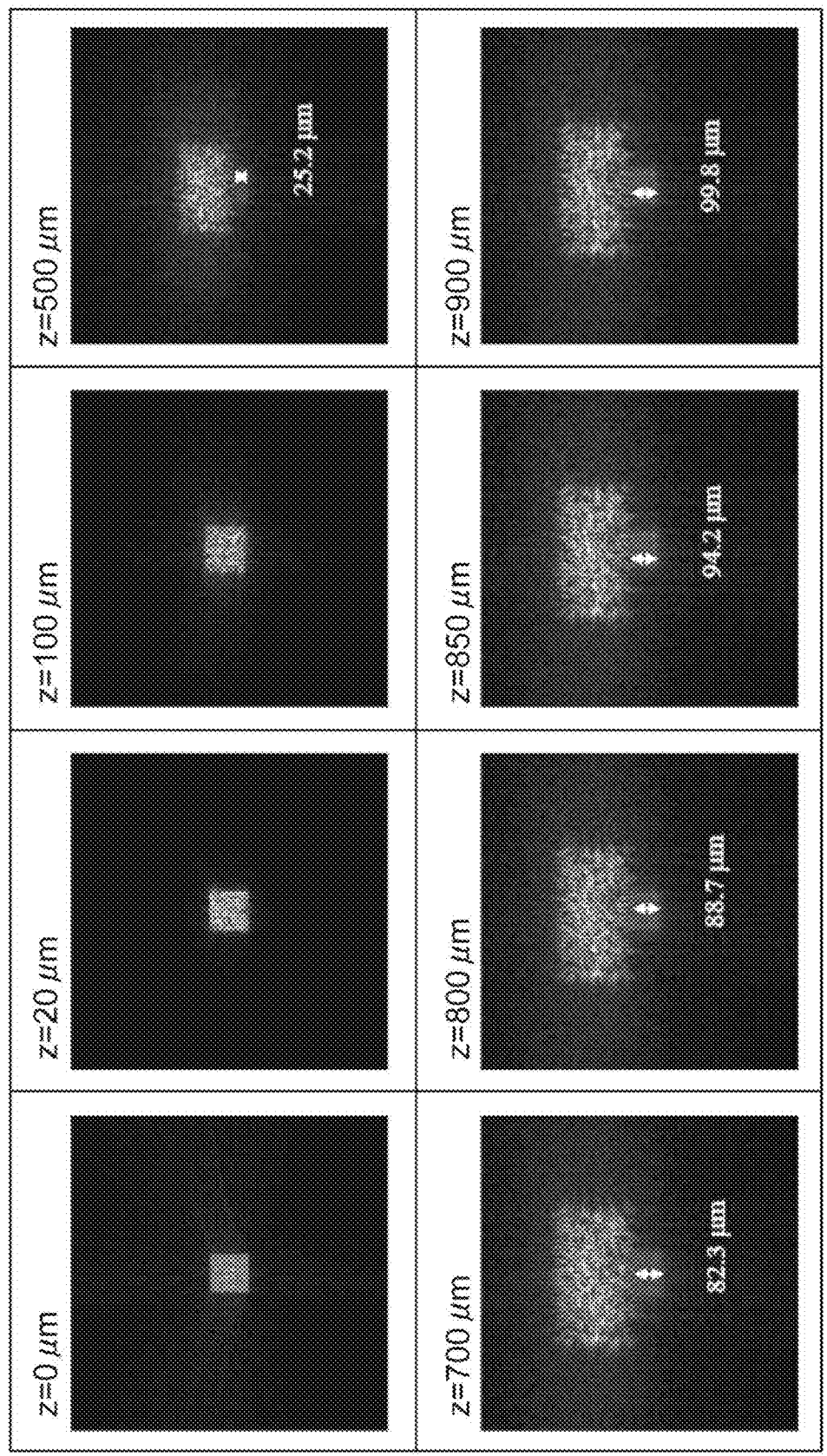
FIG. 25 illustrates a part of the diffraction image that is the basis of the graph of FIG. 22.
Figure 26:
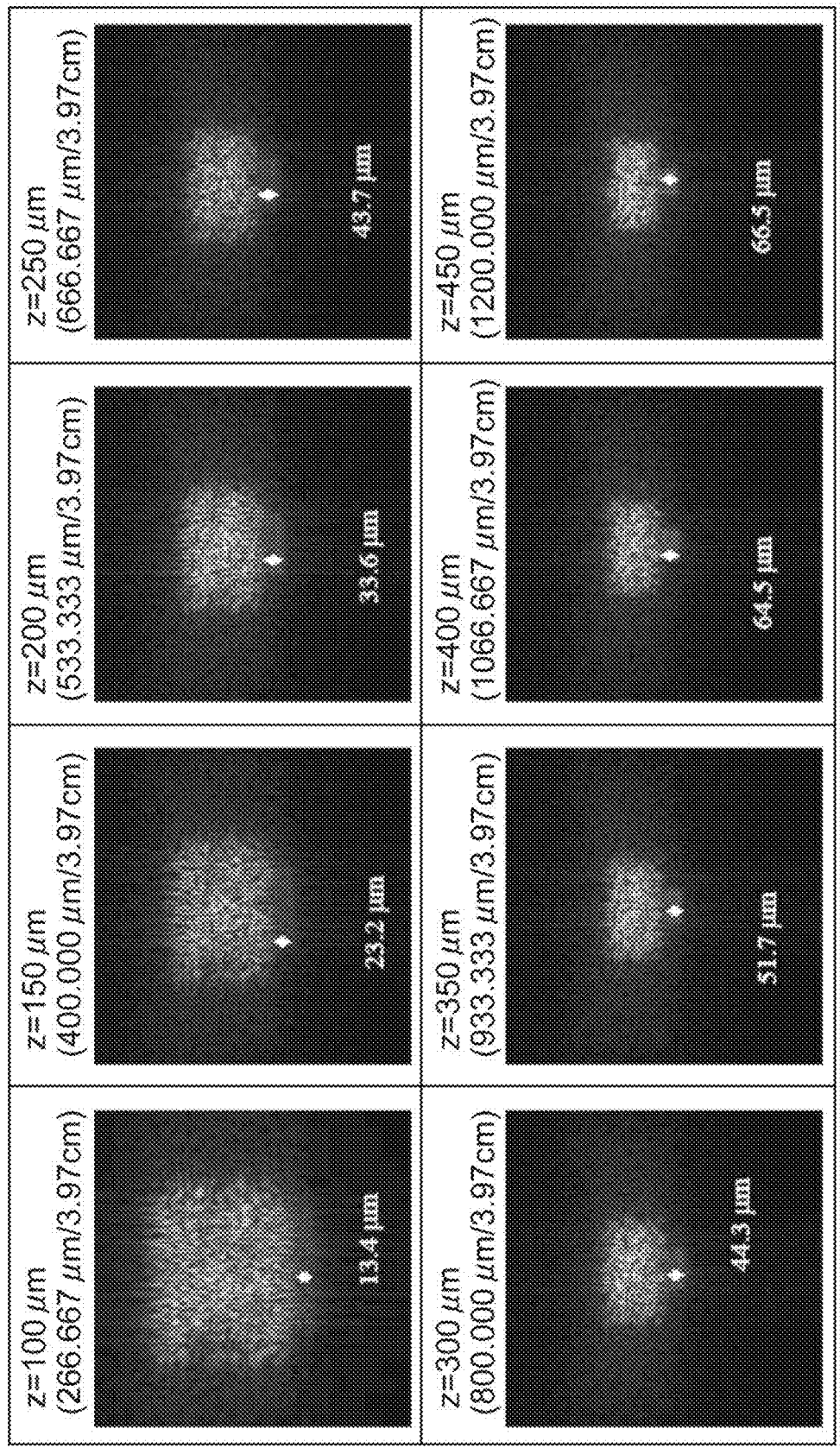
FIG. 26 illustrates a part of the diffraction image that is the basis of the graph of FIG. 22.
Figure 27:
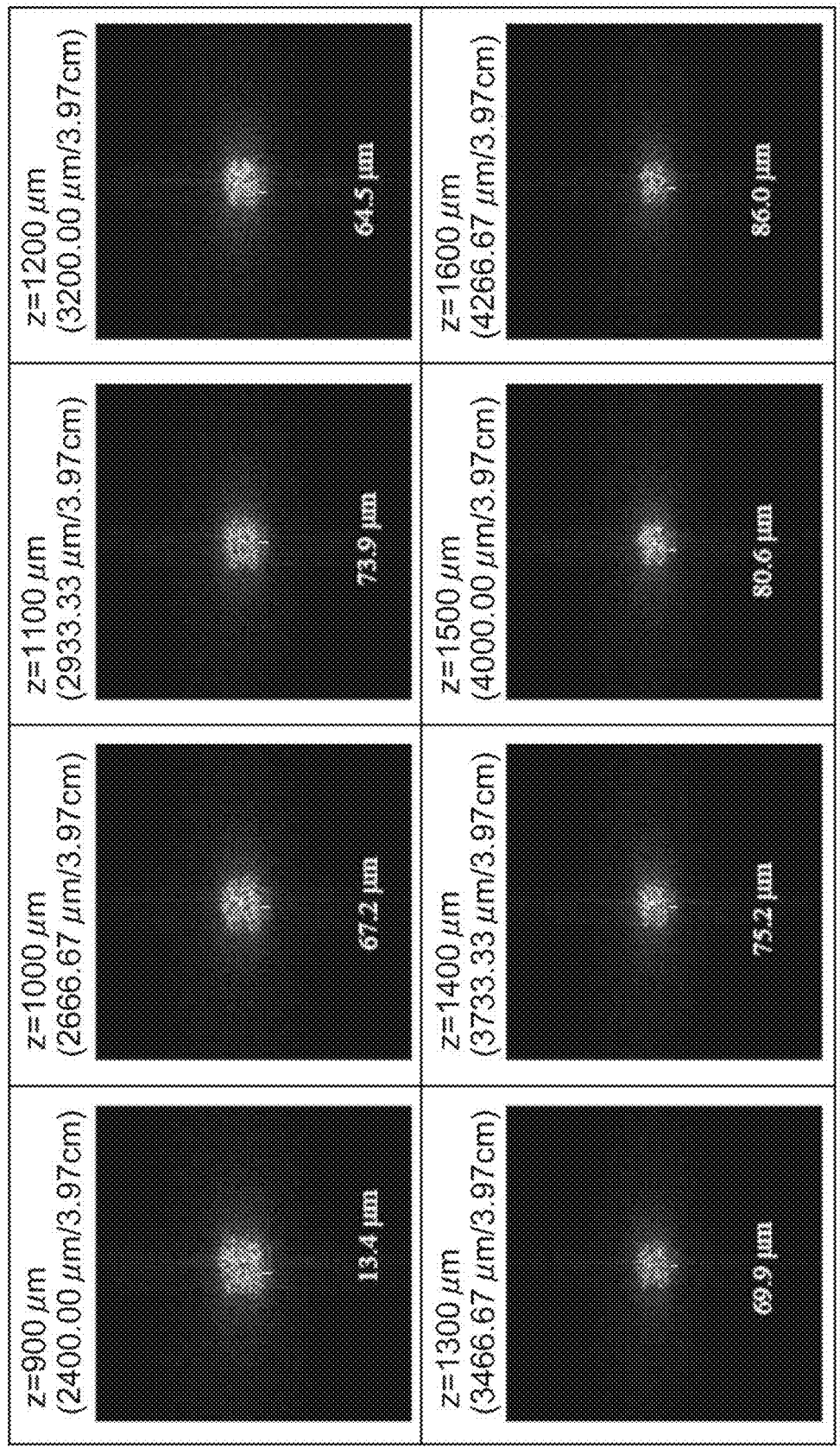
FIG. 27 illustrates a part of the diffraction image that is the basis of the graph of FIG. 22.

FIG. 22 is a graph indicating the above-described calculation result and indicates correlation between a distance d and a distance z in the case where a distance between one end on the Z axis side of the diffraction image on a diffraction image surface and the Z axis is denoted by d (μm), and a distance between the diffraction image surface and the light emitting surface 2b is denoted by z (μm). FIGS. 23 to 27 illustrate a part of the diffraction image which is the basis of this graph. FIG. 23 illustrates the case where the number of elements of the phase distribution is 128×128, the lattice spacing a=282 nm, one side of the opening size (electrode size) is 36.1 μm, and the wavelength λ=940 nm. FIG. 24 illustrates the case where the number of elements of the phase distribution is 256×256, the lattice spacing a=282 nm, one side of the opening size (electrode size) is 72.2 and the wavelength λ=940 nm. FIG. 25 illustrates the case where the number of elements of the phase distribution is 512×512, the lattice spacing a=282 nm, one side of the opening size (electrode size) is 144.4 μm, and the wavelength λ=940 nm. FIG. 26 illustrates the case where the number of elements of the phase distribution is 384×384, the lattice spacing a=282 nm, one side of the opening size (electrode size) is 108.3 μm, and the wavelength λ=940 nm. FIG. 27 illustrates the case where the number of elements of the phase distribution is 1024×1024, the lattice spacing a=282 nm, one side of the opening size (electrode size) is 288.8 μm, and the wavelength λ=940 nm.

Figure 28:
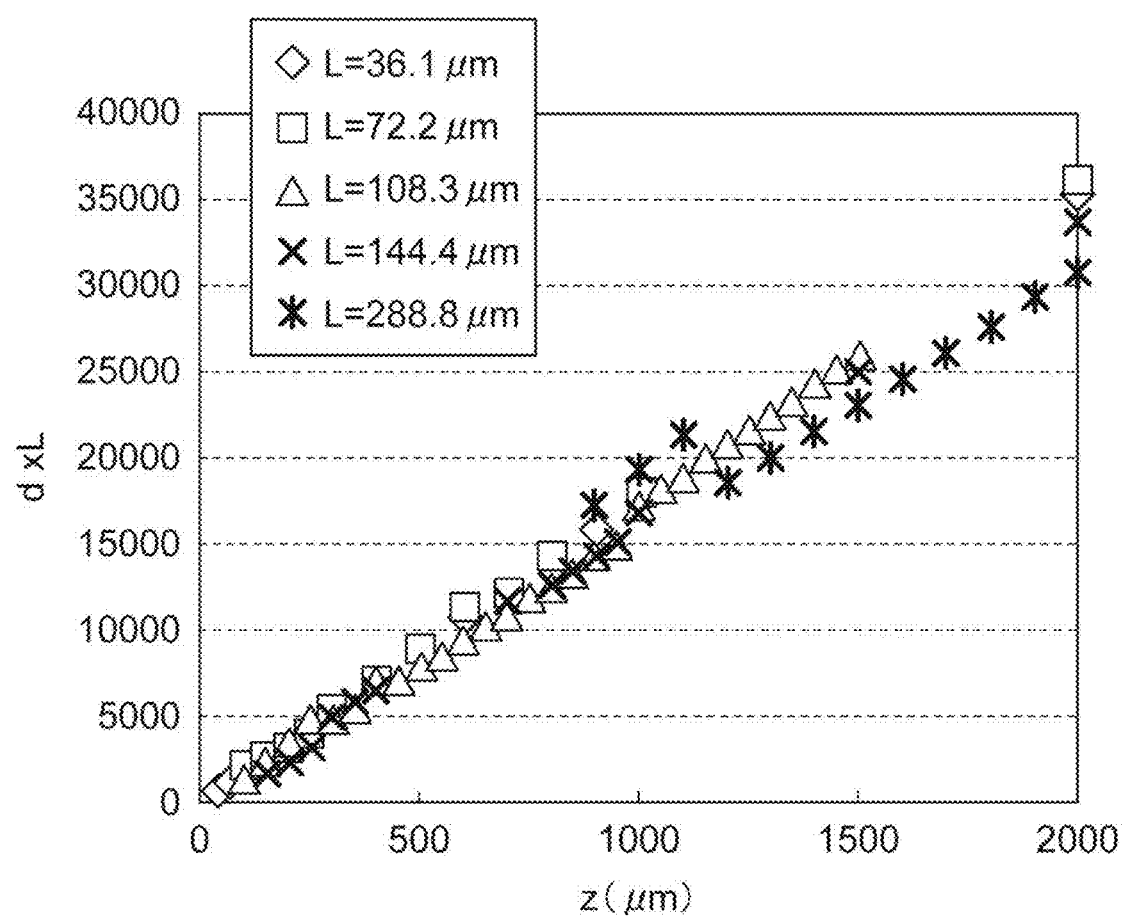
FIG. 28 is a graph indicating the correlation between a product (d×L) of the distance d and an electrode size L and the distance z.

Referring to FIG. 22, irrespective of the opening size (electrode size) L, it can be seen that the distance d and the distance z are roughly proportional to each other. Further, FIG. 28 is a graph indicating the correlation between the product (d×L) of the distance d and the opening size (electrode size) L and the distance z. Referring to FIG. 28, it can be seen that the product (d×L) and the distance z are roughly proportional to each other. From the above, the following formula (14) holds.

$$d \propto \frac{z}{L} \quad (14)$$

Figure 29:
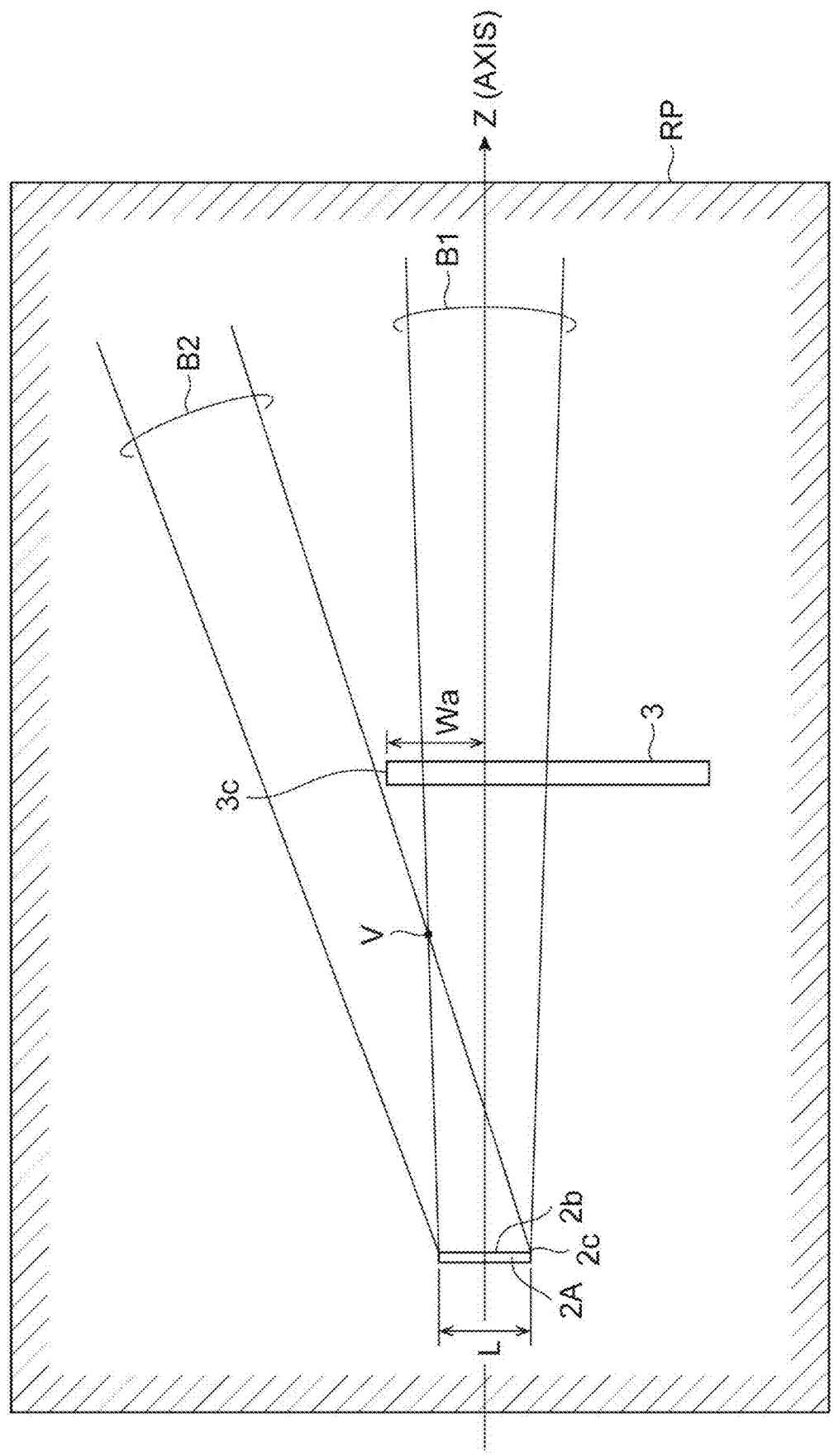
FIG. 29 is a schematic diagram of a positional relationship between a light emitting surface and a light shielding member.

Based on this fact, FIG. 29 indicates a schematic diagram of the positional relationship between the light emitting surface 2b and the light shielding member 3 on a reference plane RP (refer to FIG. 1) including the Z axis. In FIG. 29, the zero order light B1 is emitted from the light emitting surface 2b of the laser element 2A along the Z axis direction perpendicular to the light emitting surface 2b, and from the light emitting surface 2b, a desired first optical image portion B2 is emitted in the direction (inclined direction) inclined to the Z axis direction. The light shielding member 3 is arranged so as to shield all of the zero order light B1 and pass through all of the first optical image portion B2.

Figure 30:
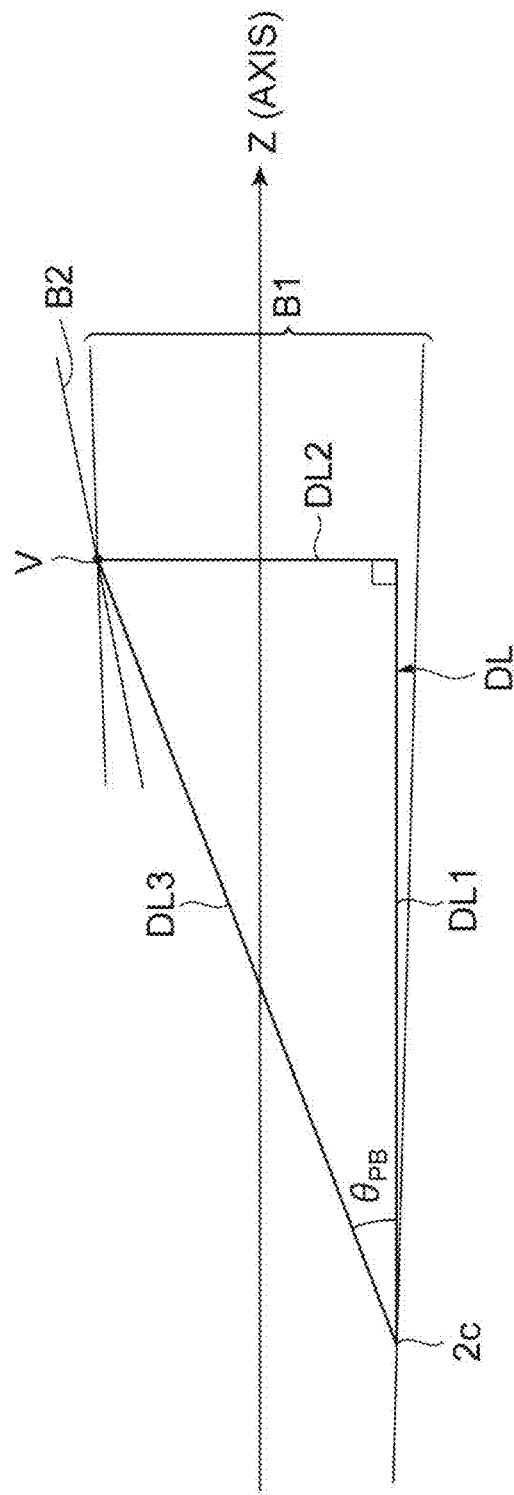
FIG. 30 is an enlarged diagram of the vicinity of an intersection of a Z-axis side edge of a first optical image portion B2 and a first optical image portion B2 side edge of a zero order light B1.

FIG. 30 is an enlarged diagram of the vicinity of an intersection V of an Z-axis side edge of the first optical image portion B2 and the first optical image portion B2 side edge of the zero order light B1. Here, a triangle DL illustrated in FIG. 30 is focused. The triangle DL is a right triangle, a side DL1 is a line segment extending from one end 2c of the light emitting surface 2b in parallel to the Z axis, a side DL2 is a line segment extending perpendicularly to the Z axis from the intersection V to the side DL1, and an oblique side DL3 is a line segment connecting the one end 2c of the light emitting surface 2b and the intersection V. Focusing on this triangle DL, the following expression (15) holds.

$$\tan\theta_{PB} = \frac{\frac{1}{2}(W_z + L)}{z_{sh}} \quad (15)$$

Further, when the above formula (15) is modified, the following formula (16) is obtained. However, $W_z$ is given by the following formula (17).

$$z_{sh} = \frac{W_z + L}{2\tan\theta_{PB}} \quad (16)$$

$$W_Z = \frac{4\lambda}{\pi L} z \text{ (when } z \geq z_0\text{)}$$
$$W_Z = \sqrt{2} L \text{ (when } z < z_0\text{)} \quad (17)$$

Here, $W_z$ represents the beam width (defined on the reference plane RP including the Z axis) of the zero order light B1 at the distance z, L represents the width of the light emitting surface 2b (refer to FIG. 29) defined on the reference plane RP, $\theta_{PB}$ represents an angle (refer to FIG. 30) formed by the Z axis side edge of the first optical image portion B2 and the Z axis on the reference plane RP, and $\lambda$ represents the emission wavelength of the active layer 12. Also, $z_0$ in the above formula (17) represents the Rayleigh region and is derived by the following formula (18).

$$z_0 = \frac{\pi}{\lambda}\left(\frac{L}{2}\right)^2 \quad (18)$$

Therefore, it is preferable that the distance z from the light emitting surface 2b to the light shielding member 3 is longer than $z_{sh}$ defined by the above formula (16). Thereby, the light shielding member 3 can be disposed at a position where the zero order light B1 and the first optical image portion B2 are separated (that is, farther away from the intersection V). Further, it is preferable that the distance Wa (refer to FIG. 29) from the Z axis to the edge 3c of the light shielding member 3 is longer than half of the beam width $W_z$ defined by the above formula (17). Thereby, the edge 3c of the light shielding member 3 can be disposed between the zero order light B1 and the first optical image portion B2.

Figure 31:
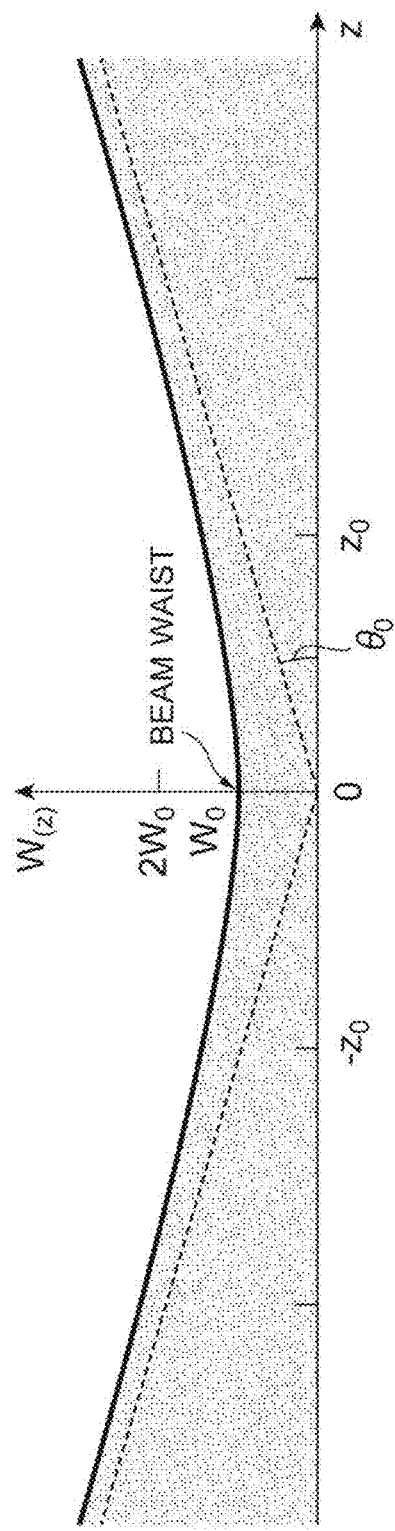
FIG. 31 is a graph indicating a change in the beam radius at the beam waist of the Gaussian beam.

Here, the above formula (17) will be supplemented. FIG. 31 is a graph indicating a change in the beam radius at the beam waist of a Gaussian beam. In this study, the zero order light B1 is regarded as a Gaussian beam. The beam radius W(z) of the Gaussian beam is obtained by the following formula (19).

$$W(z) = W_0\left[1 + \left(\frac{z}{z_0}\right)^2\right]^{\frac{1}{2}} \quad (19)$$

Where $W_0$ is a beam waist radius. Further, $z_0$ is a Rayleigh region and is obtained by the following formula (20).

$$z_0 = \frac{\pi}{\lambda} W_0^2 \quad (20)$$

The beam radius W(z) gradually increases as z increases, reaches $\sqrt{2}W_0$ when $z=z_0$, and continues to monotonically increase with z. When z is sufficiently larger than $z_0$, the first term of the above formula (19) is ignored, and a linear relationship expressed by the following formula (21) is obtained. Note that $\theta_0$ is a beam angle at a distance (refer to FIG. 31).

$$W(z) \approx \frac{W_0}{z_0} z = \theta_0 z \quad (21)$$

Here, since the relationship represented by the following formula (22) is obtained from the above formula (20), the beam angle $\theta_0$ is expressed by the following formula (23). In other words, the beam angle $\theta_0$ at a distance is proportional to the wavelength $\lambda$ and inversely proportional to the beam waist diameter $W_0$.

$$W_0 = \left(\frac{\lambda z_0}{\pi}\right)^{\frac{1}{2}} \quad (22)$$

$$\theta_0 = \frac{\lambda}{\pi W_0} \quad (23)$$

Based on the above, the beam diameter of the zero order light B1 will be considered. When the length of one side of the electrode 17 is denoted by L, and the wavelength is denoted by $\lambda$, the beam radius R1 satisfies the following formula (25) when the distance z satisfies the following formula (24).

$$z < \frac{\pi}{\lambda}\left(\frac{L}{2}\right)^2 \quad (24)$$

[数25]

$$R1 < \frac{L}{\sqrt{2}} \quad (25)$$

Further, when the distance z becomes larger than the right side of the above formula (24), the beam radius R1 satisfies the following formula (26).

$$R1 = \frac{2\lambda}{\pi L} z \quad (26)$$

FIGS. 32A to 32D and FIGS. 33A to 33D are plan views illustrating concrete examples of the arrangement of the light shielding members 3. In these figures, a range E indicated by a broken line represents an irradiation range of the zero order light B1. The plane shape of the irradiation range E is a square, the length of one side thereof is $W_z$, and the center thereof is located on the Z axis (the origin of the Xs-Ys plane parallel to the X-Y plane). In any of the embodiments, the light shielding member 3 overlaps the Z axis, the edge 3c of the light shielding member 3 is separated from the Z axis by the distance $W_z/2$, and the light shielding member 3 is disposed so as to completely cover the irradiation range E of the zero order light B1.

Figure 32A:
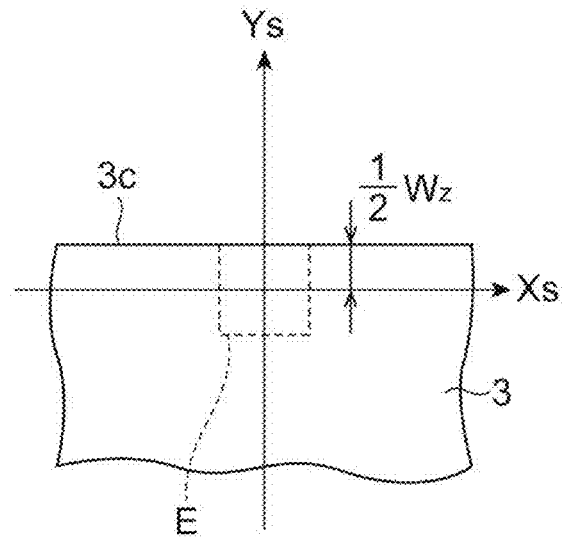
FIGS. 32A to 32D are plan views illustrating concrete examples of the arrangement of light shielding members.
Figure 32B:
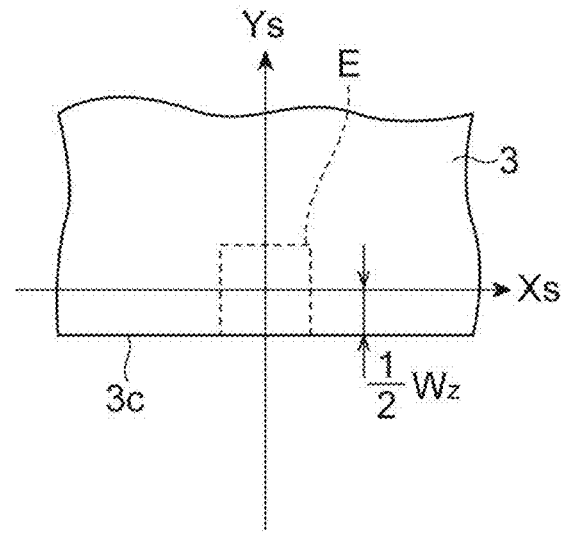
Figure 32C:
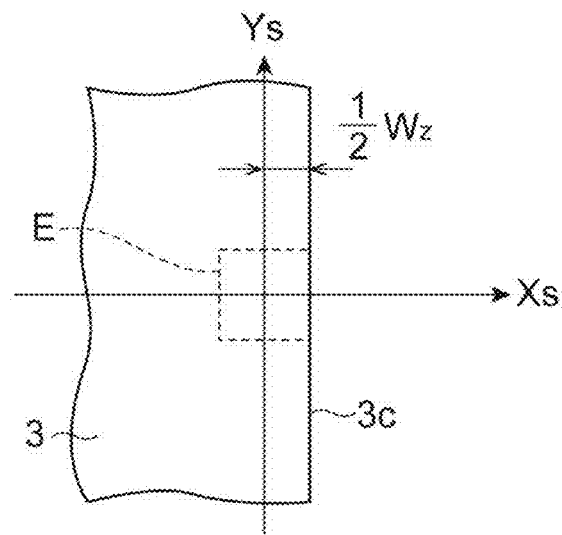
Figure 32D:
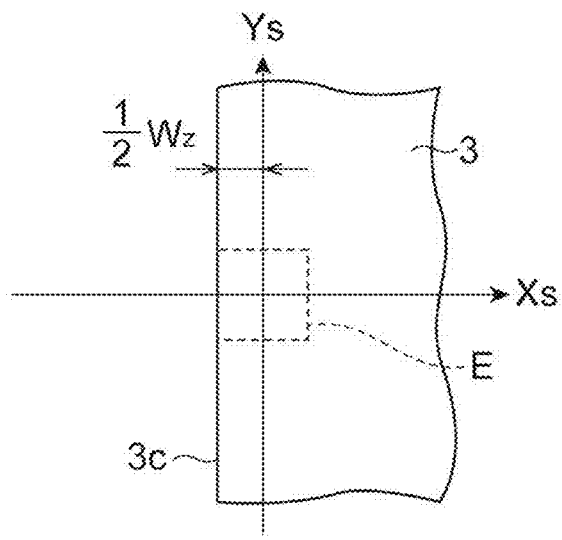

In FIG. 32A, the light shielding member 3 is arranged so as to entirely cover the third quadrant and the fourth quadrant. Such an arrangement is effective when the unnecessary second optical image portion B3 (refer to FIGS. 19A to 19C) exists in the third quadrant or the fourth quadrant (or both). Further, in FIG. 32B, the light shielding member 3 is arranged so as to entirely cover the first quadrant and the second quadrant. Such an arrangement is effective when the unnecessary second optical image portion B3 exists in the first quadrant or the second quadrant (or both). Further, in FIG. 32C, the light shielding member 3 is arranged so as to entirely cover the second quadrant and the third quadrant. Such an arrangement is effective when the unnecessary second optical image portion B3 exists in the second quadrant or the third quadrant (or both). Further, in FIG. 32D, the light shielding member 3 is arranged so as to entirely cover the first quadrant and the fourth quadrant. Such an arrangement is effective when the unnecessary second optical image portion B3 exists in the first quadrant or the fourth quadrant (or both).

Figure 33A:
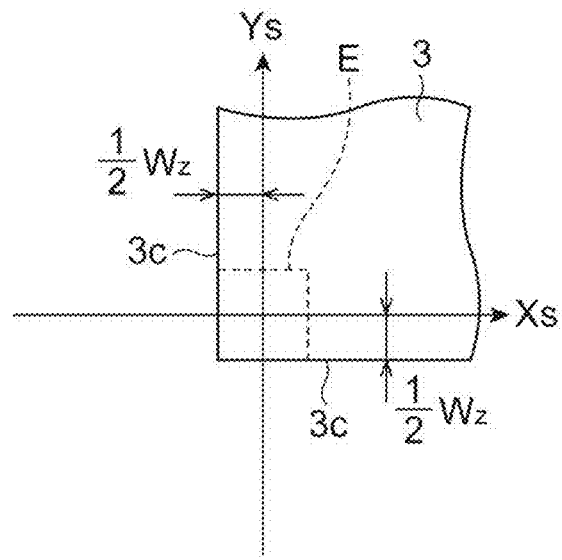
FIGS. 33A to 33D are plan views illustrating concrete examples of the arrangement of light shielding members.
Figure 33B:
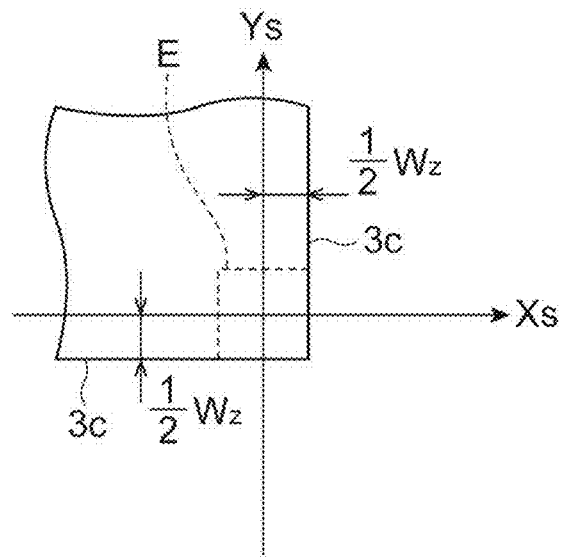
Figure 33C:
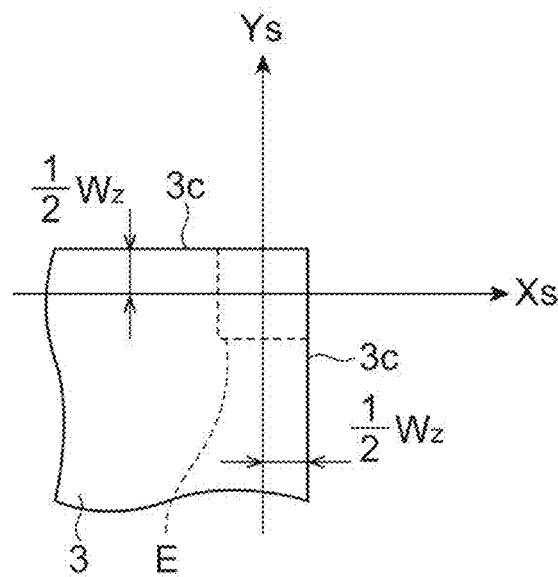
Figure 33D:
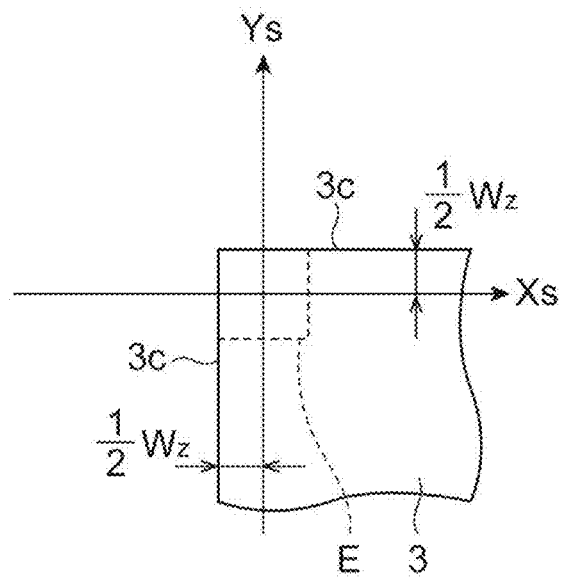

Further, in FIG. 33A, the light shielding member 3 is arranged so as to entirely cover the first quadrant. Such an arrangement is effective when the unnecessary second optical image portion B3 exists in the first quadrant. Further, in FIG. 33B, the light shielding member 3 is arranged so as to entirely cover the second quadrant. Such an arrangement is effective when the unnecessary second optical image portion B3 exists in the second quadrant. Further, in FIG. 33C, the light shielding member 3 is arranged so as to entirely cover the third quadrant. Such an arrangement is effective when the unnecessary second optical image portion B3 exists in the third quadrant. Further, in FIG. 33D, the light shielding member 3 is arranged so as to entirely cover the fourth quadrant. Such an arrangement is effective when the unnecessary second optical image portion B3 exists in the fourth quadrant.

The effects obtained by the light emitting device 1A according to the present embodiment having the above configuration will be described. In the laser element 2A, the phase modulation layer 15A optically coupled to the active layer 12 has the basic layer 15a and a plurality of the modified refractive index regions 15b having different refractive indices from that of the basic layer 15a. In each of the unit constituent regions R constituting a virtual square lattice, the center of gravity G1 of the modified refractive index region 15b is disposed away from the lattice point O (the center of the unit constituent region Rno) and the direction of a vector from the lattice point O to the center of gravity G1 is individually set for each modified refractive index region 15b. In such a case, the phase of a beam changes in accordance with the direction of a vector from the lattice point O to the center of gravity G1, that is, the angular position of the center of gravity G1 around the lattice point O. That is, only by changing the position of the center of gravity G1, it is possible to control the phase of the beams emitted from the modified refractive index regions 15b, and the beam pattern formed as a whole can have a desired shape.

That is, the laser element 2A is an S-iPM laser and can output an optical image having an arbitrary shape along a normal direction of the light emitting surface 2b and an inclined direction having a predetermined inclination and a spread angle with respect to the normal direction. Furthermore, in this light emitting device 1A, the light shielding member 3 is provided so as to overlap at least the axis (that is, the Z axis) orthogonal to the position of the center of gravity of the light emitting surface 2b and allows the desired optical image to pass therethrough and shields the zero order light B1. As a result, the zero order light B1 can be removed from the output of the S-iPM laser.

Further, as in the present embodiment, when the optical image includes the first optical image portion B2 and the second optical image portion B3, the light shielding member 3 may further shield the second optical image portion B3. As a result, when the first optical image portion B2 is a desired optical image, unnecessary second optical image portions B3 can also be effectively removed.

Further, as in this embodiment, the light shielding member 3 may include a light absorbing material. When the light shielding member 3 reflects the zero order light B1, the reflected light again enters the laser element 2A, which may affect the operation inside the laser element 2A. By including a light absorbing material in the light shielding member 3, it is possible to absorb the zero order light B1 and prevent the zero order light B1 from entering the laser element 2A again.

(First Modification)

Figure 34:
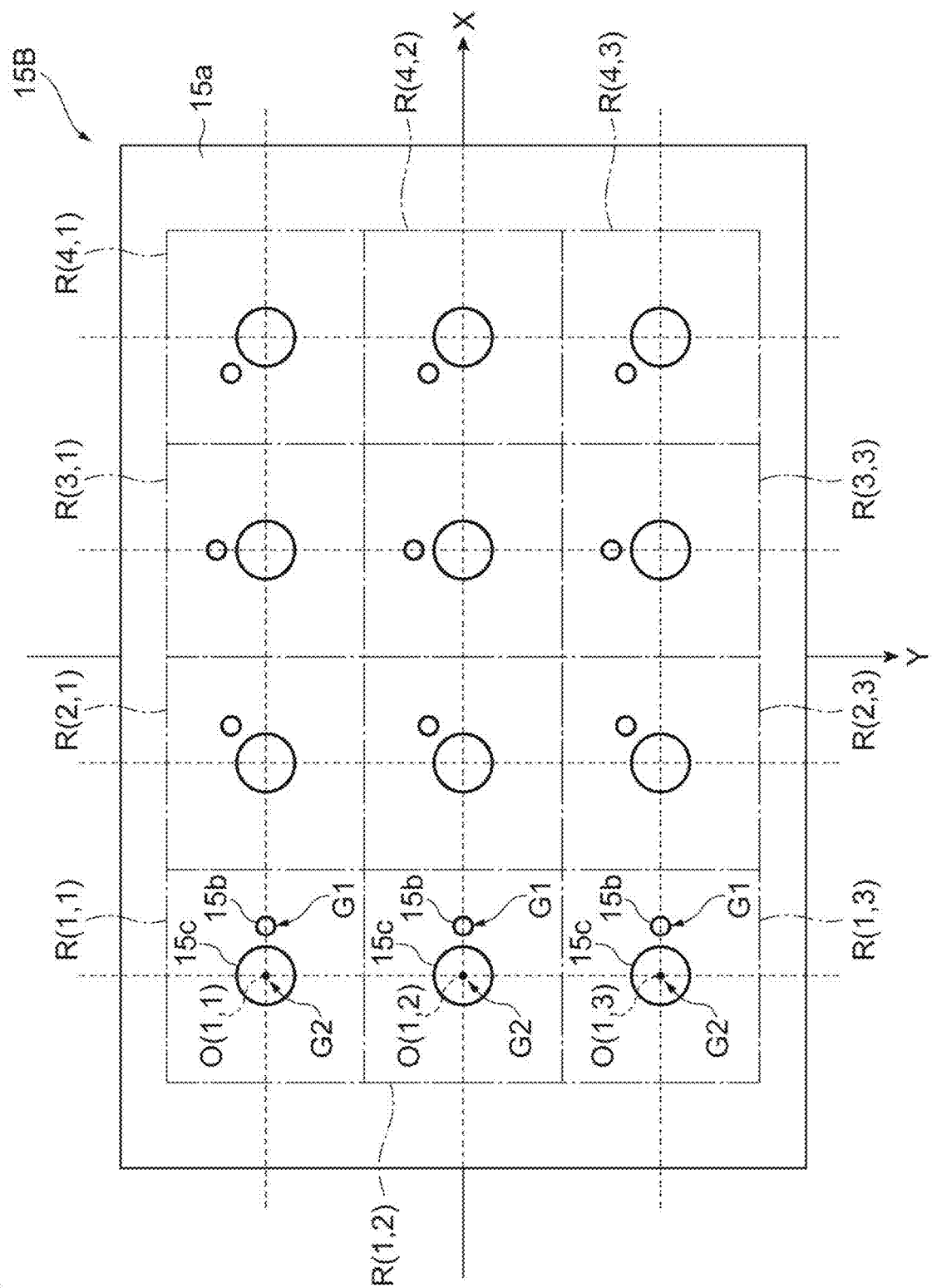
FIG. 34 is a plan view of a phase modulation layer according to a modification of the present invention.

FIG. 34 is a plan view of a phase modulation layer 15B according to a modification of the above-described embodiment. In addition to the configuration of the phase modulation layer 15A of the above-described embodiment, the phase modulation layer 15B of the present modification further includes a plurality of modified refractive index regions 15c. Each of the modified refractive index regions 15c includes a periodic structure and is composed of a second refractive index medium having a refractive index different from that of the first refractive index medium of the basic layer 15a. The modified refractive index region 15c is provided in one-to-one correspondence with the modified refractive index region 15b. The center of gravity G2 of the modified refractive index region 15c coincides with the lattice point O (the center of each of the unit constituent regions R) of a virtual square lattice. The planar shape of the modified refractive index region 15c is, for example, circular. Like the modified refractive index region 15b, the modified refractive index region 15c may be a hole or may be formed by embedding a compound semiconductor in the hole. For example, even with the configuration of the phase modulation layer as in the present modification, the effects of the above-described embodiment can be suitably exhibited.

(Second Modification)

FIGS. 35A to 35C and FIGS. 36A to 36B are plan views illustrating examples of shapes in the X-Y plane of the modified refractive index region 15b. In the example (patterns 1 to 5) illustrated in FIG. 35A, the shape in the X-Y plane of the modified refractive index region 15b has rotational symmetry. That is, the shape of each modified refractive index region in the X-Y plane is a perfect circle (pattern 1), square (pattern 2), regular hexagon (pattern 3), regular octagon (pattern 4), or regular hexadecagon (pattern 5). Compared with a rotationally asymmetric figure, the figure of FIG. 35A has less influence even if the pattern is shifted in the rotation direction, and therefore highly accurate patterning is possible.

Figure 35A:
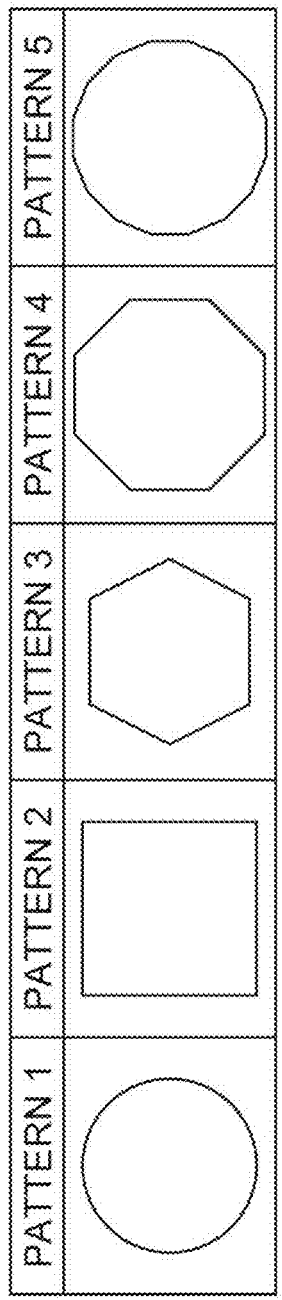
FIGS. 35A to 35C are plan views illustrating examples of shapes in the X-Y plane of the modified refractive index region.
Figure 35B:
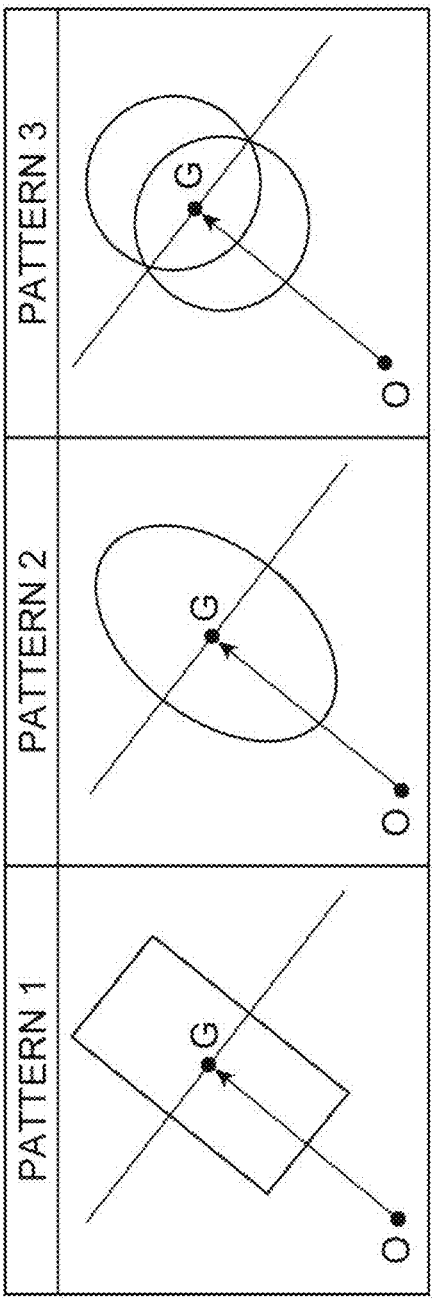

In the example (patterns 1 to 3) illustrated in FIG. 35B, the shape of each modified refractive index region in the X-Y plane has mirror image symmetry (line symmetry). That is, the shape of each modified refractive index region in the X-Y plane is a rectangle (pattern 1), an ellipse (pattern 2), a shape in which two circles or a part of an ellipse overlaps (pattern 3). The lattice point O of the virtual square lattice is present outside these modified refractive index regions.

Compared with a rotationally asymmetric figure, the figure in FIG. 35B can clearly know the position of the line segment as a line symmetric reference, and therefore highly accurate patterning is possible.

Figure 35C:
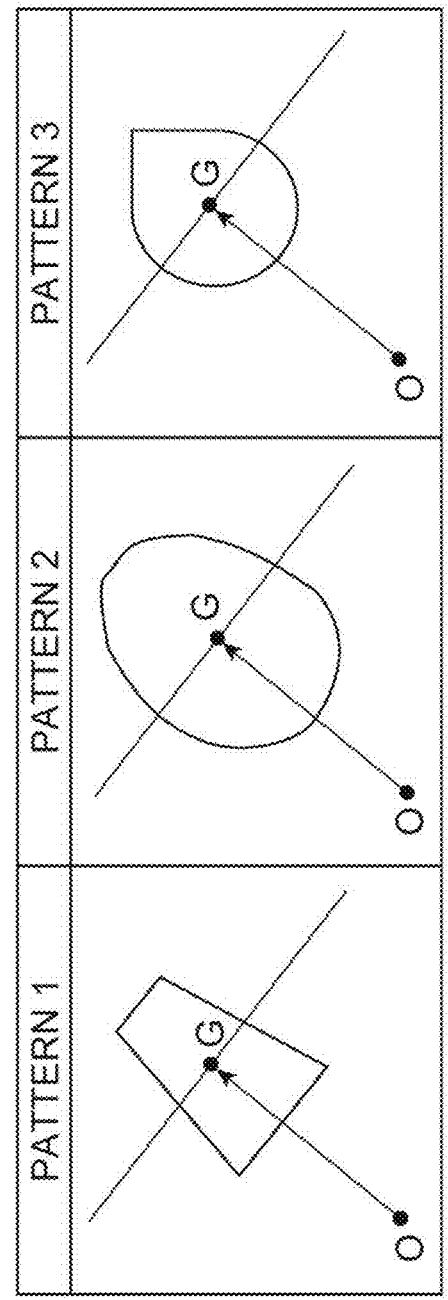

In the examples (patterns 1 to 3) illustrated in FIG. 35C, the shape of each modified refractive index region in the X-Y plane is trapezoid (pattern 1), a shape in which the dimension in the short axis direction in the vicinity of one end portion along the long axis of an ellipse is deformed so as to be smaller than the dimension of the short axis of the vicinity of the other end portion (egg type: pattern 2), or a shape in which one end portion along the long axis of an ellipse is deformed to a sharpened end portion protruding along the long axis direction (tear type: pattern 3). The lattice point O of the virtual square lattice is present outside these modified refractive index regions. Even in the case of the figure of FIG. 35C, the phase of a beam can be changed by the position of the center of gravity of the modified refractive index region being displaced from the lattice point O of the virtual square lattice by a distance r.

Figure 36A:
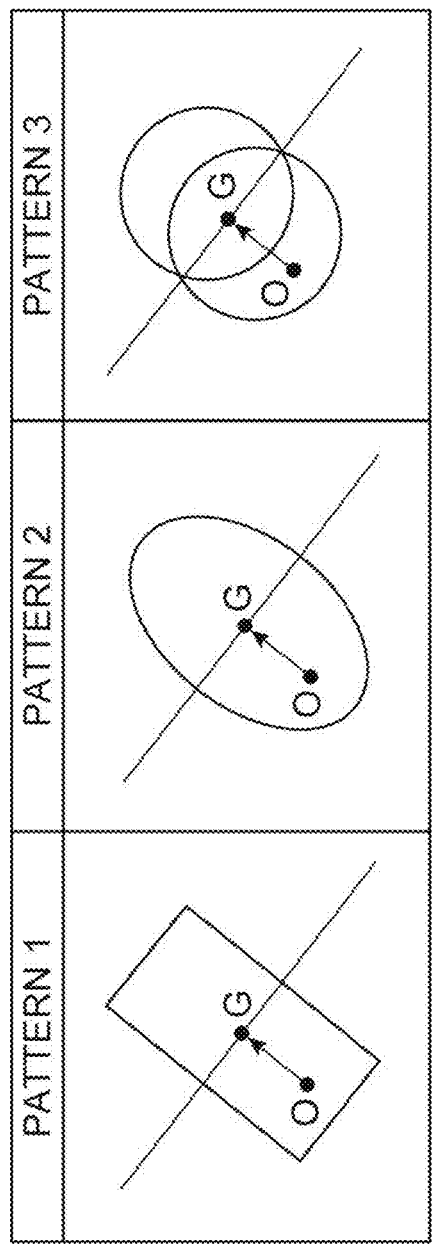
FIGS. 36A and 36B are plan views illustrating examples of shapes in the X-Y plane of the modified refractive index regions.

In the example (patterns 1 to 3) illustrated in FIG. 36A, the shape of each modified refractive index region in the X-Y plane has mirror image symmetry (line symmetry). That is, the shape of each modified refractive index region in the X-Y plane is a rectangle (pattern 1), an ellipse (pattern 2), a shape in which two circles or a part of an ellipse overlaps (pattern 3). The lattice points O of the virtual square lattice are present inside these modified refractive index regions.

Compared with a rotationally asymmetric figure, the figure in FIG. 36A can clearly know the position of the line segment as a line symmetric reference, and therefore highly accurate patterning is possible. In addition, since the distance r between the lattice point O of the virtual square lattice and the position of the center of gravity of the modified refractive index region is small, it is possible to reduce the occurrence of noise of the beam pattern.

Figure 36B:
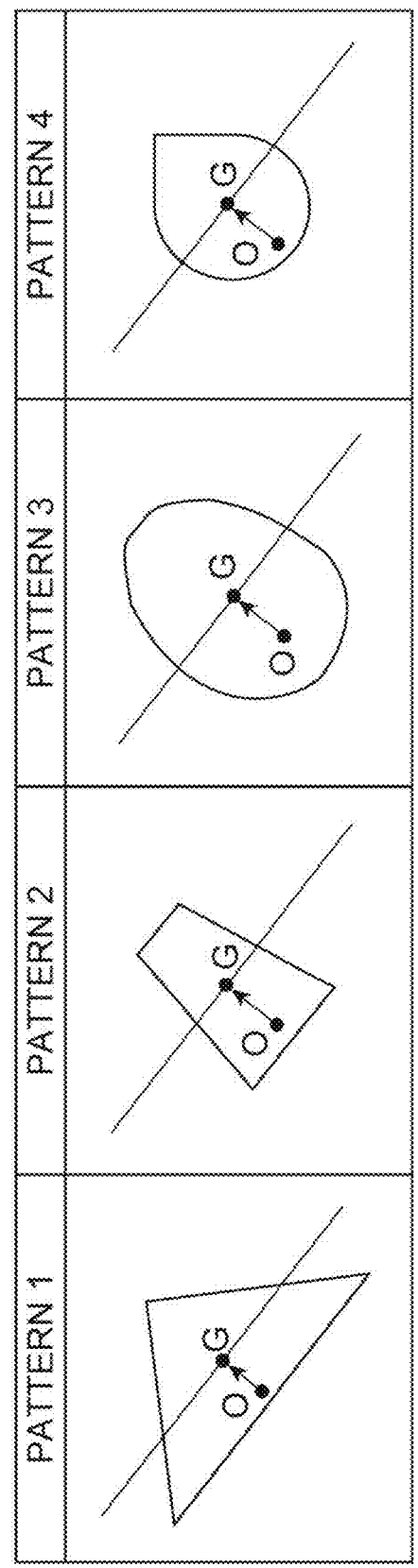

In the examples (samples 1 to 4) illustrated in FIG. 36B, the shape of each modified refractive index region in the X-Y plane is an isosceles right triangle (pattern 1), a trapezoid (pattern 2), a shape in which the dimension in the short axis direction in the vicinity of one end portion along the long axis of an ellipse is deformed so as to be smaller than the dimension in the short axis direction of the vicinity of the other end portion (egg type: pattern 3), or a shape in which one end portion along the long axis of an ellipse is deformed to a sharpened end portion protruding along the long axis direction (tear type: pattern 4). The lattice points O of the virtual square lattice are present inside these modified refractive index regions. Even in the case of the figure of FIG. 36B, the phase of a beam can be changed by the position of the center of gravity of the modified refractive index region being displaced from the lattice point O of the virtual square lattice by the distance r. In addition, since the distance r between the lattice point O of the virtual square lattice and the position of the center of gravity of the modified refractive index region is small, it is possible to reduce the occurrence of noise of the beam pattern.

(Third Modification)

FIG. 37 illustrates a configuration of a light emitting device 1B according to a third modification. The light emitting device 1B includes a support substrate 6, a plurality of laser elements 2A arranged one-dimensionally or two-dimensionally on the support substrate 6, a light shielding member 3B disposed to face a plurality of the laser elements 2A, and a drive circuit 4 for individually driving a plurality of the laser elements 2A. The configuration of each laser element 2A is the same as that of the above-described embodiment. However, each of a plurality of the laser elements 2A includes any one of a laser element that outputs an optical image in the red wavelength region, a laser element that outputs an optical image in the blue wavelength region, and a laser element that outputs an optical image in the green wavelength region. The laser element for outputting the optical image in the red wavelength region includes, for example, a GaAs-based semiconductor. The laser element that outputs an optical image in the blue wavelength region and the laser element that outputs an optical image in the green wavelength region include, for example, a nitride semiconductor. The drive circuit 4 is provided on the back side or the inside of the support substrate 6 and individually drives the respective laser elements 2A. The drive circuit 4 supplies a drive current to each of the laser elements 2A according to a command from the control circuit 7.

The light shielding member 3B is a plate-shaped member provided so as to overlap at least a plurality of axes (Z axis) orthogonal to each other at a position of the center of gravity of each of the light emitting surfaces 2b of a plurality of the laser elements 2A. That is, in the present modification, the same number of light shielding members 3 as illustrated in FIG. 1 are disposed as a plurality of the laser elements 2A, and these light shielding members 3 are integrated to form the light shielding member 3B. The light shielding member 3B may be integrated with a housing that houses the support substrate 6. Similarly to the light shielding member 3 of the above-described embodiment, the light shielding member 3B passes the first optical image portion B2 and shields the zero order light B1 among the optical images emitted from the respective laser elements 2A. In addition, the light shielding member 3B may further shield unnecessary second optical image portions B3.

As in the present modification, the light shielding member 3B may be provided on a plurality of the individually driven laser elements 2A, and only the desired optical image may be taken out from each laser element 2A. In this case, it is possible to suitably realize a head up display or the like by appropriately driving required elements for a module in which semiconductor light emitting elements corresponding to a plurality of patterns are aligned in advance. Further, as in the present modification, when a plurality of the laser elements 2A includes any one of a laser element that outputs an optical image in a red wavelength region, a laser element that outputs an optical image in a blue wavelength region, a laser element that outputs an optical image in a green wavelength region, a color head up display or the like can be suitably realized.

The semiconductor light emitting element according to the present invention is not limited to the above-described embodiment and can be variously changed. For example, in the above-described embodiments and examples, a laser element made of a GaAs-based, InP-based, and nitride-based (particularly GaN-based) compound semiconductor is exemplified, but the present invention is applicable to a laser element made of various semiconductor materials other than these.

REFERENCE SIGNS LIST 1A, 1B . . . light emitting device; 2A . . . laser element; 2b . . . light emitting surface; 3 . . . light shielding member; 3B . . . light shielding member; 3c . . . edge; 4 . . . drive circuit; 6 . . . support substrate; 7 . . . control circuit; 10 . . . semiconductor substrate; 11, 13 . . . cladding layer; 12 . . . active layer; 14 . . . contact layer; 15A, 15B . . . phase modulation layer; 15a . . . basic layer; 15b, 15c . . . modified refractive index region; 16, 17 . . . electrode; 17a . . . opening; 18 . . . protective film; 19 . . . antireflection film; B1 . . . zero order light; B2 . . . first optical image portion; B3 . . . second optical image portion; G1, G2 . . . center of gravity; O . . . lattice point; and R . . . unit constituent region.

The invention claimed is:
1. A light emitting device, comprising:
a semiconductor light emitting element having a light emitting surface and configured to output an optical image having an arbitrary shape along a normal direction of the light emitting surface and an inclined direction having a predetermined inclination and a spread angle with respect to the normal direction; and a light shielding member disposed such that an axis orthogonal to the light emitting surface at a position of the center of gravity of the light emitting surface crosses a part of the light shielding member, wherein the semiconductor light emitting element includes an active layer, a pair of cladding layers sandwiching the active layer, and a phase modulation layer provided between the active layer and one of a pair of the cladding layers and being optically coupled to the active layer, the light shielding member is disposed so as to pass through a specific optical image output in the inclined direction among the optical images and shield zero order light output in a normal direction of the light emitting surface, the phase modulation layer has a basic layer and a plurality of modified refractive index regions each having a refractive index different from a refractive index of the basic layer, and the phase modulation layer is configured such that:

where, in an XYZ orthogonal coordinate system defined by a Z axis coinciding with the normal direction and an X-Y plane including X and Y axes which are orthogonal to each other and coincide with one surface of the phase modulation layer including a plurality of the modified refractive index regions, a virtual square lattice constituted by M1 (an integer of 1 or more)×N1 (an integer of 1 or more) unit constituent regions R each having a square shape is set on the X-Y plane, in the unit constituent region R (x, y) on the X-Y plane specified by a coordinate component x (an integer of from 1 to M1) in the X axis direction and a coordinate component y (an integer of from 1 to N1) in the Y axis direction, a center of gravity G1 of the modified refractive index region located in the unit constituent region R (x, y) is away from a lattice point O (x, y) which is the center of the unit constituent region R (x, y), and a vector from the lattice point O (x, y) to the center of gravity G1 is oriented in a specific direction, wherein in a state of satisfying the following first to sixth conditions:

the first condition defined that coordinates (x, y, z) in the XYZ orthogonal coordinate system satisfies a relationship represented by the following formulas (1) to (3) with respect to a spherical coordinates (d1, $\theta_{tilt}$, $\theta_{rot}$) defined by a length d1 of a moving radius, an inclination angle $\theta_{tilt}$ from the Z axis, and a rotation angle $\theta_{rot}$ from the X axis specified on the X-Y plane:

$$x = d1 \sin\theta_{tilt} \cos\theta_{rot} \quad (1)$$

$$y = d1 \sin\theta_{tilt} \sin\theta_{rot} \quad (2)$$

$$z = d1 \cos\theta_{tilt} \quad (3),$$

the second condition defined that letting a beam pattern corresponding to the optical image output from the semiconductor light emitting element is a set of bright points directed in directions defined by the angles $\theta_{tilt}$ and $\theta_{rot}$, the angles $\theta_{tilt}$ and $\theta_{rot}$ are converted into a coordinate value $k_x$ on a Kx axis corresponding to the X axis which is a normalized wave number defined by the following formula (4) and a coordinate value $k_y$ on a Ky axis, which is a specific wavenumber defined by the following formula (5), corresponds to the Y axis, and is orthogonal to the Kx axis:

$$k_x = \frac{a}{\lambda} \sin\theta_{tilt} \cos\theta_{rot} \quad (4)$$

$$k_y = \frac{a}{\lambda} \sin\theta_{tilt} \sin\theta_{rot} \quad (5)$$

a: Lattice constant of vertical square lattice
λ: Oscillation wavelength of semiconductor light emitting element, the third condition defined that a specific wavenumber range including the beam pattern includes M2 (an integer of 1 or more)×N2 (an integer of 1 or more) image regions FR each having a square shape in a wavenumber space defined by the Kx axis and the Ky axis, the fourth condition defined that, in the wavenumber space, a complex amplitude F (x, y) obtained by performing two-dimensional inverse Fourier transform to transform each of image regions FR ($k_x$, $k_y$) specified by a coordinate component $k_x$ (an integer of from 0 to M2−1) in the Kx axis direction and a coordinate component $k_y$ (an integer of from 0 to N2−1) in the Ky axis direction to the unit constituent region R (x,y) on the X-Y plane is expressed by the following formula (6) with j being an imaginary unit:

$$F(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right], \quad (6)$$

the fifth condition defined that the complex amplitude F (x, y) is defined by the following formula (7) while an amplitude term is denoted by A (x, y) and a phase term is denoted by P (x, y) in the unit constituent region R (x, y):

$$F(x,y) = A(x,y) \times \exp[jP(x,y)] \quad (7), \text{ and}$$

the sixth condition defined that the unit constituent region R (x, y) is defined by an s-axis and a t-axis which are parallel to the X-axis and the Y-axis and orthogonal at the lattice point O (x, y), the phase modulation layer is configured such that:

in a state in which a line segment length r (x, y) from the lattice point O (x, y) to the center of gravity G1 of the corresponding modified refractive index region is set to a common value in each of the M1×N1 unit constituent regions R, an angle φ (x, y) formed by a line segment connecting the lattice point O (x, y) and the center of gravity G1 of the corresponding modified refractive index region and the s axis satisfies a relationship expressed by the following formula:

$$\varphi(x,y) = C \times P(x,y) + B$$

C: proportional constant
B: arbitrary constant, and the corresponding modified refractive index region is disposed in the unit constituent region R (x, y).

2. The light emitting device according to claim 1, wherein where a lattice constant of the virtual square lattice is denoted by a, a distance r between the center of gravity G1 of the modified refractive index region located in the unit constituent region R (x, y) and the lattice point O (x, y) satisfies 0 ≤ r ≤ 0.3a.

3. The light emitting device according to claim 1,
wherein where a distance from the light emitting surface to the light shielding member is denoted by z, a distance from the axis to a nearest end edge of the light shielding member on a reference plane including the axis is denoted by Wa, a beam width of zero order light at a point of the distance z on the reference surface is denoted by Wz, a width of the light emitting surface defined on the reference plane is denoted by L, an angle formed by the axial line side edge of the specific optical image and the axis on the reference plane is denoted by $\theta_{PB}$, and an emission wavelength of the active layer is denoted by λ, the distance z is longer than $z_{sh}$ defined by the following formula (8):

$$z_{sh} = \frac{W_z + L}{2\tan\theta_{PB}}, \tag{8}$$

the distance Wa is longer than half of $W_z$ defined by the following formula (9):

$$W_Z = \frac{4\lambda}{\pi L} z \text{ (where } z \geq z_0\text{)} \tag{9}$$
$$W_Z = \sqrt{2} L \text{ (where } z < z_0\text{)},$$

and
$Z_0$ of the formula (9) is a numerical value defined by the following formula (10):

$$z_0 = \frac{\pi}{\lambda}\left(\frac{L}{2}\right)^2. \tag{10}$$

4. The light emitting device according to claim 1, wherein the optical image includes a first optical image portion to be output in a first direction that is inclined with respect to the axis and a second optical image portion that is output in a second direction symmetrical to the first direction with respect to the axis and rotationally symmetric with the first optical image portion with respect to the axis, and
the light shielding member is arranged to further shield the second optical image portion.

5. The light emitting device according to claim 1, wherein the light shielding member includes a light absorbing material.

6. A light emitting device, comprising:
a plurality of semiconductor light emitting elements each having a light emitting surface and configured to output an optical image having an arbitrary shape along a normal direction of the light emitting surface and an inclined direction having a predetermined inclination and a spread angle with respect to the normal direction,
a light shielding member disposed such that a part of the light shielding member intersects each of axes orthogonal to the light emitting surface at a position of the center of gravity of the light emitting surface of each of a plurality of the semiconductor light emitting elements, and
a drive circuit configured to individually drive a plurality of the semiconductor light emitting elements,
wherein each of a plurality of the semiconductor light emitting elements includes an active layer, a pair of cladding layers sandwiching the active layer, and a phase modulation layer provided between the active layer and either a pair of the cladding layers and optically coupled to the active layer, the light shielding member is disposed so as to pass through a specific optical image output in the inclined direction among the optical images and to shield zero order light each output in the normal direction of the light emitting surface, in each of a plurality of the semiconductor light emitting elements, the phase modulation layer has a basic layer and a plurality of modified refractive index regions each having a different refractive index from a refractive index of the basic layer, and the phase modulation layer, in each of a plurality of the semiconductor light emitting elements, is configured such that:

where, in an XYZ orthogonal coordinate system defined by a Z axis coinciding with the normal direction and an X-Y plane including X and Y axes which are orthogonal to each other and coincide with one surface of the phase modulation layer including a plurality of the modified refractive index regions, a virtual square lattice including M1 (an integer of 1 or more)×N1 (an integer of 1 or more) unit constituent regions R each having a square shape is set on the X-Y plane, in the unit constituent region R (x, y) on the X-Y plane specified by a coordinate component x (an integer of from 1 to M1) in the X axis direction and a coordinate component y (an integer of from 1 to N1) in the Y axis direction, the center of gravity G1 of the modified refractive index region located in the unit constituent region R (x, y) is away from a lattice point O (x, y) which is the center of the unit constituent region R (x, y), and a vector from the lattice point O (x, y) to the center of gravity G1 is oriented in a specific direction, wherein in a state of satisfying the following first to sixth conditions:

the first condition defined that coordinates (x, y, z) in the XYZ orthogonal coordinate system satisfies a relationship represented by the following formulas (11) to (13) with respect to a spherical coordinates (d1, $\theta_{tilt}$, $\theta_{rot}$) defined by a length d1 of a moving radius, an inclination angle $\theta_{tilt}$ from the Z axis, and a rotation angle $\theta_{rot}$ from the X axis specified on the X-Y plane:

$$x = d1 \sin\theta_{tilt} \cos\theta_{rot} \tag{11}$$

$$y = d1 \sin\theta_{tilt} \sin\theta_{rot} \tag{12}$$

$$z = d1 \cos\theta_{tilt} \tag{13},$$

the second condition defined that letting a beam pattern corresponding to the optical image output from the semiconductor light emitting element is a set of bright points directed in directions defined by the angles $\theta_{tilt}$ and $\theta_{rot}$, the angles $\theta_{tilt}$ and $\theta_{rot}$ are converted into a coordinate value $k_x$ on a Kx axis corresponding to the X axis which is a normalized wave number defined by the following formula (14) and a coordinate value $k_y$ on a Ky axis, which is a specific wavenumber defined by the following formula (15), corresponds to the Y axis, and is orthogonal to the Kx axis:

$$k_x = \frac{a}{\lambda}\sin\theta_{tilt}\cos\theta_{rot} \quad (14)$$

$$k_y = \frac{a}{\lambda}\sin\theta_{tilt}\sin\theta_{rot} \quad (15)$$

a: Lattice constant of vertical square lattice

λ: Oscillation wavelength of semiconductor light emitting element, the third condition defined that a specific wavenumber range including the beam pattern includes M2 (an integer of 1 or more)×N2 (an integer of 1 or more) image regions FR each having a square shape in a wavenumber space defined by the Kx axis and the Ky axis, the fourth condition defined that, in the wavenumber space, a complex amplitude F (x, y) obtained by performing two-dimensional inverse Fourier transform to transform each of image regions FR ($k_x$, $k_y$) specified by a coordinate component $k_x$ (an integer of from 0 to M2−1) in the Kx axis direction and a coordinate component $k_y$ (an integer of from 0 to N2−1) in the Ky axis direction to the unit constituent region R (x,y) on the X-Y plane is expressed by the following formula (16) with j being an imaginary unit:

$$F(x, y) = \sum_{k_x=0}^{M2-1}\sum_{k_y=0}^{N2-1} FR(k_x, k_y)\exp\left[j2\pi\left(\frac{k_x}{M2}x + \frac{k_y}{N2}y\right)\right], \quad (16)$$

the fifth condition defined that the complex amplitude F (x, y) is defined by the following formula (17) while an amplitude term is denoted by A (x, y) and a phase term is denoted by P (x, y) in the unit constituent region R (x, y):

$$F(x,y)=A(x,y)\times\exp[jP(x,y)] \quad (17),\text{ and}$$

the sixth condition defined that the unit constituent region R (x, y) is defined by an s-axis and a t-axis which are parallel to the X-axis and the Y-axis and orthogonal at the lattice point O (x, y), the phase modulation layer is configured such that:

in a state in which a line segment length r (x, y) from the lattice point O (x, y) to the center of gravity G1 of the corresponding modified refractive index region is set to a common value in each of the M1×N1 unit constituent regions R, an angle φ (x, y) formed by a line segment connecting the lattice point O (x, y) and the center of gravity G1 of the corresponding modified refractive index region and the s axis satisfies a relationship expressed by the following formula:

$$\varphi(x,y)=C\times P(x,y)+B$$

C: proportional constant

B: arbitrary constant, and the corresponding modified refractive index region is disposed in the unit constituent region R (x, y).

7. The light emitting device according to claim 6, wherein each of a plurality of the semiconductor light emitting elements includes any one of a semiconductor light emitting element configured to output the optical image in a red wavelength range, a semiconductor light emitting element configured to output the optical image in a blue wavelength range, and a semiconductor light emitting element configured to output the optical image in a green wavelength range.

8. The light emitting device according to claim 6, wherein where a distance from the light emitting surface to the light shielding member is denoted by z, a distance from the axis to a nearest end edge of the light shielding member on a reference plane including the axis is denoted by Wa, a beam width of zero order light at a point of the distance z on the reference surface is denoted by $W_z$, a width of the light emitting surface defined on the reference plane is denoted by L, an angle formed by the axial line side edge of the specific optical image and the axis on the reference plane is denoted by $\theta_{PB}$, and an emission wavelength of the active layer is denoted by λ, the distance z is longer than $z_{sh}$ defined by the following formula (18):

$$z_{sh} = \frac{W_z + L}{2\tan\theta_{PB}}, \quad (18)$$

the distance Wa is longer than half of $W_z$ defined by the following formula (19):

$$W_Z = \frac{4\lambda}{\pi L}z \quad (\text{where } z \geq z_0) \quad (19)$$

$$W_Z = \sqrt{2}\,L \quad (\text{where } z < z_0),$$

and $Z_0$ of the formula (19) is a numerical value defined by the following formula (20):

$$z_0 = \frac{\pi}{\lambda}\left(\frac{L}{2}\right)^2. \quad (20)$$

* * * * *